US010541625B2

(12) United States Patent
Koyanagi et al.

(10) Patent No.: US 10,541,625 B2
(45) Date of Patent: Jan. 21, 2020

(54) POWER CONVERSION DEVICE

(71) Applicant: Mitsubishi Electric Corporation, Chiyoda-ku (JP)

(72) Inventors: Kimiyuki Koyanagi, Chiyoda-ku (JP); Takaharu Ishibashi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/341,784

(22) PCT Filed: Aug. 29, 2017

(86) PCT No.: PCT/JP2017/030963
§ 371 (c)(1),
(2) Date: Apr. 12, 2019

(87) PCT Pub. No.: WO2018/116527
PCT Pub. Date: Jun. 28, 2018

(65) Prior Publication Data
US 2019/0305694 A1 Oct. 3, 2019

(30) Foreign Application Priority Data

Dec. 22, 2016 (JP) .................................. 2016-248542

(51) Int. Cl.
*H02M 7/538* (2007.01)
*H02M 7/5387* (2007.01)
(Continued)

(52) U.S. Cl.
CPC ......... *H02M 7/5387* (2013.01); *H01L 25/117* (2013.01); *H02M 1/00* (2013.01); *H02M 2001/007* (2013.01)

(58) Field of Classification Search
CPC ................. H02M 7/5387; H02M 1/00; H02M 2001/007; H01L 25/117
See application file for complete search history.

(56) References Cited

U.S. PATENT DOCUMENTS

2010/0265744 A1  10/2010 Dorn et al.
2016/0308458 A1* 10/2016 Jimichi ................. H02M 1/32

FOREIGN PATENT DOCUMENTS

JP          5127929 B2    11/2012
JP          2015-6066 A    1/2015

OTHER PUBLICATIONS

International Search Report dated Nov. 21, 2017 in PCT/JP2017/030963 filed on Aug. 29, 2017.

* cited by examiner

*Primary Examiner* — Adolf D Berhane
*Assistant Examiner* — Afework S Demisse
(74) *Attorney, Agent, or Firm* — Oblon, McClelland, Maier & Neustadt, L.L.P.

(57) ABSTRACT

In a conversion circuit having a plurality of switching elements connected in series and parallel and a capacitor, the respective parts are connected by an external stacked conductor in which a P conductor connected to the positive electrode of the capacitor, an N conductor connected to the negative electrode of the capacitor (2), an AC conductor, and an even number of intermediate conductors connected between the plurality of switching elements, are stacked in plural layers. The respective switching elements are arranged such that the mutual positional relationship between the positive terminals and the negative terminals is the same as a direction of main current flowing through the external stacked conductor. The plurality of switching elements are arranged symmetrically with respect to a center line of the external stacked conductor which is in the same direction as the main current. External connection terminals are provided to the AC conductor, so as to be positioned symmetrically with respect to the center line.

15 Claims, 32 Drawing Sheets

(51) Int. Cl.
*H02M 1/00* (2006.01)
*H01L 25/11* (2006.01)

POWER CONVERSION DEVICE

TECHNICAL FIELD

The present invention relates a power conversion device that has a plurality of switching elements connected in series and parallel and enables large-power output.

BACKGROUND ART

A modular multilevel converter (MMC) is a circuit type in which output terminals of cell converters each composed of a DC capacitor and a switching element such as insulated gate bipolar transistor (IGBT) that can be subjected to ON/OFF control, are connected in series, thereby enabling output of high voltage equal to or greater than the withstand voltage of the switching element, and this circuit type is expected to be applied to a DC power transmission system (HVDC), a static synchronous compensator (STATCOM), and the like.

A cell converter used in a conventional MMC includes two power semiconductor units, and each power semiconductor unit is provided with a power semiconductor chip as one switching element. The switching elements in the two power semiconductor units are connected to each other in a bridge form using an external conductor (for example, Patent Document 1).

As a circuit type in which a plurality of converters are connected in cascade other than the MMC, a high-voltage DC-DC conversion type is known. In this type, a plurality of isolated DC-DC converters are provided in each of which two conversion circuits having a full-bridge configuration are connected via a transformer, and output terminals of the plurality of isolated DC-DC converters are connected in series.

In an isolated DC-DC converter used for a conventional high-voltage DC-DC conversion type, eight switching elements are used (for example, Patent Document 2).

Citation List

Patent Document

Patent Document 1: Japanese Patent No. 5127929
Patent Document 2: Japanese Laid-Open Patent Publication No. 2015-6066

SUMMARY OF THE INVENTION

Problems to be Solved by the Invention

The cell converter used in Patent Document 1 is configured by a half-bridge circuit, and the number of switching elements in each arm is one. Therefore, in order to configure an MMC capable of high-voltage and large-current output, it is necessary to increase the number of connected cell converters, thus causing a problem that the size of the device configuration increases and the cost increases.

In the isolated DC-DC converter used in Patent Document 2, eight switching elements are used. That is, four arms of each full-bridge circuit in the isolated DC-DC converter each have only one switching element. Therefore, in order to obtain high-voltage and large-current output, it is necessary to increase the number of connected isolated DC-DC converters, and thus, also in this case, there is a problem that the size of the device configuration increases and the cost increases.

The present invention has been made to solve the above problems, and an object of the present invention is to provide a power conversion device that has a plurality of switching elements connected in series and parallel and enables large-power output, with a small-size and inexpensive device configuration.

SOLUTION TO THE PROBLEMS

A power conversion device according to the present invention includes: a conversion circuit having a capacitor and a bridge circuit in which a plurality of switching elements are connected in series and parallel; and an external stacked conductor having a P conductor connected to a positive electrode of the capacitor, an N conductor connected to a negative electrode of the capacitor, an AC conductor connected to an intermediate terminal of the bridge circuit, and an even number of intermediate conductors connected between the plurality of switching elements, such that the P conductor, the N conductor, the AC conductor, and the intermediate conductors are arranged in a plurality of layers, the external stacked conductor making connection among positive terminals and negative terminals of the switching elements, the positive electrode and the negative electrode of the capacitor, and the intermediate terminal of the bridge circuit in accordance with a circuit configuration of the conversion circuit, wherein the respective switching elements are arranged such that a mutual positional relationship between the positive terminals and the negative terminals is the same as a direction of main current flowing through the external stacked conductor, the plurality of switching elements are arranged symmetrically with respect to a center line of the external stacked conductor which is in the same direction as the main current, and external connection terminals are provided to the AC conductor, so as to be positioned symmetrically with respect to the center line.

EFFECT OF THE INVENTION

The power conversion device according to the present invention makes it possible to effectively increase output voltage and output current in one conversion circuit, and thus a power conversion device that has a plurality of switching elements connected in series and parallel and enables large-power output can be provided with a small-size and inexpensive device configuration.

DESCRIPTION OF EMBODIMENTS

Embodiment 1

Hereinafter, embodiment 1 of the present invention will be described.

Figure 1:
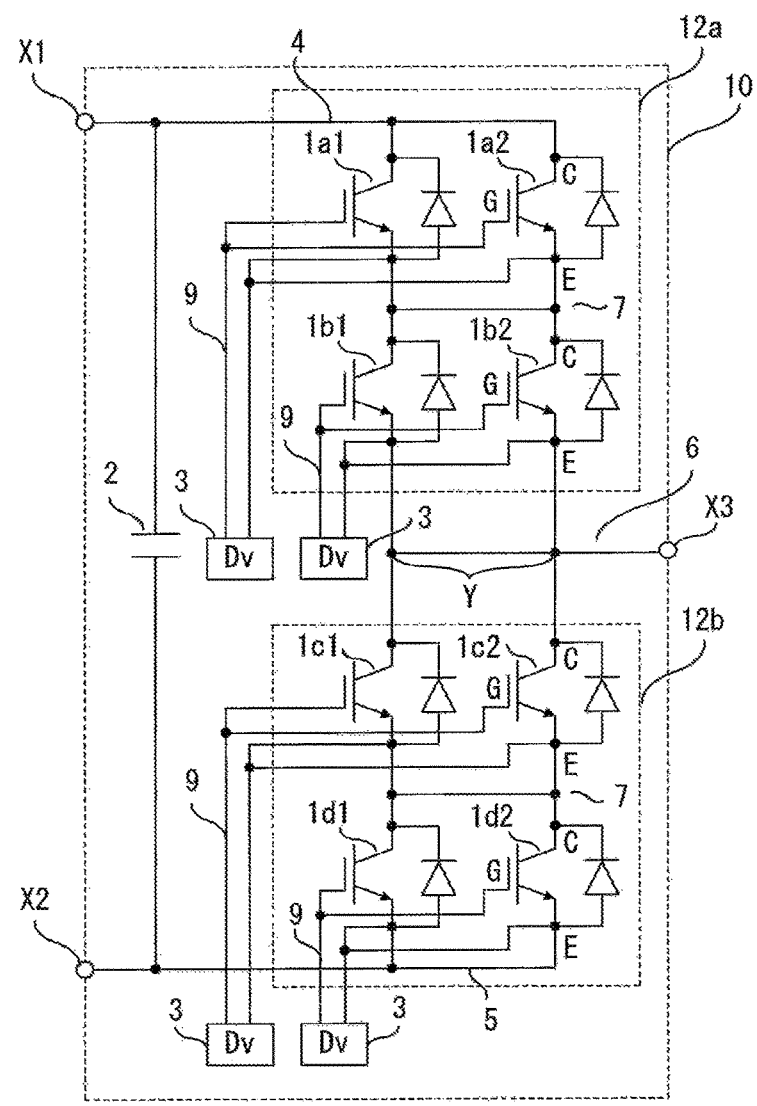
FIG. 1 is a circuit diagram showing a conversion circuit according to embodiment 1 of the present invention.

FIG. 1 is a circuit diagram showing a conversion circuit in a power conversion device according to embodiment 1 of the present invention. As shown in FIG. 1, the conversion circuit 10 includes DC terminals X1, X2, an AC terminal X3, a capacitor 2, a plurality switching elements $1a1$, $1a2$, $1b1$, $1b2$, $1c1$, $1c2$, $1d1$, $1d2$, and gate driving circuits 3 for the respective switching elements 1 ($1a1$, $1a2$, $1b1$, $1b2$, $1c1$, $1c2$, $1d1$, $1d2$). The capacitor 2 stores and supplies DC energy in accordance with operation of the conversion circuit 10.

As the switching elements 1, a self-turn -off semiconductor switching element such as IGBT to which a diode is connected in antiparallel is used.

Each pair of switching elements $1a1$, $1a2$, switching elements $1b1$, $1b2$, switching elements $1c1$, $1c2$, and switching elements $1d1$, $1d2$ is used in two-parallel form, and each pair of switching elements $1a1$, $1b1$, switching elements $1a2$, $1b2$, switching elements $1c1$, $1d1$, and switching elements $1c2$, $1d2$ is used in two-series form. That is, the conversion circuit 10 has the switching elements 1 connected in two-series and two-parallel form so as to configure one bridge circuit in which an upper arm $12a$ formed from an upper arm element group (switching elements $1a1$, $1a2$, $1b1$, $1b2$) and a lower arm $12b$ formed from a lower arm element group (switching elements $1c1$, $1c2$, $1d1$, $1d2$) are connected. It is noted that intermediate terminals Y are connection points between the upper arm $12a$ and the lower arm $12b$.

In the conversion circuit 10, a P wiring line 4, an N wiring line 5, an AC wiring line 6, intermediate wiring lines 7, and gate wiring lines 9 are provided. The P wiring line 4 connects the positive electrode of the capacitor 2 connected to the DC terminal X1, and positive terminals (collector terminals) C of the switching elements $1a1$, $1a2$. The N wiring line 5 connects the negative electrode of the capacitor 2 connected to the DC terminal X2, and negative terminals (emitter terminals) E of the switching elements $1d1$, $1d2$. The AC wiring line 6 connects negative terminals E of the switching elements $1b1$, $1b2$ and positive terminals C of the switching elements $1c1$, $1c2$ so to be connected to the AC terminal X3, whereby AC power is inputted and outputted from and to outside. That is, the upper arm $12a$ and the lower arm $12b$ are connected in a bridge form by the AC wiring line 6, and the connection points (intermediate terminals Y) therebetween are connected to the AC terminal X3.

The intermediate wiring lines 7 connect negative terminals E of the switching elements $1a1$, $1a2$ and positive terminals C of the switching elements $1b1$, $1b2$ in series, and connect negative terminals E of the switching elements $1c1$, $1c2$ and positive terminals C of the switching elements $1d1$, 1*d*2 in series. The gate wiring lines 9 connect the gate terminals G of the switching elements 1 and the gate driving circuits (Dv) 3.

Figure 2:
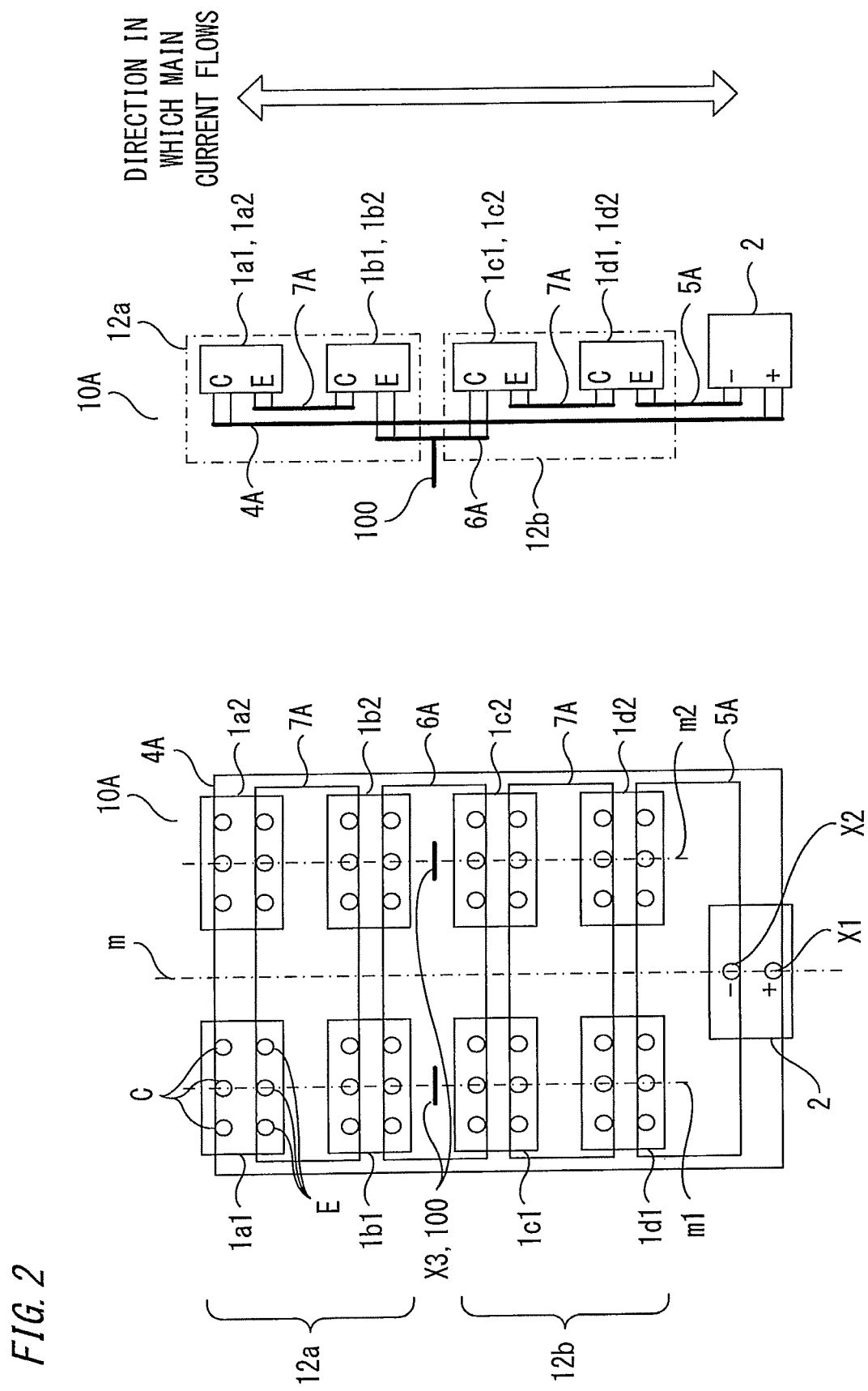
FIG. 2 is a diagram showing component arrangement in the conversion circuit according to embodiment 1 of the present invention.

FIG. 2 is a diagram showing component arrangement in the conversion circuit 10 shown in FIG. 1. FIG. 2 shows a plan view on the left side and a side view on the right side. It is noted that a conversion circuit 10A is obtained by realizing the conversion circuit 10 shown in FIG. 1 using the component arrangement shown in FIG. 2. In addition, a P conductor 4A, an N conductor 5A, an AC conductor 6A, and two intermediate conductors 7A are components realized as the P wiring line 4, the N wiring line 5, the AC wiring line 6, and the intermediate wiring lines 7. In this case, each switching element 1 has three positive terminals C and three negative terminals E.

As shown in FIG. 2, the upper arm 12*a* is placed adjacently to the lower arm 12*b* such that the upper arm 12*a* is on the upper side in the drawing, and the capacitor 2 is placed on the outer side of the lower arm 12*b*, i.e., the lower side thereof in the drawing.

In FIG. 2, in light of the positional relationship between the upper arm 12*a* and the lower arm 12*b*, the side where the upper arm 12*a* is placed is referred to as upper side, and the side where the lower arm 12*b* is placed is referred to as lower side.

Since the switching elements 1 are used in two-parallel form, two switching element arrays, i.e., a switching element array (switching elements 1*a*1, 1*b*1, 1*c*1, 1*d*1) and a switching element array (switching elements 1*a*2, 1*b*2, 1*c*2, 1*d*2) are each provided such that the switching elements are arrayed in one line on respective middle lines m1, m2. All the arrangement directions of the switching elements 1 are the same, and in this case, the positive terminals C are on the upper side and the negative terminals E are on the lower sides. The capacitor 2 is provided such that the negative electrode is on the upper side.

Thus, in the switching element array of the switching elements 1*a*1 to 1*d*1, the switching elements 1*a*1, 1*b*1, 1*c*1, 1*d*1 are arranged in this order from the upper side such that the positive terminals C are on the upper side and the negative terminals E are on the lower side. In addition, in the switching element array of the switching elements 1*a*2 to 1*d*2, the switching elements 1*a*2, 1*b*2, 1*c*2, 1*d*2 are arranged in this order such that the positive terminals C are on the upper side and the negative terminals E are on the lower side.

Next, the configuration of an external stacked conductor will be described. The external stacked conductor is formed by the P conductor 4A, the N conductor 5A, the AC conductor 6A, and the two intermediate conductors 7A, and is stacked in three layers.

In a first layer closest to the switching elements 1, the N conductor 5A and the intermediate conductors 7A are placed at the same height. The negative electrode of the capacitor 2 and the negative terminals E of the switching elements 1*d*1, 1*d*2 are connected by the N conductor 5A, the positive terminals C of the switching elements 1*d*1, 1*d*2 and the negative terminals E of the switching elements 1*c*1, 1*c*2 are connected by the intermediate conductor 7A, and the positive terminals C of the switching elements 1*b*1, 1*b*2 and the negative terminals E of the switching elements 1*a*1, 1*a*2 are connected by the intermediate conductor 7A.

The P conductor 4A is placed in a second layer which is provided above the first layer with an insulating material (not shown) therebetween and which is positioned at the minimum height that does not cause a problem in terms of insulation from the first layer. The positive terminals C of the switching elements 1*a*1, 1*a*2 and the positive electrode of the capacitor 2 are connected by the P conductor 4A.

Further, the AC conductor 6A is placed in a third layer which is provided above the second layer with an insulating material (not shown) therebetween and which is positioned at the minimum height that does not cause a problem in terms of insulation from the second layer. The negative terminals E of the switching elements 1*b*1, 1*b*2 and the positive terminals C of the switching elements 1*c*1, 1*c*2 are connected by the AC conductor 6A.

The external stacked conductor formed in three layers has a structure symmetric with respect to a center line m in the surface direction. With respect to the center line m, the switching elements 1*a*1, 1*b*1, 1*c*1, 1*d*1 are arranged on the left side in the drawing, and the switching elements 1*a*2, 1*b*2, 1*c*2, 1*d*2 are arranged on the right side in the drawing, so as to be positioned equally on the left and right sides, and the middle lines m1, m2 of the switching element arrays of 1*a*1 to 1*d*1 and 1*a*2 to 1*d*2 are parallel to the center line m. That is, the switching element array of 1*a*1 to 1*d*1 and the switching element array of 1*a*2 to 1*d*2 are each provided in one line parallel to the center line m, and the two switching element arrays of 1*a*1 to 1*d*1 and 1*a*2 to 1*d*2 are provided symmetrically with respect to the center line m.

At the conductor 6A through which main current is inputted an outputted, conductor members of external connection terminals 100 serving as the AC terminal X3 are respectively provided on the middle lines m1, m2 of the switching element arrays of 1*a*1 to 1*d*1 and 1*a*2 to 1*d*2. That is, the external connection terminals 100 are also provided symmetrically with respect to the center line m of the external stacked conductor.

In the conversion circuit 10A configured as described above, main current in the forward direction flows from the capacitor 2 through the P conductor 4A, the switching elements 1*a*1, 1*a*2, the intermediate conductor 7A, the switching elements 1*b*1, 1*b*2, then to the AC conductor 6A. Main current in the reverse direction flows from the AC conductor 6A through the switching elements 1*c*1, 1*c*2, the intermediate conductor 7A, the switching elements 1*d*1, 1*d*2, the N conductor 5A, then to the capacitor 2.

Therefore, the direction on which main current flows is the up-down direction in the drawing, and also is the same as the direction (up-down direction) indicating the mutual positional relationship between the positive terminals C and the negative terminals E of the respective switching elements 1, and also is the same as the direction of the center line m of the external stacked conductor.

As described above, in the present embodiment, the terminals in the conversion circuit 10A having the capacitor 2 and the bridge circuit in which the plurality of switching elements 1 are connected in series and parallel, are connected using the external stacked conductor formed by the P conductor 4A, the N conductor 5A, the AC conductor 6A, and the two intermediate conductors 7A. Therefore, variations in currents flowing through the switching elements 1 can be suppressed, and since the DC wiring inductance can be reduced, surge voltage can be suppressed, whereby reliability of the conversion circuit 10A is improved. Further, the intermediate conductors make series connection between the switching elements in the upper arm 12*a* and the lower arm 12*b*, thereby enabling high-voltage output.

The plurality of switching elements 1 are arranged symmetrically with respect to the center line m of the external stacked conductor, and the external connection terminals 100 are provided to the AC conductor 6A so as to be placed symmetrically with respect to the center line m, whereby an effect of suppressing current variations when the switching elements 1 are used in parallel is obtained. The respective switching elements 1 are arranged such that the mutual positional relationship between the positive terminals C and the negative terminals E is the same as the direction in which main current flows in the external stacked conductor, whereby current variations can be suppressed also when the switching elements 1 are used in series and parallel, and thus current can flow equally thereamong. Therefore, the rated output voltage and the rated output current can be increased efficiently, and the conversion circuit 10A capable of high-voltage and large-current output can be obtained. Since large power is achieved by one conversion circuit 10A, large-power application can be achieved with a small-size and inexpensive device configuration.

The conversion circuit 10A has a plurality of switching element arrays of 1a1 to 1d1 and 1a2 to 1d2 in accordance with the parallel number of the switching elements 1, and the plurality of switching elements in each of the switching element arrays of 1a1 to 1d1 and 1a2 to 1d2 are arranged in one line parallel to the center line m of the external stacked conductor, and the external connection terminals 100 of the AC conductor 6A have conductor members respectively provided on the middle lines m1, m2 of the switching element arrays of 1a1 to 1d1 and 1a2 to 1d2. Therefore, current variations among the switching elements 1 connected in series and parallel can be suppressed reliably.

The upper arm element group (upper arm 12a) and the lower arm element group (lower arm 12b) can be provided adjacently to each other, and the capacitor 2 is provided on the lower side of the lower arm 12b, i.e., the outer side in the direction of the center line m. Therefore, currents flowing through the switching elements 1 can be equalized irrespective of the capacitor 2.

The external stacked conductor has a three-layer configuration having three different height levels of the first layer in which the N conductor 5A and the intermediate conductors 7A are placed at the same height level, the second layer in which the P conductor 4A is placed, and the third layer in which the AC conductor 6A is placed. Therefore, it is possible to reliably realize the configuration of the conversion circuit 10A in which the upper arm 12a and the lower arm 12b are provided adjacently to each other and the capacitor 2 is provided on the outer side of the upper arm 12a.

Next, an example other than the component arrangement shown in FIG. 2 will be shown.

Figure 3:
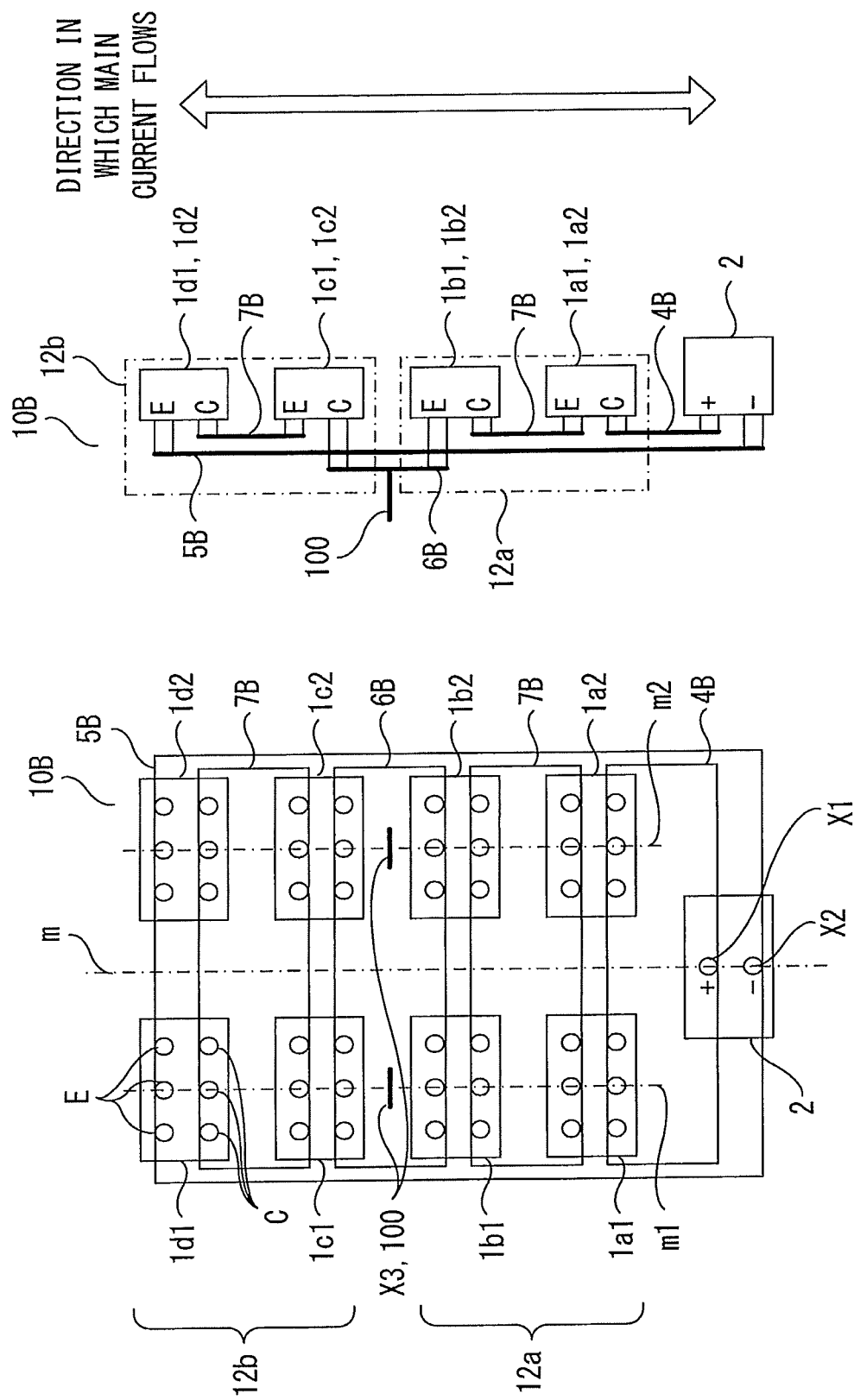
FIG. 3 is a diagram showing component arrangement in another example of the conversion circuit according to embodiment 1 of the present invention.

FIG. 3 is a diagram showing component arrangement in another example of the conversion circuit 10 shown in FIG. 1. FIG. 3 shows a plan view on the left side and a side view on the right side. It is noted that a conversion circuit 10B is obtained by realizing the conversion circuit 10 shown in FIG. 1 using the component arrangement shown in FIG. 3. In addition, a P conductor 4B, an N conductor 5B, an AC conductor 6B, and two intermediate conductors 7B are components realized as the P wiring line 4, the N wiring line 5, the AC wiring line 6, and the intermediate wiring lines 7.

As shown in FIG. 3, the upper arm 12a is placed adjacently to the lower arm 12b such that the upper arm 12a is on the lower side in the drawing , and the capacitor 2 is placed on the outer side of the upper arm 12a, i.e., the lower side thereof in the drawing.

In FIG. 3, in light of the positional relationship between the upper arm 12a and the lower arm 12b, the side where the upper arm 12a is placed is referred to as lower side, and the side where the lower arm 12b is placed is referred to as upper side.

The switching elements 1 are used in two-parallel form. In the switching element array of the switching elements 1a1 to 1d1, the switching elements 1a1, 1b1, 1c1, 1d1 are arranged in this order from the lower side such that the positive terminals C are on the lower side and the negative terminals E are on the upper side. In the switching element array of the switching elements 1a2 to 1d2, the switching elements 1a2, 1b2, 1c2, 1d2 are arranged in this order from the lower side such that the positive terminals C are on the lower side and the negative terminals E are on the upper side. The capacitor 2 is placed on the lower side of the upper arm 12a such that the positive electrode is on the upper side.

The external stacked conductor is formed by the P conductor 4B, the N conductor 5B, the AC conductor 6B, and the two intermediate conductors 7B, and is stacked in three layers.

In a first layer closest to the switching elements 1, the P conductor 4B and the intermediate conductors 7B are placed at the same height. The positive electrode of the capacitor 2 and the positive terminals C of the switching elements 1a1, 1a2 are connected by the P conductor 4B, the negative terminals E of the switching elements 1a1, 1a2 and the positive terminals C of the switching elements 1b1, 1b2 are connected by the intermediate conductor 7B, and the negative terminals E of the switching elements 1c1, 1c2 and the positive terminals C of the switching elements 1d1, 1d2 are connected by the intermediate conductor 7B.

The N conductor 5B is placed in a second layer which is provided above the first layer with an insulating material (not shown) therebetween and which is positioned at the minimum height that does not cause a problem in terms of insulation from the first layer. The negative terminals E of the switching elements 1d1, 1d2 and the negative electrode of the capacitor 2 are connected by the N conductor 5B.

Further, the AC conductor 6B is placed in a third layer which is provided above the second layer with an insulating material (not shown) therebetween and which is positioned at the minimum height that does not cause a problem in terms of insulation from the second layer. The negative terminals E of the switching elements 1b1, 1b2 and the positive terminals C of the switching elements 1c1, 1c2 are connected by the AC conductor 6B.

The external stacked conductor formed in three layers has a structure symmetric with respect to the center line m in the surface direction. With respect to the center line m, the switching elements 1a1, 1b1, 1c1, 1d1 are arranged on the left side in the drawing, and the switching elements 1a2, 1b2, 1c2, 1d2 are arranged on the right side in the drawing, so as to be positioned equally on the left and right sides, and the middle lines m1, m2 of the switching element arrays of 1a1 to 1d1 and 1a2 to 1d2 are parallel to the center line m. That is, the switching element array of 1a1 to 1d1 and the switching element array of 1a2 to 1d2 are each provided on one line parallel to the center line m, and the two switching element arrays of 1a1 to 1d1 and 1a2 to 1d2 are provided symmetrically with respect to the center line m.

At the AC conductor 6B through which main current is inputted and outputted, conductor members of the external connection terminals 100 serving as the AC terminal X3 are respectively provided on the middle lines m1, m2 of the switching element arrays of 1a1 to 1d1 and 1a2 to 1d2. That is, the external connection terminals 100 are also provided symmetrically with respect to the center line m of the external stacked conductor.

In the conversion circuit 10B configured as described above, main current in the forward direction flows from the capacitor 2 through the P conductor 4B, the switching elements 1a1, 1a2, the intermediate conductor 7B, the switching elements 1b1, 1b2, then to the AC conductor 6B. Main current in the reverse direction flows from the AC conductor 6B through the switching elements 1c1, 1c2, the intermediate conductor 7B, the switching elements 1d1, 1d2, the N conductor 5B, then to the capacitor 2.

Therefore, the direction in which main current flows is the up-down direction, and also is the same as the direction (up-down direction) indicating the mutual positional relationship between the positive terminals C and the negative terminals E of the respective switching elements 1, and also is the same as the direction of the center line m of the external stacked conductor.

In this case, unlike the case of the conversion circuit 10A, the position of the capacitor 2 is on the lower side of the upper arm 12a (outer side in the direction of the center line m), and therefore the layers of the P conductor 4B and the N conductor 5B are opposite to those in the case of the conversion circuit 10A, but also in the case of the conversion circuit 10B, completely the same effect as in the case of the conversion circuit 10A described above is obtained. Therefore, currents flowing through the switching elements 1 connected in series and parallel can be equalized, whereby the rated output voltage and the rated output current can be increased efficiently, and the conversion circuit 10B capable of high-voltage and large-current output can be obtained.

In addition, since large power is achieved by one conversion circuit 10B, large-power application can be achieved with a small-size and inexpensive device configuration.

Figure 4:
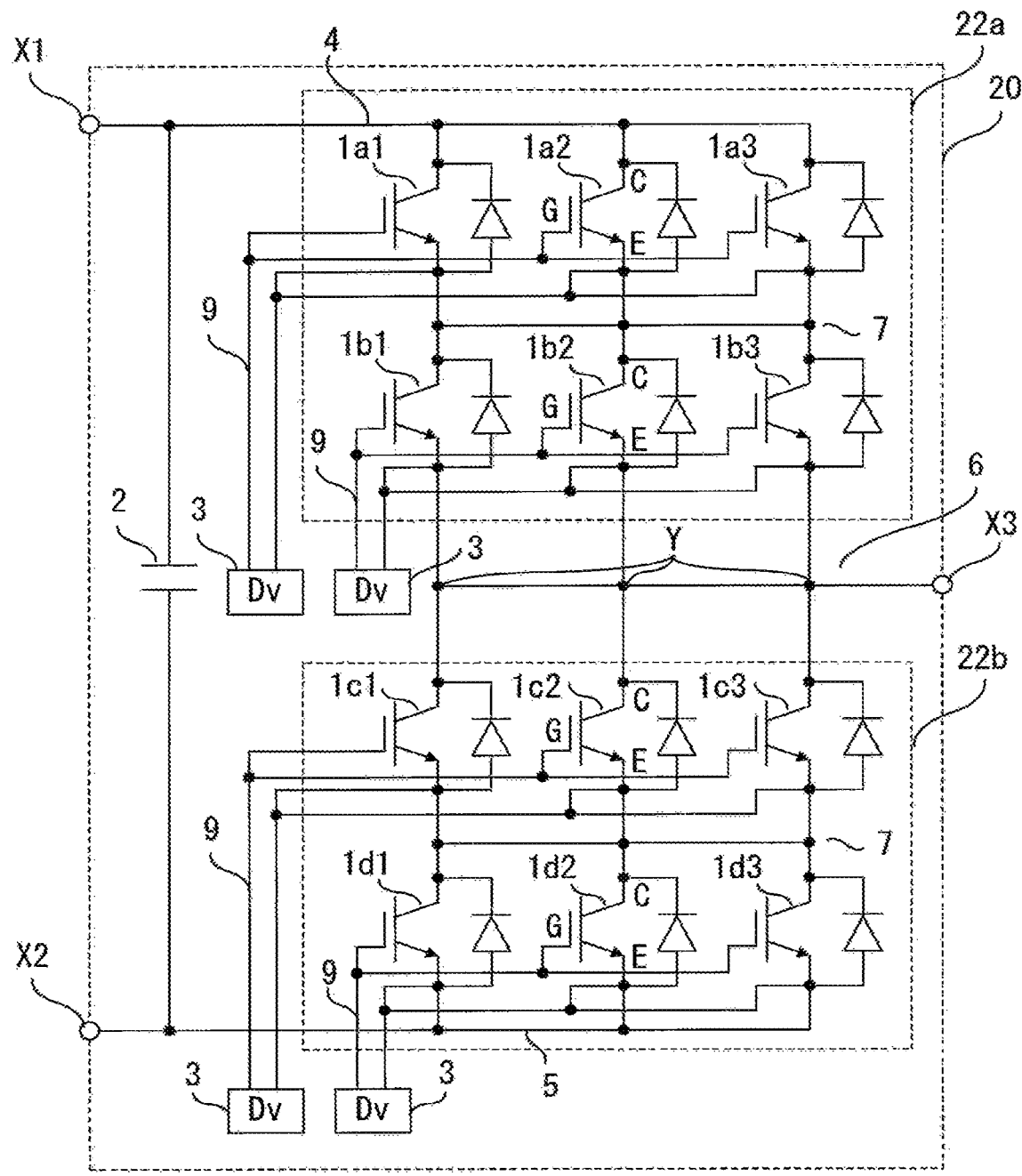
FIG. 4 is a circuit diagram showing a conversion circuit in another example of embodiment 1 of the present invention.

FIG. 4 is a circuit diagram showing a conversion circuit in another example of embodiment 1 of the present invention. As shown in FIG. 4, the conversion circuit 20 includes DC terminals X1, X2, an AC terminal X3, a capacitor 2, a plurality of switching elements 1a1, 1a2, 1a3, 1b1, 1b2, 1b3, 1c1, 1c2, 1c3, 1d1, 1d2, 1d3, and gate driving circuits 3 for the switching elements 1 (1a1 to 1d3).

Each set of switching elements 1a1, 1a2, 1a3, switching elements 1b1, 1b2, 1b3, switching elements 1c1, 1c2, 1c3, and switching elements 1d1, 1d2, 1d3 is used in three-parallel form, and each pair of switching elements 1a1, 1b1, switching elements 1a2, 1b2, switching elements 1a3, 1b3, switching elements 1c1, 1d1, switching elements 1c2, 1d2, and switching elements 1c3, 1d3 is used in two-series form. That is, the conversion circuit 20 has the switching elements 1 connected in two-series and three-parallel form so as to configure one bridge circuit in which an upper arm 22a formed from an upper arm element group (switching elements 1a1 to 1a3, 1b1 to 1b3) and lower arm 22b formed from a lower arm element group (switching elements 1c1 to 1c3, 1d1 to 1d3) are connected. It is noted that intermediate terminals Y are connection points between the upper arm 22a and the lower arm 22b.

In the conversion circuit 20, a P wiring line 4, an N wiring line 5, an AC wiring line 6, intermediate wiring lines 7, and gate wiring lines 9 are provided. The P wiring line 4 connects the positive electrode of the capacitor 2 connected to the DC terminal X1, and positive terminals C of the switching elements 1a1 to 1a3. The N wiring line connects the negative electrode of the capacitor 2 connected to the DC terminal X2, and negative terminals E of the switching elements 1d1 to 1d3. The AC wiring line 6 connects negative terminals E of the switching elements 1b1 to 1b3 and positive terminals C of the switching elements 1c1 to 1c3 so as to be connected to the AC terminal X3, whereby AC power is inputted and outputted from and to outside. That is, the upper arm 22a and the lower arm 22b are connected in a bridge form by the AC wiring line 6, and the connection points (intermediate terminals Y) therebetween are connected to the AC terminal X3.

The intermediate wiring lines 7 connect negative terminals E of the switching elements 1a1 to 1a3 and positive terminals C of the switching elements 1b1 to 1b3 in series, and connect negative terminals E of the switching elements 1c1 to 1c3 and positive terminals C of the switching elements 1d1 to 1d3 in series. The gate wiring lines 9 connect the gate terminals G of the switching elements 1 and the gate driving circuits 3.

Figure 5:
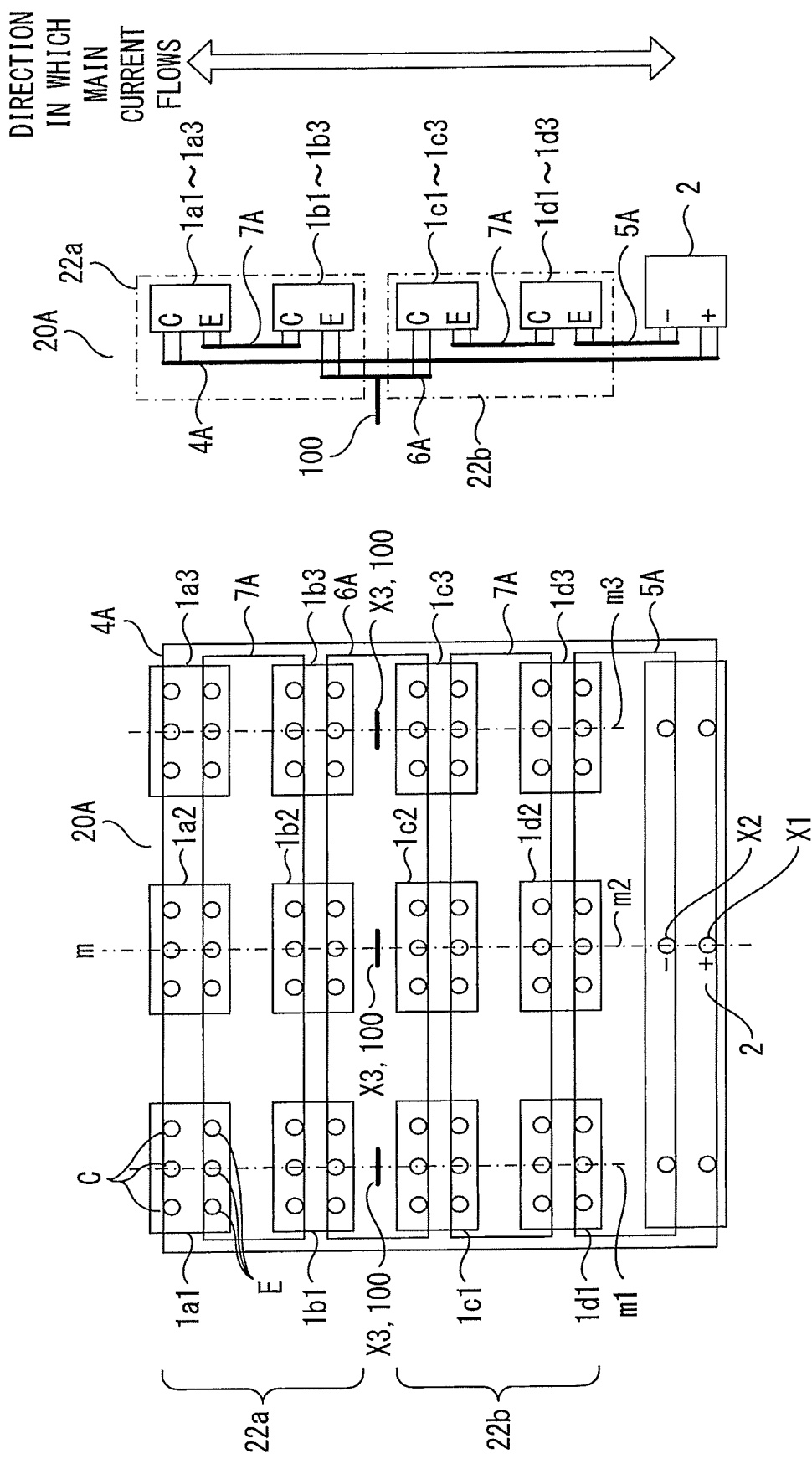
FIG. 5 is a diagram showing component arrangement in the conversion circuit in the other example of embodiment 1 of the present invention.

FIG. 5 is a diagram showing component arrangement in the conversion circuit 20 shown in FIG. 4. FIG. 5 shows a plan view on the left side and a side view on the right side. It is noted that a conversion circuit 20A is obtained by realizing the conversion circuit 20 shown in FIG. 4 using the component arrangement shown in FIG. 5. In addition, a P conductor 4A, an N conductor 5A, an AC conductor 6A, and two intermediate conductors 7A are components realized as the P wiring line 4, the N wiring line 5, the AC wiring line 6, and the intermediate wiring lines 7.

As shown in FIG. 5, the upper arm 22a is placed adjacently to the lower arm 22b such that the upper arm 22a is on the upper side in the drawing, and the capacitor 2 is placed on the outer side of the lower arm 22b, i.e., the lower side thereof in the drawing.

Since the switching elements 1 are used in three-parallel form, three switching element arrays, i.e., a switching element array (switching elements 1a1 to 1d1), a switching element array (switching elements 1a2 to 1d2), and a switching element array (switching elements 1a3 to 1d3) are each provided such that the switching elements are arrayed in one line on respective middle lines m1, m2, m3. All the arrangement directions of the switching elements 1 are the same, and in this case, the positive terminals C are on the upper side and the negative terminals E are on the lower side. The capacitor 2 is provided such that the negative electrode is on the upper side.

Thus, in the component arrangement of the conversion circuit 20A, the two switching element arrays in the conversion circuit 10A shown in FIG. 2 are replaced with three switching element arrays.

Next, the configuration of an external stacked conductor will be described. The external stacked conductor is the same as that in the case of the conversion circuit 10A shown in FIG. 2, that is, formed by the P conductor 4A, the N conductor 5A, the AC conductor 6A, and the two intermediate conductors 7A, and is stacked in three layers.

In a first layer closest to the switching elements 1, the N conductor 5A and the intermediate conductors 7A are placed at the same height. The P conductor 4A is placed in a second layer which is provided above the first layer with an insulating material (not shown) therebetween and which is positioned at the minimum height that does not cause a problem in terms of insulation from the first layer. Further, the AC conductor 6A is placed in a third layer which is provided above the second layer with an insulating material (not shown) therebetween and which is positioned at the minimum height that does not cause a problem in terms of insulation from the second layer.

The external stacked conductor formed in three layers has a structure symmetric with respect to the center line m in the surface direction. With respect to the center line m, the switching elements 1a1 to 1d3 are arranged symmetrically. The switching element array of the switching elements 1a1 to 1d1, the switching element array of the switching elements 1a2 to 1d2, and the switching element array of the switching elements 1a3 to 1d3 are each provided in one line parallel to the center line m. The switching element array of the switching elements 1a2 to 1d2 is provided such that the middle line m2 thereof overlaps the center line m, and the other two switching element arrays are provided symmetrically with respect to the center line m, i.e., positioned equally on the left and right sides.

At the AC conductor 6A through which main current is inputted and outputted, conductor members of the external connection terminals 100 serving as the AC terminal X3 are respectively provided on the middle lines m1, m2, m3 of the switching element arrays of 1a1 to 1d1, 1a2 to 1d2, and 1a3 to 1d3. That is, the external connection terminals 100 are also provided symmetrically with respect to the center line m of the external stacked conductor.

In the conversion circuit 20A configured as described above, main current in the forward direction flows from the capacitor 2 through the P conductor 4A, the switching elements 1a1 to 1a3, the intermediate conductor 7A, the switching elements 1b1 to 1b3, then to the AC conductor 6A. Main current in the reverse direction flows from the AC conductor 6A through the switching elements 1c1 to 1c3, the intermediate conductor 7A, the switching elements 1d1 to 1d3, the N conductor 5A, then to the capacitor 2.

Therefore, the direction in which main current flows is the up-down direction in the drawing, and also is the same as the direction (up-down direction) indicating the mutual positional relationship between the positive terminals C and the negative terminals E of the respective switching elements 1, and also is the same as the direction of the center line m of the external stacked conductor.

Also in the conversion circuit 20A having the component arrangement as described above, the same effect as in the case of the conversion circuit 10A described above is obtained. That is, currents flowing through the switching elements 1 connected in series and parallel can be equalized, whereby the rated output voltage and the rated output current can be increased efficiently, and the conversion circuit 20A capable of high-voltage and large-current output and having improved reliability can be obtained. In this case, since the switching elements 1 are provided in two-series and three-parallel form, further high-voltage and large-current output can be achieved. In addition, since the number of the switching elements 1 is an odd number and one of the switching element arrays is provided on the center line m of the external stacked conductor, the switching elements 1 can be arranged symmetrically with respect to the center line m, and current variations among the switching elements 1 can be reliably suppressed.

In the conversion circuit 20A shown in FIG. 5, the capacitor 2 is provided on the outer side of the lower arm 22b. However, as in the conversion circuit 10B shown in FIG. 3, the capacitor 2 may be provided on the outer side of the upper arm 22a, whereby the same effect can be obtained.

In the conversion circuits 10, 20, the switching elements 1 are used in two-series form. However, the switching elements 1 may be configured with a series number of 3 or more, whereby further high-voltage and large-current output can be achieved. In this case, the number of the intermediate conductors is two times the value of (series number-1).

Next, a power conversion device having a plurality of cell converters (CELL) connected in cascade will be described.

Figure 6:
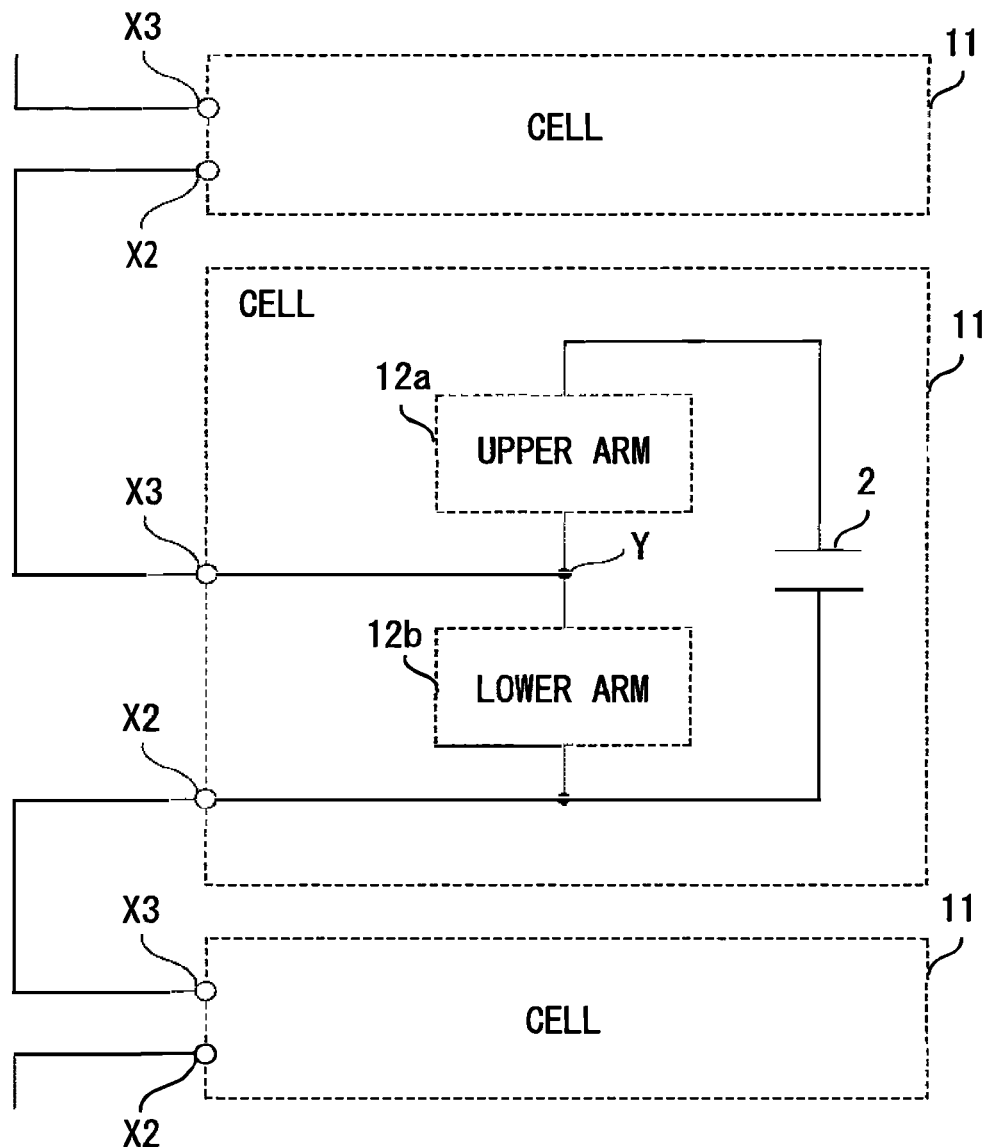
FIG. 6 is a schematic circuit diagram of a power conversion device including a first cell converter according to embodiment 1 of the present invention.

FIG. 6 is a schematic circuit diagram of the power conversion device including first cell converters.

As shown in FIG. 6, the first cell converter 11 has a half-bridge configuration having the capacitor 2 and one bridge circuit in which the upper arm 12a and the lower arm 12b are connected via the intermediate terminal Y, and has two external terminals, i.e., the DC terminal X2 connected to the negative electrode of the capacitor 2, and the AC terminal X3. A plurality of the first cell converters 11 are connected in series via the two external terminals X2, X3.

It is noted that the first cell converter 11 is obtained by applying the conversion circuit 10 shown in FIG. 1 without using the DC terminal X1 as an external terminal. The first cell converter 11 is applicable to a power conversion device of MMC circuit type, and used for HVDC, for example.

Figure 7:
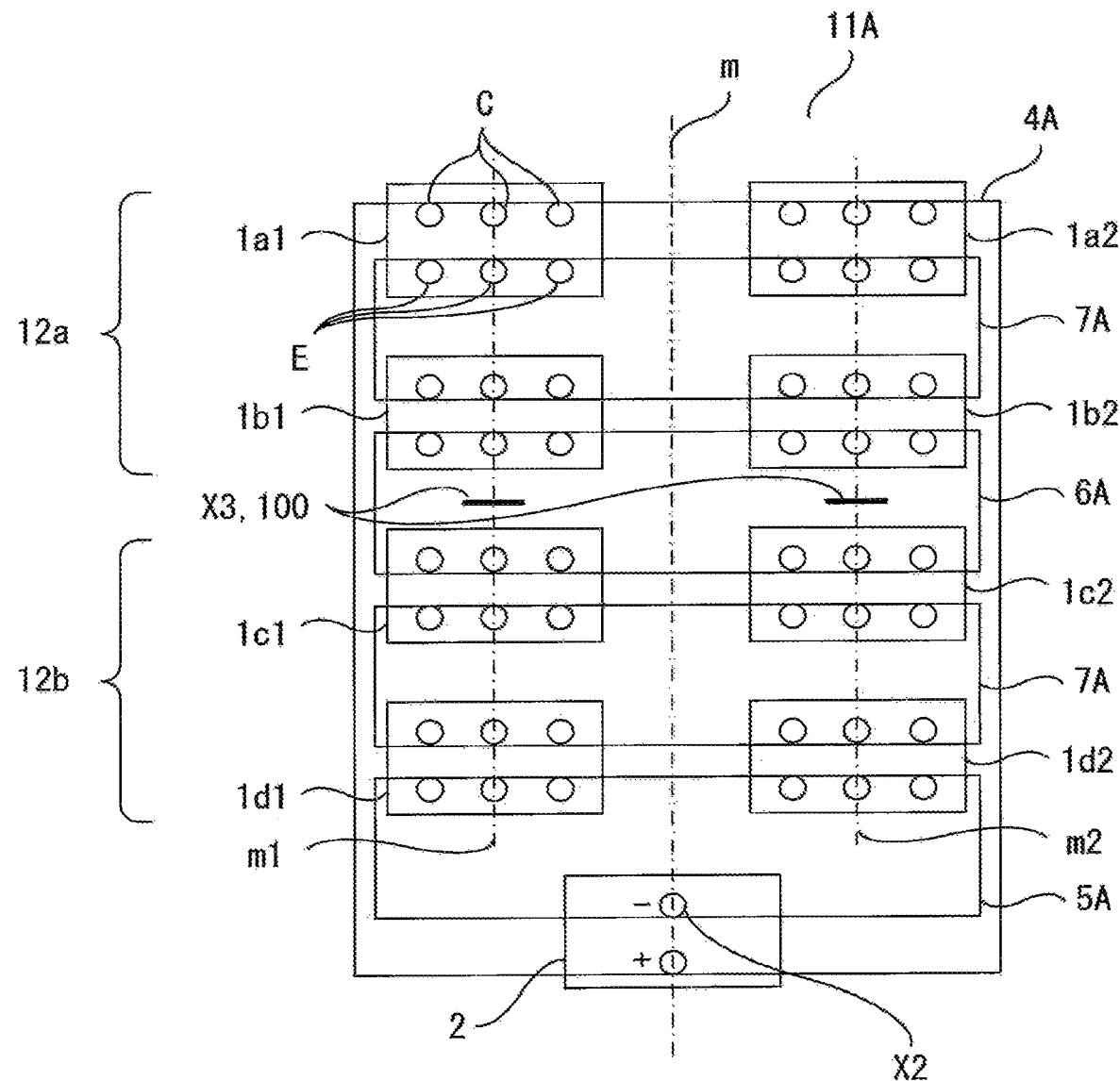
FIG. 7 is a diagram showing component arrangement in the first cell converter according to embodiment 1 of the present invention.

FIG. 7 is a plan view showing component arrangement in the first cell converter 11 shown in FIG. 6. It is noted that a first cell converter 11A is obtained by realizing the first cell converter 11 shown in FIG. 6 using the component arrangement shown in FIG. 7. In this case, as compared to the conversion circuit 10A shown in FIG. 2, the first cell converter 11A is different only in that the positive electrode of the capacitor 2 is not used as the external terminal (DC terminal X1), and is the same in arrangement of the switching elements 1 and the capacitor 2 and arrangement of the external stacked conductor. Therefore, the manner of main current flowing through the first cell converter 11A is also the same as main current in the conversion circuit 10A.

Thus, the first cell converter 11A has all the effects obtained by the conversion circuit 10A described above, that is, currents flowing through the switching elements 1 can be equalized, and output voltage and output current can be effectively increased with one first cell converter 11A. Therefore, by connecting a plurality of the first cell converters 11A in cascade to configure a power conversion device of MMC circuit type, the number of connected first cell converters 11A can be decreased, and thus large-power output can be achieved with a small-size and inexpensive device configuration.

Next, a power conversion device in which a plurality of cell converters adopting the component arrangement of the conversion circuit 10B described above are connected in cascade, will be described.

Figure 8:
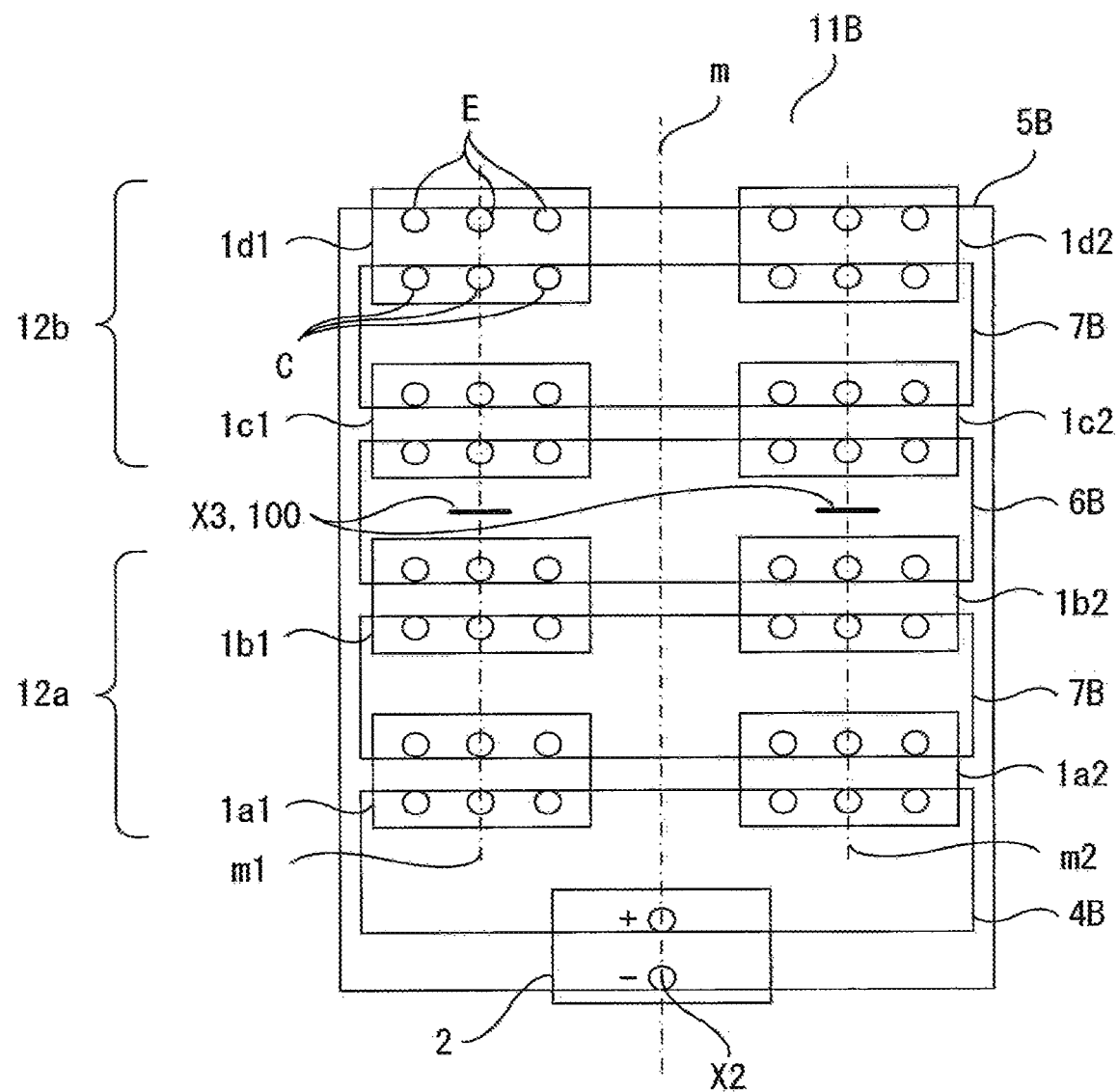
FIG. 8 is a diagram showing component arrangement in another example of the first cell converter according to embodiment 1 of the present invention.

FIG. 8 is a plan view showing component arrangement in another example of the first cell converter 11 shown in FIG. 6. It is noted that a first cell converter 11B is obtained by realizing the first cell converter 11 shown in FIG. 6 using the component arrangement shown in FIG. 8. In this case, as compared to the conversion circuit 10B shown in FIG. 3, the first cell converter 11B is different only in that the positive electrode of the capacitor 2 is not used as the external terminal (DC terminal X1), and is the same in arrangement of the switching elements 1 and the capacitor 2 and arrangement of the external stacked conductor. Therefore, the manner of main current flowing through the first cell converter 11B is also the same as main current in the conversion circuit 10B.

Thus, the first cell converter 11B has all the effects obtained by the conversion circuit 10B described above, that is, currents flowing through the switching elements 1 can be equalized, and output voltage and output current can be effectively increased with one first cell converter 11B. Therefore, by connecting a plurality of the first cell converters 11B in cascade to configure a power conversion device of MMC circuit type, the number of connected first cell converters 11B can be decreased, and thus large-power output can be achieved with a small-size and inexpensive device configuration.

In FIG. 6 to FIG. 8, the first cell converters 11, 11A, 11B in which the switching elements 1 are provided in two-parallel form have been shown. However, the conversion circuits 20, 20A adopting three-parallel form are also applicable.

Next, a power conversion device in which a plurality of cell converters having a full-bridge configuration are connected in cascade will be described.

Figure 9:
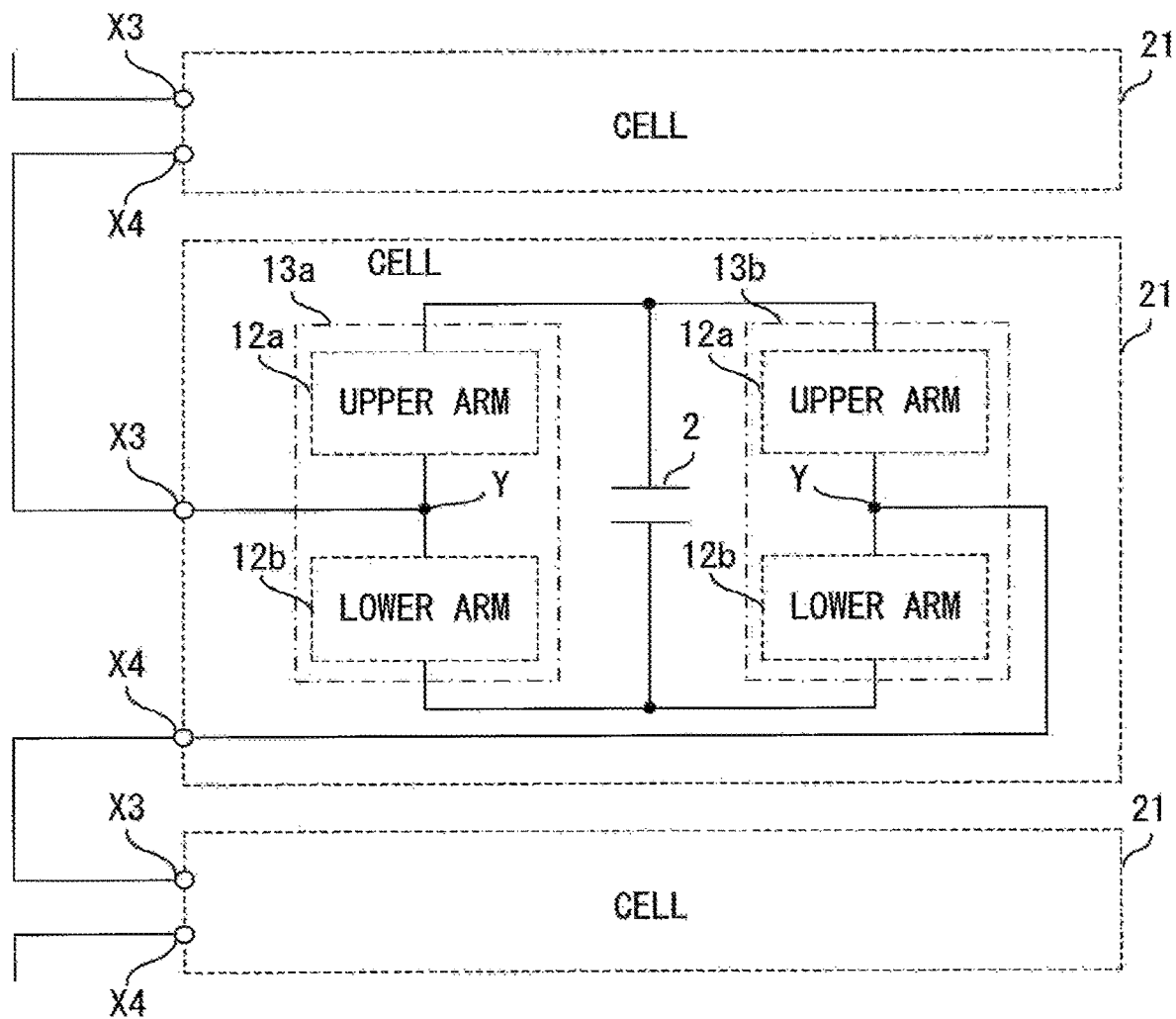
FIG. 9 is a schematic circuit diagram of a power conversion device including a second cell converter according to embodiment 1 of the present invention.

FIG. 9 is a schematic circuit diagram of a power conversion device including second cell converters.

As shown in FIG. 9, the second cell converter 21 has a full-bridge configuration having the capacitor 2 and two bridge circuits 13a, 13b in each of which the upper arm 12a and the lower arm 12b are connected via the intermediate terminal Y, and has two AC terminals X3, X4 as external terminals. A plurality of the second cell converters 21 are connected in series via the two external terminals X3, X4.

It is noted that the configuration of each bridge circuit 13a, 13b of the second cell converter 21 is the same as the bridge circuit of the conversion circuit 10 shown in FIG. 1. The second cell converter 21 is applicable to a power conversion device of MMC circuit type, and used for STATCOM, for example.

Figure 10:
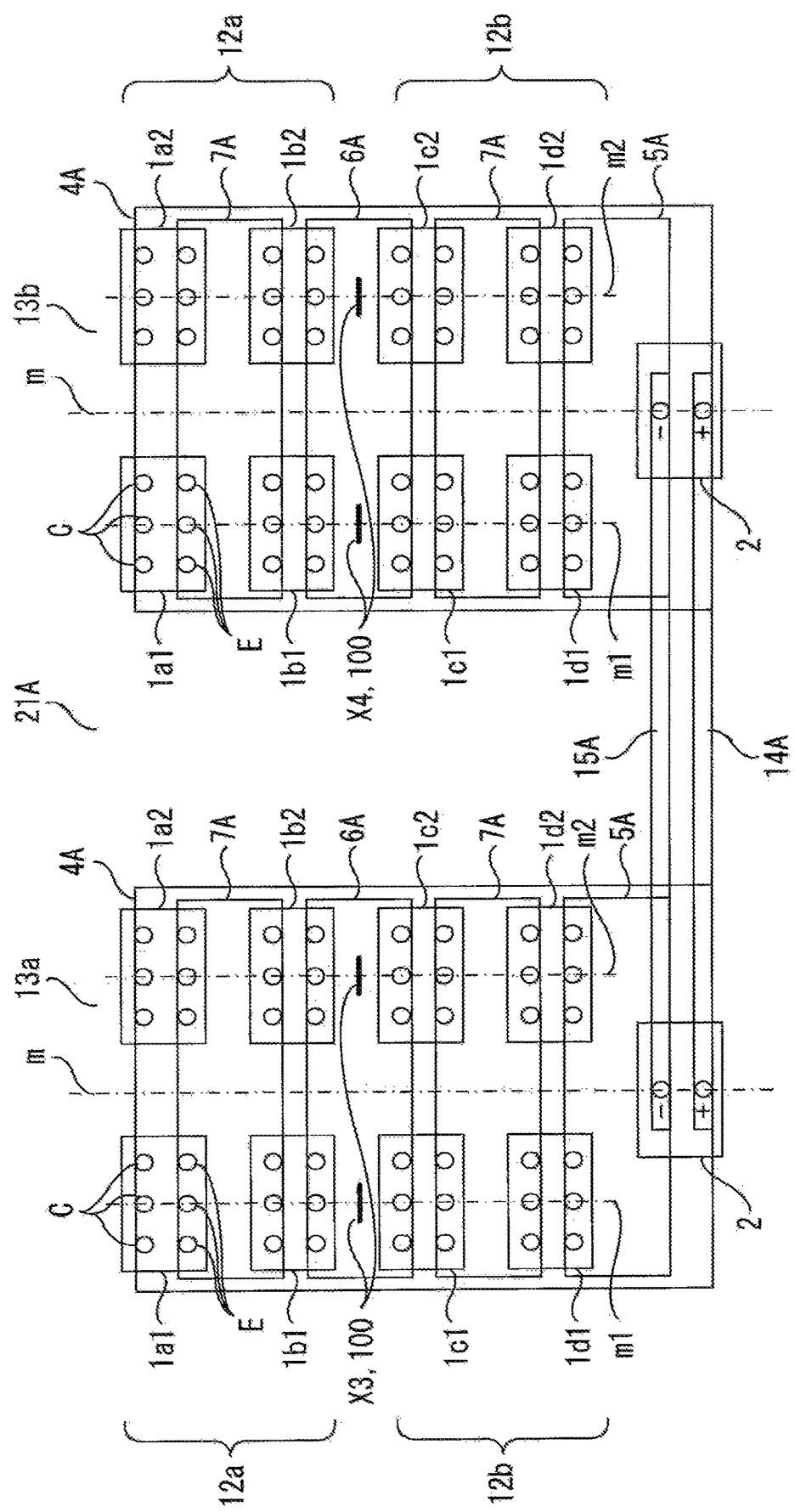
FIG. 10 is a diagram showing component arrangement in the second cell converter according to embodiment 1 of the present invention.

FIG. 10 is a plan view showing component arrangement in the second cell converter 21 shown in FIG. 9. It is noted that a second cell converter 21A is obtained by realizing the second cell converter 21 shown in FIG. 9 using the component arrangement shown in FIG. 10. In this case, in the second cell converter 21A, two conversion circuits 10A shown in FIG. 2 are arranged side by side. The capacitor 2 is provided so as to be divided into two, and the divided capacitors 2 are individually connected to the two bridge circuits 13a, 13b by external stacked conductors. The positive electrodes of the two capacitors 2 provided in a divided manner are connected to each other via a connection conductor 14A, and the negative electrodes thereof are connected to each other via a connection conductor 15A. On the bridge circuit 13a side, the external connection terminals 100 provided to the AC conductor 6A are used as the AC terminal X3, and on the bridge circuit 13b side, the external connection terminals 100 provided to the AC conductor 6A are used as the AC terminal X4.

The second cell converter 21A is configured such that two conversion circuits 10A described above are arranged in parallel, and the manner of main current flowing in each bridge circuit 13a, 13b of the second cell converter 21A is also the same as main current in the conversion circuit 10A.

Thus, the second cell converter 21A has all the effects obtained by the conversion circuit 10A, that is, currents flowing through the switching elements 1 can be equalized, and output voltage and output current can be effectively increased with one full-bridge second cell converter 21A. Therefore, by connecting a plurality of the second cell converters 21A in cascade to configure a power conversion device of MMC circuit type, the number of connected second cell converters 21A can be decreased, and thus large-power output can be achieved with a small-size and inexpensive device configuration.

Figure 11:
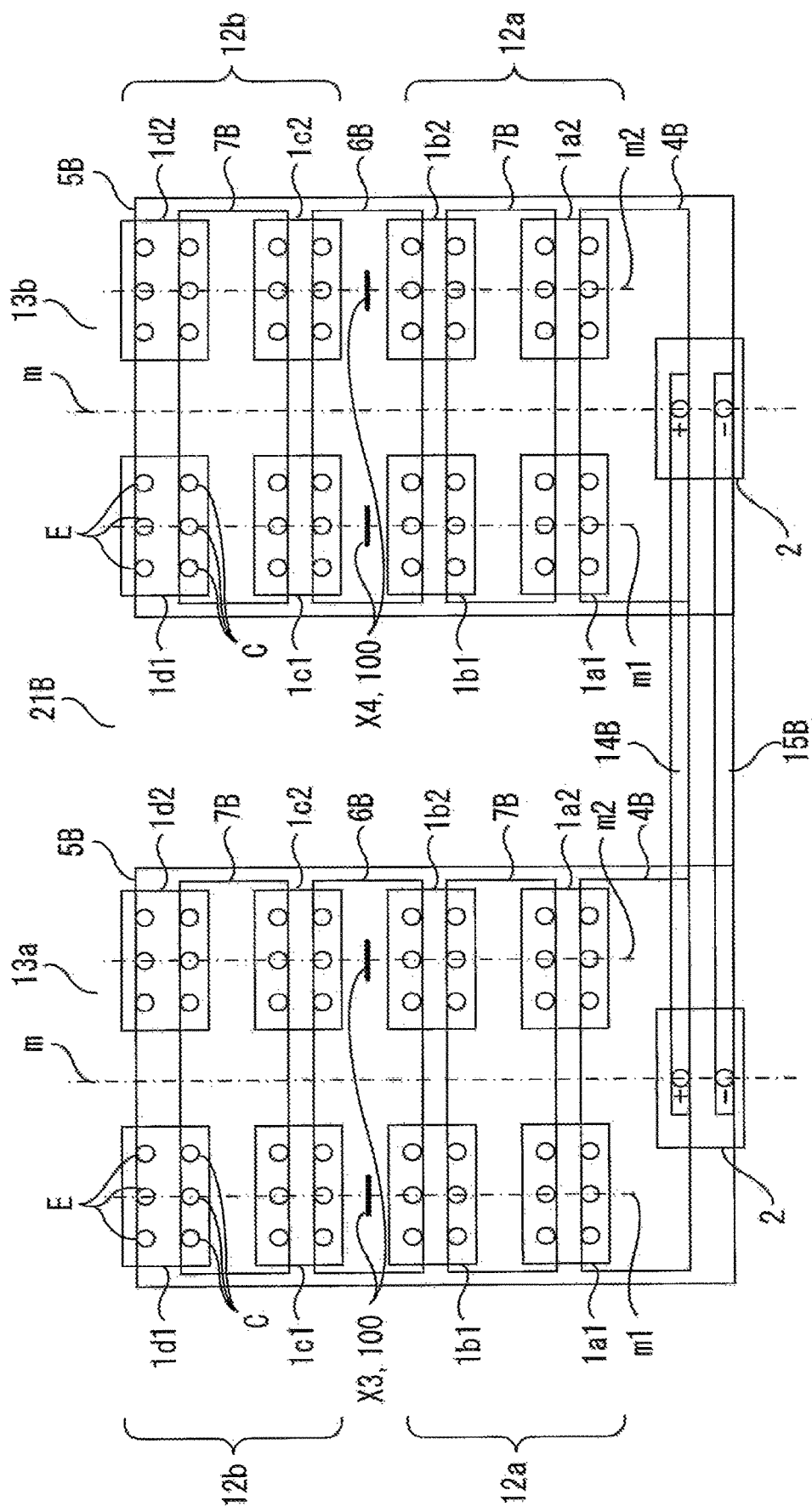
FIG. 11 is a diagram showing component arrangement in another example of the second cell converter according to embodiment 1 of the present invention.

FIG. 11 is a plan view showing component arrangement in another example of the second cell converter 21 shown in FIG. 9. It is noted that a second cell converter 21B is obtained by realizing the second cell converter 21 shown in FIG. 9 using the component arrangement shown in FIG. 11. In this case, in the second cell converter 21B, two conversion circuits 10B shown in FIG. 3 are arranged side by side. The capacitor 2 is provided so as to be divided into two, and the divided capacitors 2 are individually connected to the two bridge circuits 13a, 13b by external stacked conductors. The positive electrodes of the two capacitors 2 provided in a divided manner are connected to each other via a connection conductor 14B, and the negative electrodes thereof are connected to each other via a connection conductor 15B. On the bridge circuit 13a side, the external connection terminals 100 provided to the AC conductor 6B are used as the AC terminal X3, and on the bridge circuit 13b side, the external connection terminals 100 provided to the AC conductor 6B are used as the AC terminal X4.

The second cell converter 21B is configured such that two conversion circuits 10B described above are arranged in parallel, and the manner of main current flowing in each bridge circuit 13a, 13b of the second cell converter 21B is also the same as main current in the conversion circuit 10B.

Thus, the second cell converter 21B has all the effects obtained by the conversion circuit 10B, that is, currents flowing through the switching elements 1 can be equalized, and output voltage and output current can be effectively increased with one full-bridge second cell converter 21B. Therefore, by connecting a plurality of the second cell converters 21B in cascade to configure a power conversion device of MMC circuit type, the number of connected second cell converters 21B can be decreased, and thus large-power output can be achieved with a small-size and inexpensive device configuration.

In FIG. 9 to FIG. 11, the second cell converters 21, 21A, 21B in which the switching elements 1 are provided in two-parallel form have been shown. However, a configuration in which two conversion circuits 20, 20A adopting three-parallel form are arranged in parallel, is also applicable.

The case where the capacitors 2 are provided in a divided manner for the respective bridge circuits 13a, 13b, has been shown. However, one capacitor 2 may be provided at the middle between the left and right bridge circuits 13a, 13b, and the positive electrode and the negative electrode of the capacitor 2 may be connected to each P conductor 4A (4B) and each N conductor 5A (5B) via the connection conductors 14A (14B) and 15A (15B).

Next, a power conversion device in which a plurality of cell converters having a full-bridge configuration are connected in cascade by high-voltage DC-DC conversion type, will be described.

Figure 12:
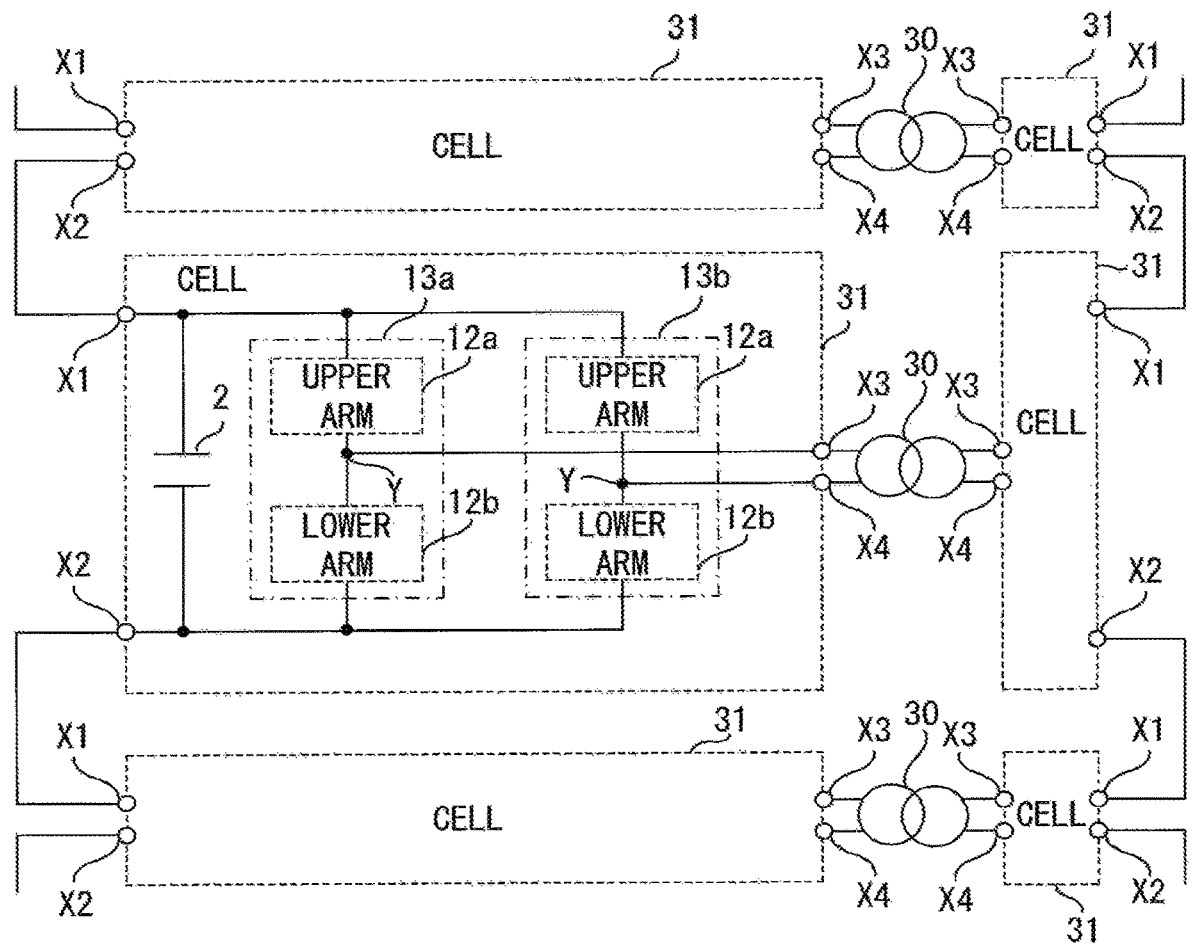
FIG. 12 is a schematic circuit diagram of a power conversion device including a third cell converter according to embodiment 1 of the present invention.

FIG. 12 is a schematic circuit diagram of a power conversion device including third cell converters.

As shown in FIG. 12, a third cell converter 31 has a full-bridge configuration having the capacitor 2 and two bridge circuits 13a, 13b in each of which the upper arm 12a and the lower arm 12b are connected via the intermediate terminal Y, and has two DC terminals X1, X2 and two AC terminals X3, X4 as external terminals.

Two third cell converters 31 are connected via a single-phase transformer 30 on the AC side, to form one isolated DC-DC converter, and a plurality of the isolated DC-DC converters are connected via the DC terminals X1, X2 serving as input/output terminals.

It is noted that the configuration of each bridge circuit 13a, 13b of the third cell converter 31 is the same as that of the bridge circuit of the conversion circuit 10 shown in FIG. 1. The third cell converter 31 is applicable to a power conversion device of high-voltage DC-DC conversion type, and used for HVDC, for example.

Figure 13:
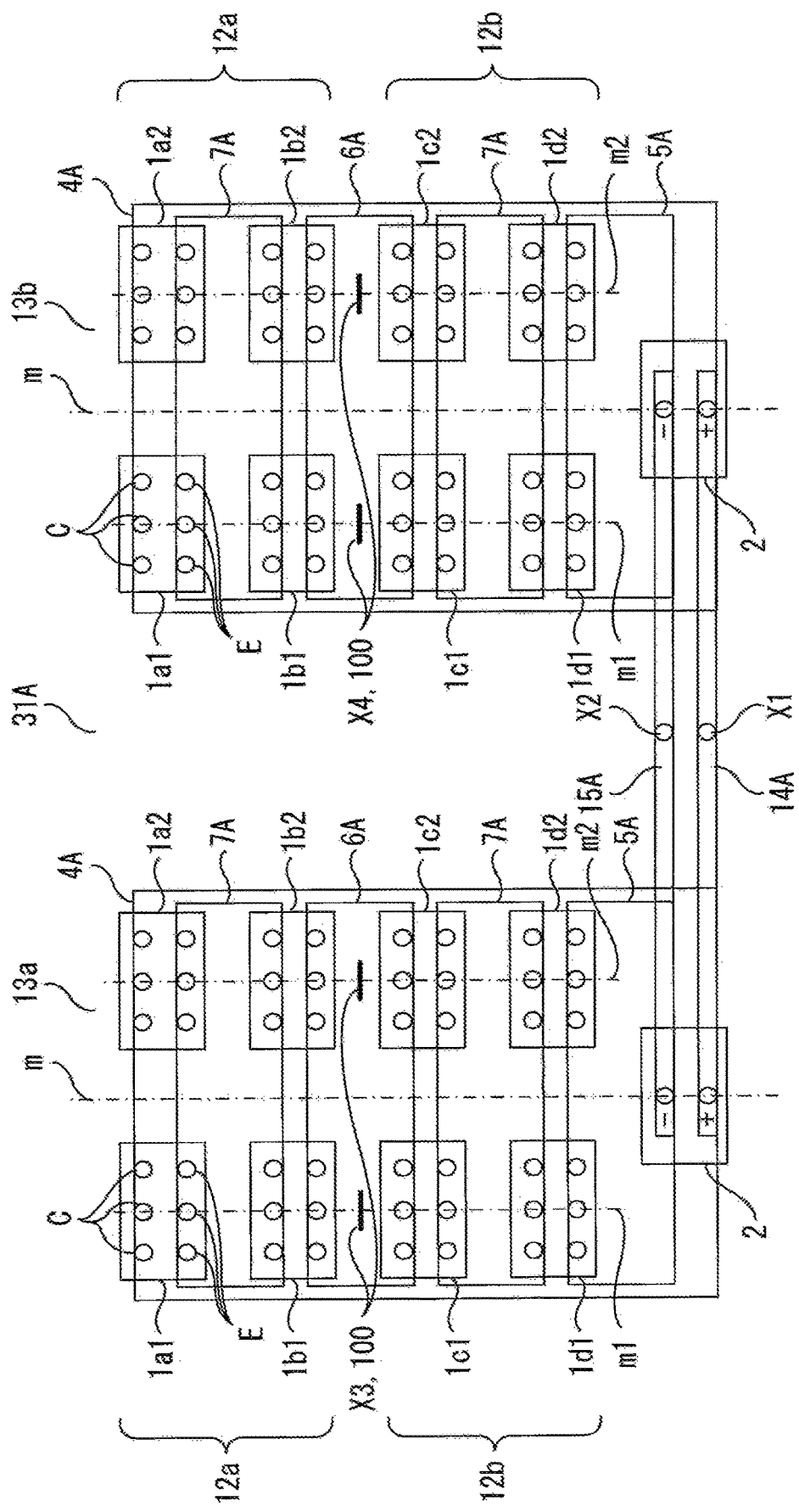
FIG. 13 is a diagram showing component arrangement in the third cell converter according to embodiment 1 of the present invention.

FIG. 13 is a plan view showing component arrangement in the third cell converter 31 shown in FIG. 12. It is noted that a third cell converter 31A is obtained by realizing the third cell converter 31 shown in FIG. 12 using the component arrangement shown in FIG. 13. In this case, the third cell converter 31A is the same as the second cell converter 21A shown in FIG. 10 except that the DC terminals X1, X2 are provided. The DC terminal X1 is provided at the middle of the connection conductor 14A connecting the positive electrodes of the two capacitors 2, and the DC terminal X2 is provided at the middle of the connection conductor 15A connecting the negative electrodes of the two capacitors 2.

As in the case the second cell converter 21A, the third cell converter 31A also has all the effects, obtained by the conversion circuit 10A, that is, currents flowing through the switching elements 1 can be equalized. In addition, since the DC terminals X1, X2 are provided at the middle of the connection conductors 14A, 15A, input/output current flowing between each third cell converter 31A and the adjacent third cell converter 31A flows equally through the two bridge circuits 13a, 13b, and thus currents flowing through the switching elements 1 in the third cell converter 31A can be further equalized.

Thus, output voltage and output current can be effectively increased with one full-bridge third cell converter 31A. Therefore, by connecting a plurality of isolated DC-DC converters using the third cell converters 31A to configure a power conversion device of high-voltage DC-DC conversion type, the number of connected isolated DC-DC converters can be decreased, and thus large-power output can be achieved with a small-size and inexpensive device configuration.

Figure 14:
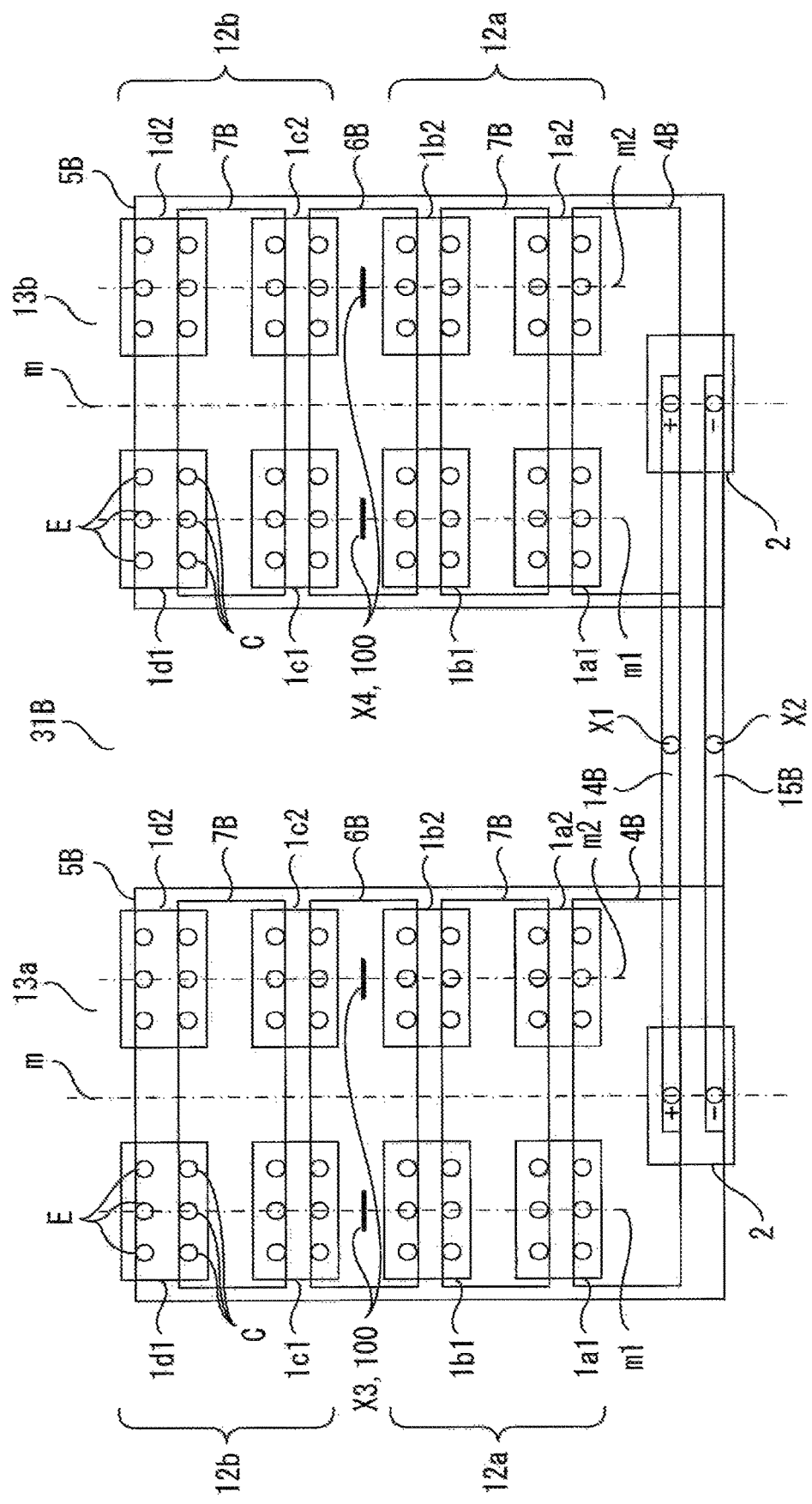
FIG. 14 is a diagram showing component arrangement in another example of the third cell converter according to embodiment 1 of the present invention.

FIG. 14 is a plan view showing component arrangement in another example of the third cell converter 31 shown in FIG. 12. It is noted that a third cell converter 31B is obtained by realizing the third cell converter 31 shown in FIG. 12 using the component arrangement shown in FIG. 14. In this case, the third cell converter 31B is the same as the second cell converter 21B shown in FIG. 11 except that the DC terminals X1, X2 are provided. The DC terminal X1 is provided at the middle of the connection conductor 14B connecting the positive electrodes of the two capacitors 2, and the DC terminal X2 is provided at the middle of the connection conductor 15B connecting the negative electrodes of the two capacitors 2.

As in the case of the second cell converter 21B, the third cell converter 31B also has all the effects obtained by the conversion circuit 10B, that is, currents flowing through the switching elements 1 can be equalized. In addition, since the DC terminals X1, X2 are provided at the middle of the connection conductors 14B, 15B, input/output current flowing between each third cell converter 31B and the adjacent third cell converter 31B flows equally through the two bridge circuits 13a, 13b, and thus currents flowing through the switching elements 1 in the third cell converter 31B can be further equalized.

Thus, output voltage and output current can be effectively increased with one full-bridge third cell converter 31B. Therefore, by connecting a plurality of isolated DC-DC converters using the third cell converters 31B to configure a power conversion device of high-voltage DC-DC conversion type, the number of connected isolated DC-DC converters can be decreased, and thus large-power output can be achieved with a small-size and inexpensive device configuration.

Next, a power conversion device in which a plurality of cell converters having a three-phase bridge configuration are corrected in cascade by high-voltage DC-DC conversion type, will be described.

Figure 15:
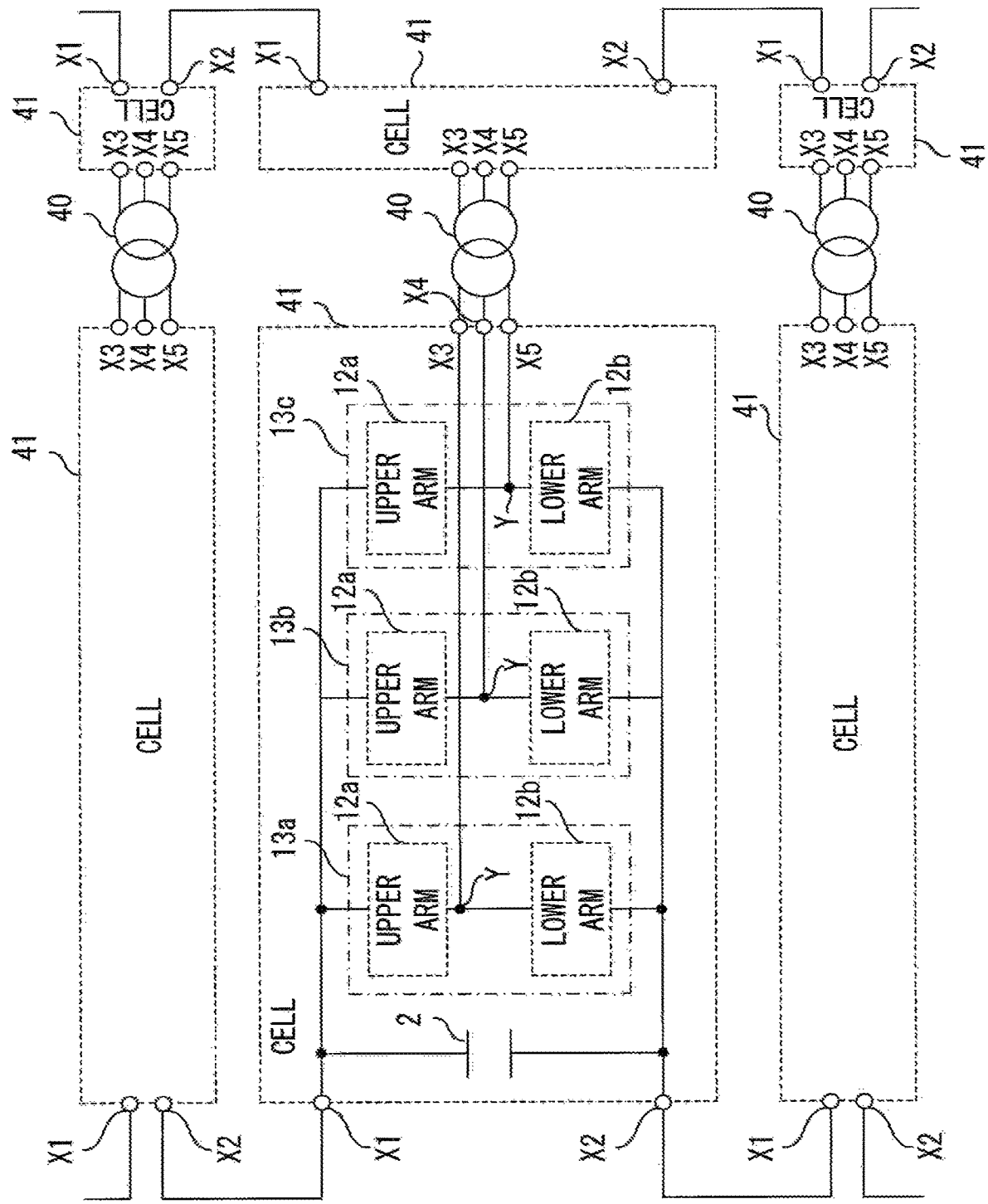
FIG. 15 is a schematic circuit diagram of a power conversion device including a fourth cell converter according to embodiment 1 of the present invention.

FIG. 15 is a schematic circuit diagram of a power conversion device including fourth cell converters.

As shown in FIG. 15, the fourth cell converter 41 has a three-phase bridge configuration having the capacitor 2 and three bridge circuits 13a, 13b, 13c in each of which the upper arm 12a and the lower arm 12b are connected via the intermediate terminal Y, and has two DC terminals X1, X2 and three AC terminals X3, X4, X5 as external terminals.

Two fourth cell converters 41 are connected via a three-phase transformer 40 on the AC side, to form one isolated DC-DC converter, and a plurality of the isolated DC-DC converters are connected via the DC terminals X1, X2 serving as input/output terminals.

It is noted that the configuration of each bridge circuit 13a to 13c of the fourth cell converter 41 is the same as the bridge circuit of the conversion circuit 10 shown in FIG. 1. The fourth cell converter 41 is applicable to a power conversion device of high-voltage DC-DC conversion type, and used for HVDC, for example.

The fourth cell converter 41 is obtained by newly adding one bridge circuit 13c and the AC terminal X5 therefor to the circuit configuration of the third cell converter 31 having a full-bridge configuration described above. Therefore, the fourth cell converter 41 can be realized by additionally providing components of the switching elements 1, the capacitor 2, and the external stacked conductor for the bridge circuit 13c, in the component arrangement of the third cell converter 31A shown in FIG. 13. The added components are the same as the components for the bridge circuits 13a, 13b, but the connection conductors 14A, 15A respectively connect the positive electrodes and connect the negative electrodes of three divided capacitors 2.

It is noted that the fourth cell converter 41 can be realized in the same manner also by additionally providing components of the switching elements 1, the capacitor 2, and the external stacked conductor for the bridge circuit 13c, in the component arrangement of the third cell converter 31B shown in FIG. 14. Also in this case, the connection conductors 14B, 15B respectively connect the positive electrodes and connect the negative electrodes of three divided capacitors 2.

Also in the component arrangement of the fourth cell converter 41, all the effects obtained by the conversion circuits 10A, 10B described above are provided. In addition, input/output current flowing between the adjacent fourth cell converters 41 flows equally through the three bridge circuits 13a to 13c, and thus currents flowing through the switching elements 1 in the fourth cell converter 41 can be further equalized. In addition, since a three-phase bridge configuration is used, output power can be further increased.

Thus, output voltage and output current can be effectively increased with one three-phase-bridge fourth cell converter 41. Therefore, by connecting a plurality of isolated DC-DC converters using the fourth cell converters 41 to configure a power conversion device of high-voltage DC-DC conversion type, the number of connected isolated DC-DC converters can be decreased, and thus large-power output can be achieved with a small-size and inexpensive device configuration.

Embodiment 2

Next, embodiment 2 of the present invention will be described.

Figure 16:
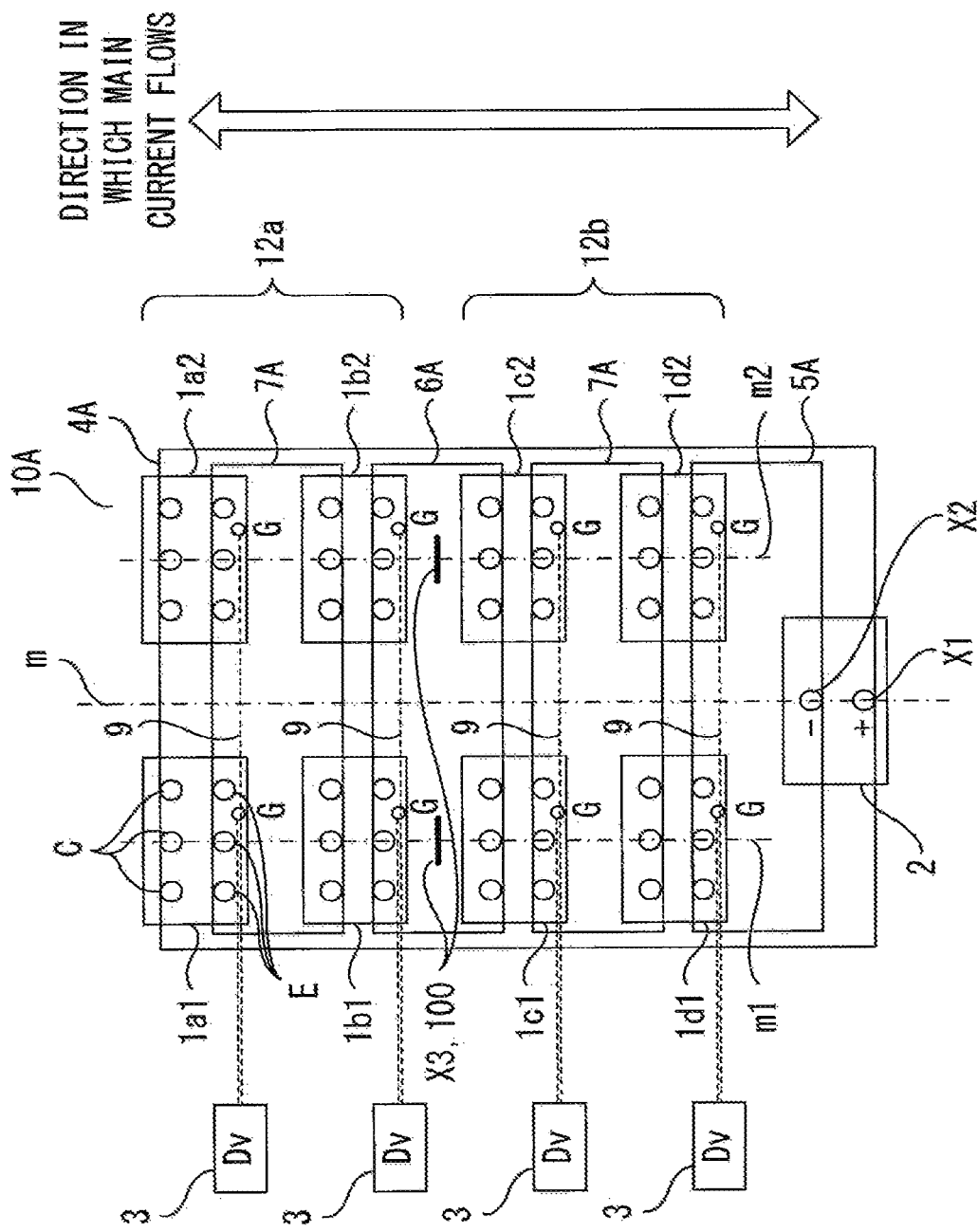
FIG. 16 is a diagram showing component arrangement in a conversion circuit according to embodiment 2 of the present invention.

FIG. 16 is a diagram showing component arrangement in a conversion circuit according to embodiment 2 of the present invention. As shown in FIG. 16, arrangement of the gate driving circuits 3 and the gate wiring lines 9 is added in the component arrangement of the conversion circuit 10A shown in FIG. 2 in the above embodiment 1.

The manner of main current flowing in the conversion circuit 10A is as described in the above embodiment 1, and the direction in which the main current flows is the up-down direction in the drawing.

The gate driving circuits 3 are provided outward of a side surface of a planar area of the external stacked conductor formed by the P conductor 4A, the N conductor 5A, the AC conductor 6A, and the two intermediate conductors 7A.

For the switching elements 1a1, 1a2, the switching elements 1b1, 1b2, the switching elements 1c1, 1c2, and the switching elements 1d1, 1d2 which are used in two-parallel form, one gate driving circuit 3 is connected per two parallel switching elements. One terminal of the gate wiring line 9 is connected to a terminal (gate terminal G) of each gate electrode of the switching elements 1 used in two-parallel form. The gate wiring line 9 is led from the gate terminal G outward of the planar area of the external stacked conductor, so as to be connected to the gate driving circuit 3. In this case, the gate wiring lines 9 respectively connected to the switching elements 1 used in parallel are bundled and connected to one gate driving circuit 3.

In the present embodiment, it is possible to reduce influence of electromagnetic induction caused by flow of main current in the conversion circuit 10A, on the gate voltage signals outputted from the gate driving circuits 3 to the gate wiring lines 9. Thus, the gate voltage signals to the switching elements 1 used in parallel can be equalized, and variations in currents flowing through the switching elements 1 can be effectively suppressed. Therefore, output voltage and output current can be increased.

It is desirable that the gate wiring line 9 is led perpendicularly to the center line m from the gate terminal G outward of the planar area of the external stacked conductor. However, an effect of equalizing the gate voltage signals is obtained as long as the direction in which the gate wiring line 9 is led is a direction crossing the center line m.

Other than the conversion circuit 10A, the present embodiment 2 is also applicable to all the conversion circuits 10, 20 and the first to fourth cell converters 11 to 41 shown in the above embodiment 1.

Embodiment 3

Next, embodiment 3 of the present invention will be described.

The above embodiment 1 has described the component arrangement in the conversion circuit in which the upper arm 12a and the lower arm 12b are provided adjacently to each other and the capacitor 2 is provided on the outer side of one of the upper arm 12a and the lower arm 12b. In the present embodiment, the capacitor 2 is provided between the upper arm 12a and the lower arm 12b.

Figure 17:
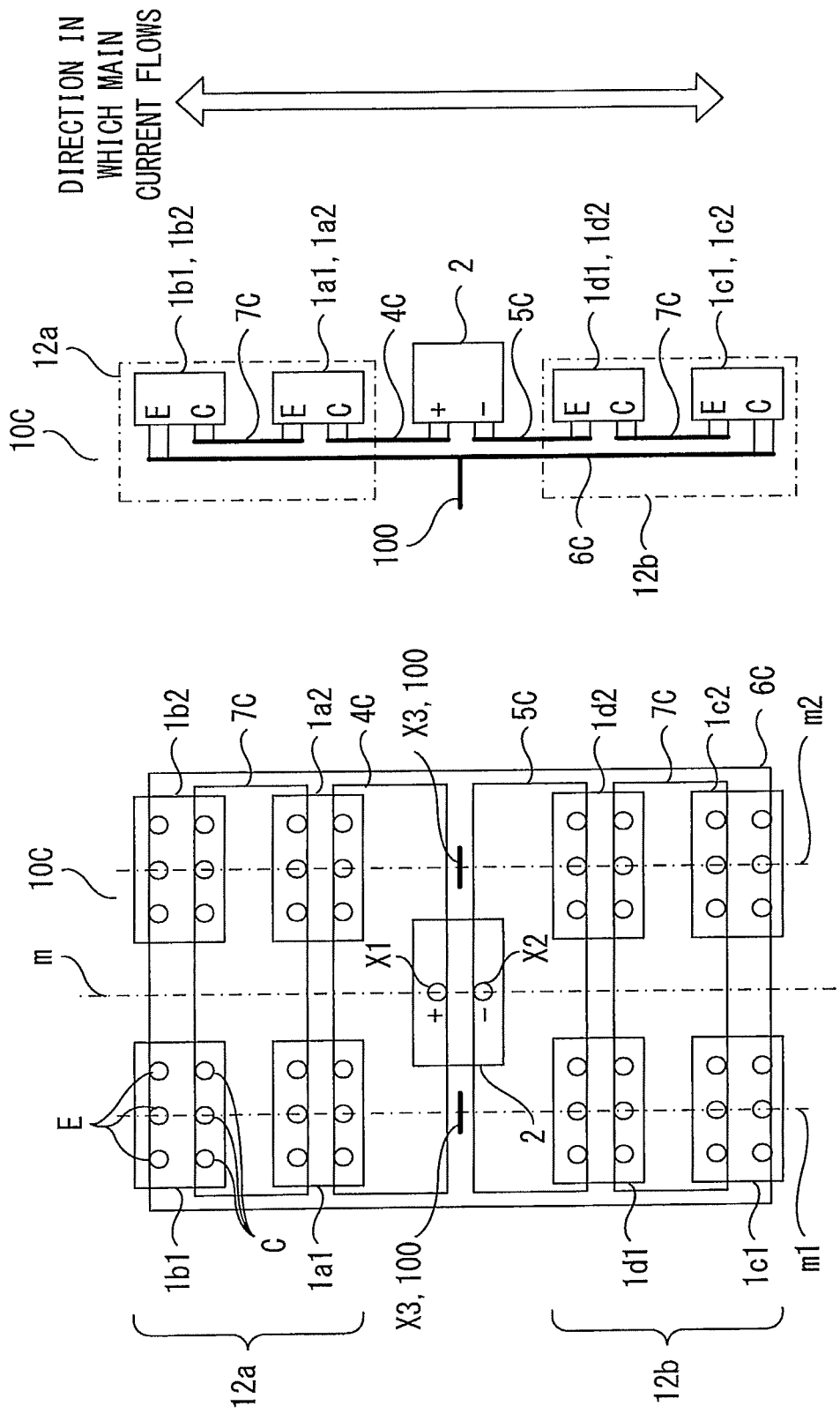
FIG. 17 is a diagram showing component arrangement a conversion circuit according to embodiment 3 of the present invention.

FIG. 17 is a diagram showing component arrangement in a conversion circuit according to embodiment 3 of the present invention, and shows component arrangement in the conversion circuit 10 shown in FIG. 1. FIG. 17 shows a plan view on the left side and a side view on the right side.

It is noted that a conversion circuit 10C is obtained by realizing the conversion circuit 10 shown in FIG. 1 using the component arrangement shown in FIG. 17. In addition, a P conductor 4C, an N conductor 5C, an AC conductor 6C, and two intermediate conductors 7C are components realized as the P wiring line 4, the N wiring line 5, the AC wiring line 6, and the intermediate wiring lines 7.

As shown in FIG. 17, the upper arm 12a and the lower arm 12b are placed such that the upper arm 12a is on the upper side in the drawing, and the capacitor 2 is placed between the upper arm 12a and the lower arm 12b.

In FIG. 17, in light of the positional relationship between the upper arm 12a and the lower arm 12b, the side where the upper arm 12a is placed is referred to as upper side, and the side where the lower arm 12b is placed is referred to as lower side.

The switching elements 1 are used in two-parallel form for each pair, and in the switching element array of the switching elements 1a1 to 1d1, the switching elements 1b1, 1a1, 1d1, 1c1 are arranged in this order from the upper side such that the negative terminals E are on the upper side and the positive terminals C are on the lower side. In addition, in the switching element array of the switching elements 1a2 to 1d2, the switching elements 1b2, 1a2, 1d2, 1c2 are arranged in this order from the upper side such that the negative terminals E are on the upper side and the positive terminals C are on the lower side. The capacitor 2 is placed between the upper arm 12a and the lower arm 12b. The capacitor 2 is placed such that the positive electrode is on the upper side.

The external stacked conductor is formed by the P conductor 4C, the N conductor 5C, the AC conductor 6C, and the two intermediate conductors 7C, and is stacked in two layers.

In a first layer closest to the switching elements 1, the P conductor 4C, the N conductor 5C, and the intermediate conductors 7C are placed at the same height. The positive electrode of the capacitor 2 and the positive terminals C of the switching elements 1a1, 1a2 are connected by the P conductor 4C, the negative electrode of the capacitor 2 and the negative terminals E of the switching elements 1d1, 1d2 are connected by the N conductor 5C, the negative terminals E of the switching elements 1a1, 1a2 and the positive terminals C of the switching elements 1b1, 1b2 are connected by the intermediate conductor 7C, and the negative terminals E of the switching elements 1c1, 1c2 and the positive terminals C of the switching elements 1d1, 1d2 are connected by the intermediate conductor 7C.

The AC conductor 6C is placed in a second layer which is provided above the first layer with an insulating material (not shown) therebetween and which is positioned at the minimum height that does not cause a problem in terms of insulation from the first layer. The negative terminals E of the switching elements 1b1, 1b2 and the positive terminals C of the switching elements 1c1, 1c2 are connected by the AC conductor 6C.

The external stacked conductor formed in two layers has a structure symmetric with respect to the center line m in the surface direction. With respect to the center line m, the switching elements 1b1, 1a1, 1d1, 1c1 are arranged on the left side in the drawing, and the switching elements 1b2, 1a2, 1d2, 1c2 are arranged on the right side in the drawing, so as to be positioned equally on the left and right sides, and the middle lines m1, m2 of the switching element arrays of 1a1 to 1d1 and 1a2 to 1d2 are parallel to the center line m. That is, the switching element array of 1a1 to 1d1 and the switching element array of 1a2 to 1d2 are each provided in one line parallel to the center line m, and the two switching element arrays of 1a1 to 1d1 and 1a2 to 1d2 are provided symmetrically with respect to the center line m.

At the AC conductor 6C through which main current is inputted and outputted, conductor members of the external connection terminals 100 serving as the AC terminal X3 are respectively provided on the middle lines m1, m2 of the switching element arrays of 1a1 to 1d1 and 1a2 to 1d2. That is, the external connection terminals 100 are also provided symmetrically with respect to the center line m of the external stacked conductor.

In the conversion circuit 10C configured as described above, main current in the forward direction flows from the capacitor 2 through the P conductor 4C, the switching elements 1a1, 1a2, the intermediate conductor 7C, the switching elements 1b1, 1b2, then to the AC conductor 6C.

Main current in the reverse direction flows from the AC conductor 6C through the switching elements 1c1, 1c2, the intermediate conductor 7C, the switching elements 1d1, 1d2, the N conductor 5C, then to the capacitor 2.

Therefore, the direction in which main current flows is the up-down direction, and also is the same as the direction (up-down direction) indicating the mutual positional relationship between the positive terminals C and the negative terminals E of the respective switching elements 1, and also is the same as the direction of the center line m of the external stacked conductor.

In the present embodiment 3, since the capacitor 2 is provided between the upper arm element group (upper arm 12a) and the lower arm element group (lower arm 12b), currents flowing through the switching elements 1 can be equalized irrespective of the capacitor 2.

The external stacked conductor has a two-layer configuration having two different height levels of the first layer in which the P conductor 4C, the N conductor 5C, and the intermediate conductors 7C are placed at the same height level, and the second layer in which the AC conductor 6C is placed. Therefore, the configuration of the external stacked conductor can be downsized, and the configuration of the conversion circuit 10C in which the capacitor 2 is provided between the upper arm 12a and the lower arm 12b can be reliably realized.

Also in the conversion circuit 10C, the same effect as in the case of the conversion circuit 10A described above is obtained. That is, currents flowing through the switching elements 1 connected in series and parallel can be equalized, whereby the rated output voltage and the rated output current can be increased efficiently, and the conversion circuit 10C capable of high-voltage and large-current output can be obtained.

Since large power is achieved by one conversion circuit 10C, large-power application can be achieved with a small-size and inexpensive device configuration.

Next, a power conversion device in which a plurality of cell converters adopting the component arrangement of the conversion circuit 10C described above are connected in cascade, will be described.

Figure 18:
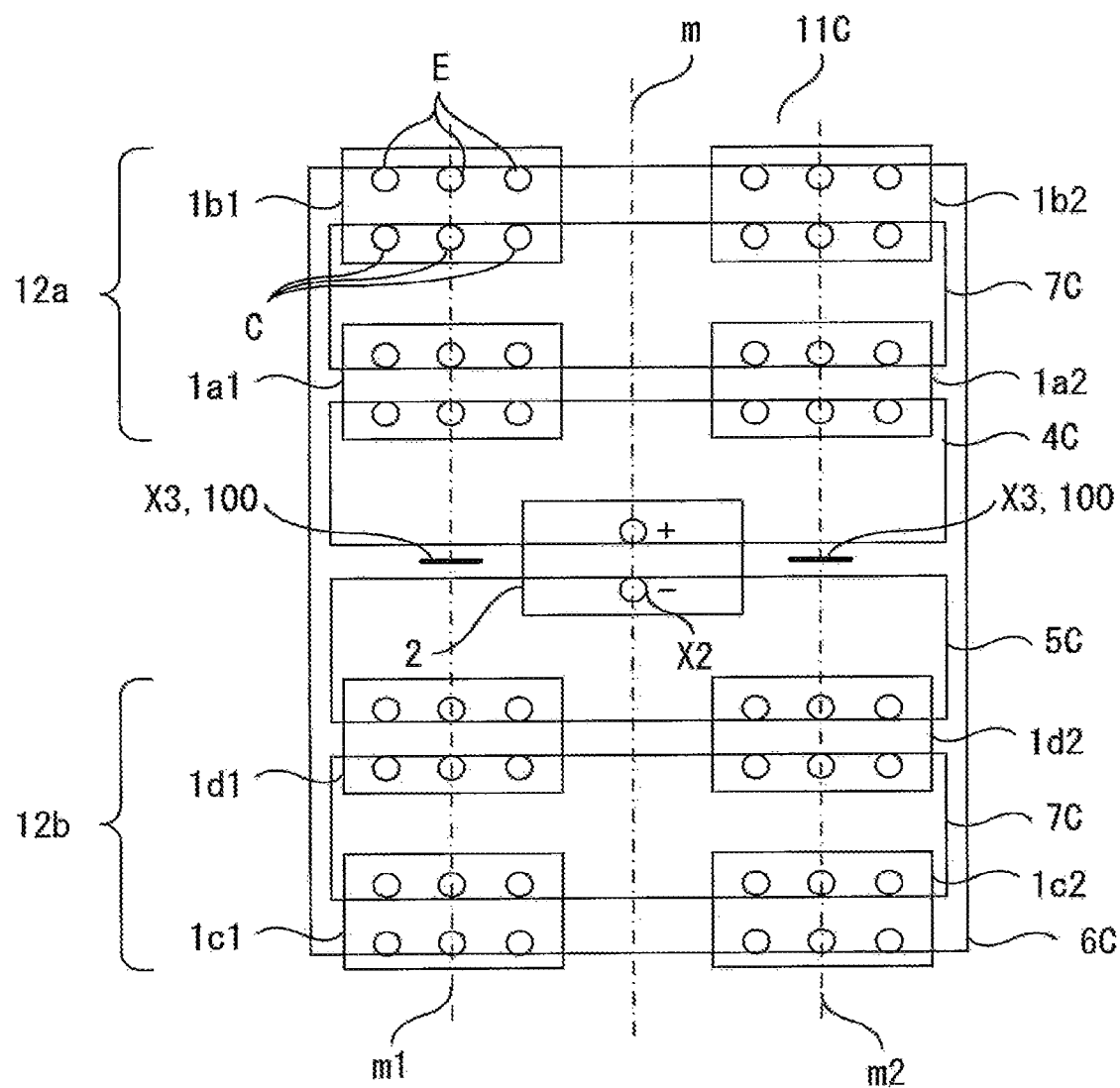
FIG. 18 is a diagram showing component arrangement in a first cell converter according to embodiment 3 of the present invention.

FIG. 18 is a plan view showing component arrangement in another example of the first cell converter 11 shown in FIG. 6. It is noted that a first cell converter 11C is obtained by realizing the first cell converter 11 shown in FIG. 6 using the component arrangement shown in FIG. 18. In this case, as compared to the conversion circuit 10C shown in FIG. 17, the first cell converter 11C is different only in that the positive electrode of the capacitor 2 is not used as the external terminal (DC terminal X1), and is the same in arrangement of the switching elements 1 and the capacitor 2 and arrangement of the external stacked conductor. Therefore, the manner of main current flowing through the first cell converter 11C is the same as main current in the conversion circuit 10C.

Thus, the first cell converter 11C has all the effects obtained by the conversion circuit 10C described above, that is, currents flowing through the switching elements 1 can be equalized, and output voltage and output current can be effectively increased with one first cell converter 11C. Therefore, by connecting a plurality of the first cell converters 11C in cascade to configure a power conversion device of MMC circuit type, the number of connected first cell 11C can be decreased, and thus large-power output can be achieved with a small-size and inexpensive device configuration.

Figure 19:
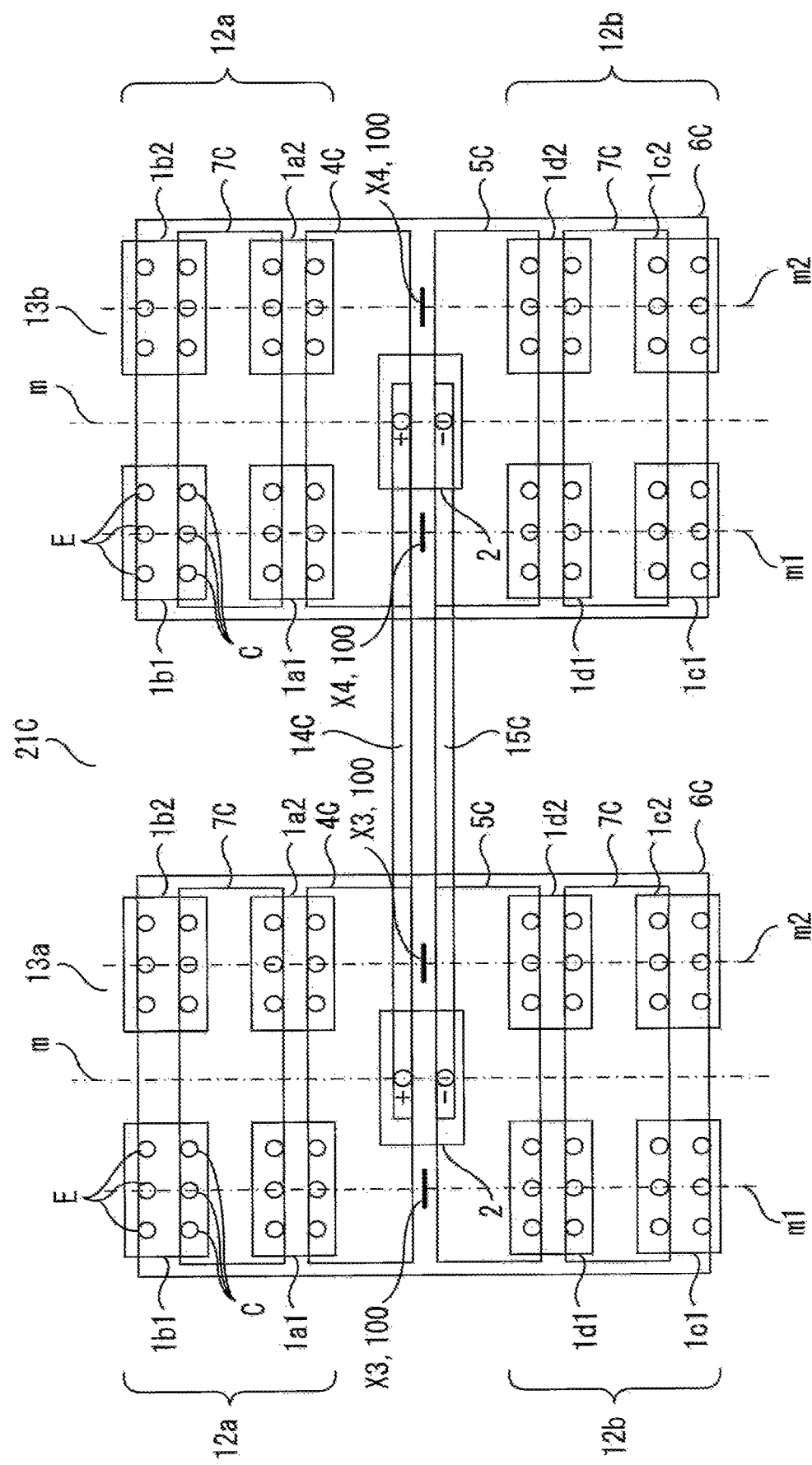
FIG. 19 is a diagram showing component arrangement in a second cell converter according to embodiment 3 of the present invention.

FIG. 19 is a plan view showing component arrangement in another example of the second cell converter 21 shown in FIG. 9. It is noted that a second cell converter 21C is obtained by realizing the second cell converter 21 shown in FIG. 9 using the component arrangement shown in FIG. 19. In this case, in the second cell converter 21C, two conversion circuits 10C shown in FIG. 17 are arranged side by side. The capacitor 2 is provided so as to be divided into two, and the divided capacitors 2 are individually connected to the two bridge circuits 13a, 13b by external stacked conductors. The positive electrodes of the two capacitors 2 provided in a divided manner are connected to each other via a connection conductor 14C, and the negative electrodes thereof are connected to each other via a connection conductor 15C. On the bridge circuit 13a side, the external connection terminals 100 provided to the AC conductor 6C are used as the AC terminal X3, and on the bridge circuit 13b side, the external connection terminals 100 provided to the AC conductor 6C are used as the AC terminal X4.

The second cell converter 21C is configured such that two conversion circuits 10C described above are arranged in parallel, and the manner of main current flowing through each bridge circuit 13a, 13b of the second cell converter 21C is also the same as main current in the conversion circuit 10C.

Thus, the second cell converter 21C has all the effects obtained by the conversion circuit 10C, that is, currents flowing through the switching elements 1 can be equalized, and output voltage and output current can be effectively increased with one full-bridge second cell converter 21C. Therefore, by connecting a plurality of the second cell converters 21C in cascade to configure a power conversion device of MMC circuit type, the number of connected second cell converters 21C can be decreased, and thus large-power output can be achieved with a small-size and inexpensive device configuration.

Figure 20:
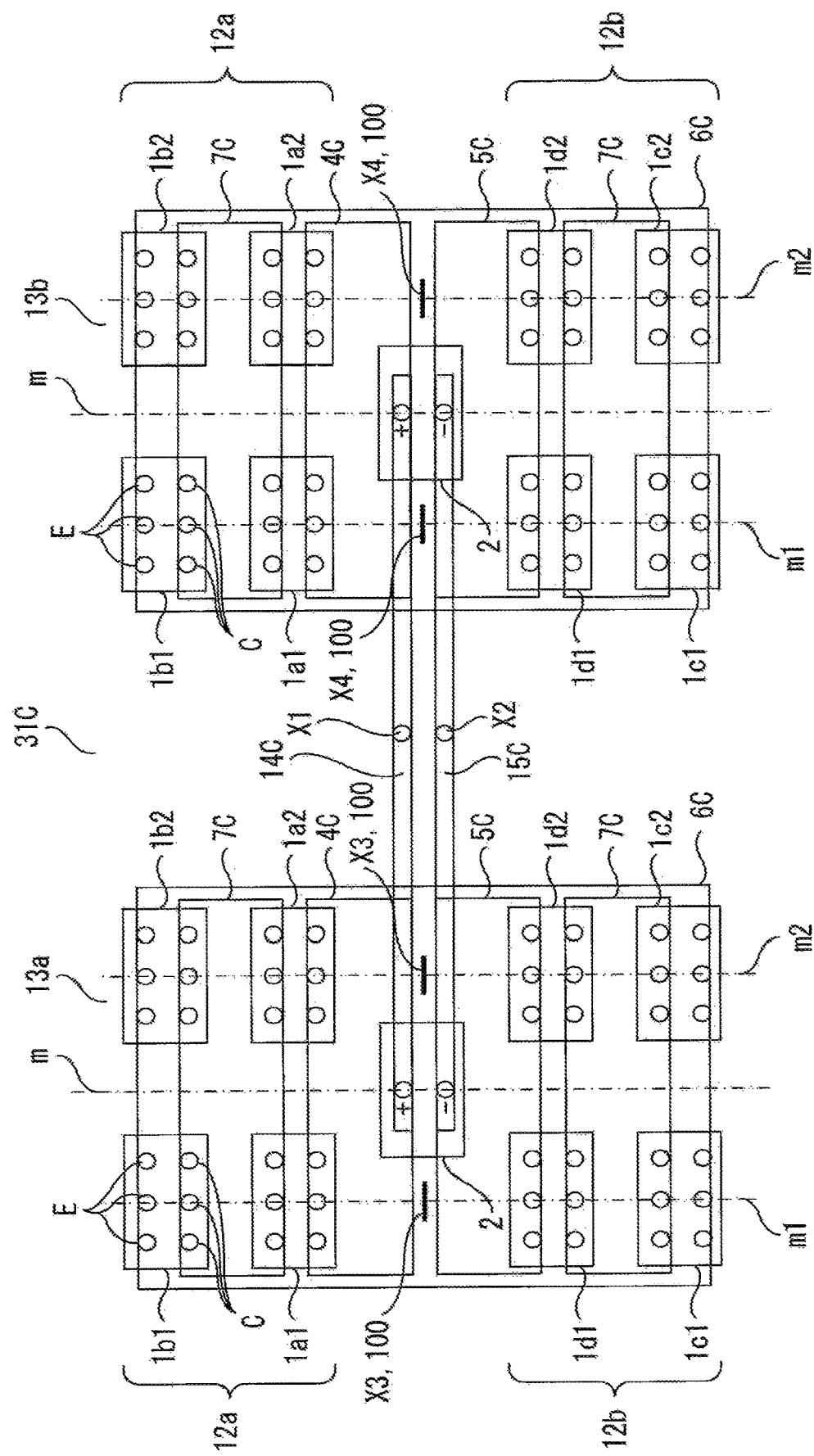
FIG. 20 is diagram showing component arrangement in a third cell converter according to embodiment 3 of the present invention.

FIG. 20 is a plan view showing component arrangement in another example of the third cell converter 31 shown in FIG. 12. It is noted that a third cell converter 31C is obtained by realizing the third cell converter 31 shown in FIG. 12 using the component arrangement shown in FIG. 20. In this case, the third cell converter 31C is the same as the second cell converter 21C shown in FIG. 19 except that the DC terminals X1, X2 are provided. The DC terminal X1 is provided at the middle of the connection conductor 14C connecting the positive electrodes of the two capacitors 2, and the DC terminal X2 is provided at the middle of the connection conductor 15C connecting the negative electrodes of the two capacitors 2.

As in the case of the second cell converter 21C, the third cell converter 31C also has all the effects obtained by the conversion circuit 10C, that is, currents flowing through the switching elements 1 can be equalized. In addition, since the DC terminals X1, X2 are provided at the middle of the connection conductors 14C, 15C, input/output current flowing between each third cell converter 31C and the adjacent third cell converter 31C flows equally through the two bridge circuits 13a, 13b, and thus currents flowing through the switching elements 1 in the third cell converter 31C can be further equalized.

Thus, output voltage and output current can be effectively increased with one full-bridge third cell converter 31C. Therefore, by connecting a plurality of isolated DC-DC converters using the third cell converters 31C to configure a power conversion device of high-voltage DC-DC conversion type, the number of connected isolated DC-DC converters can be decreased, and large-power output can be achieved with a small-size and inexpensive device configuration.

Also in the present embodiment 3, the configuration in which the capacitor 2 is provided between the upper arm 12a and the lower arm 12b is applicable to the fourth cell converter 41 having a three-phase bridge configuration as shown in FIG. 15, whereby output voltage and output current can be further increased.

Embodiment 4

Next, embodiment 4 of the present invention will be described.

Figure 21:
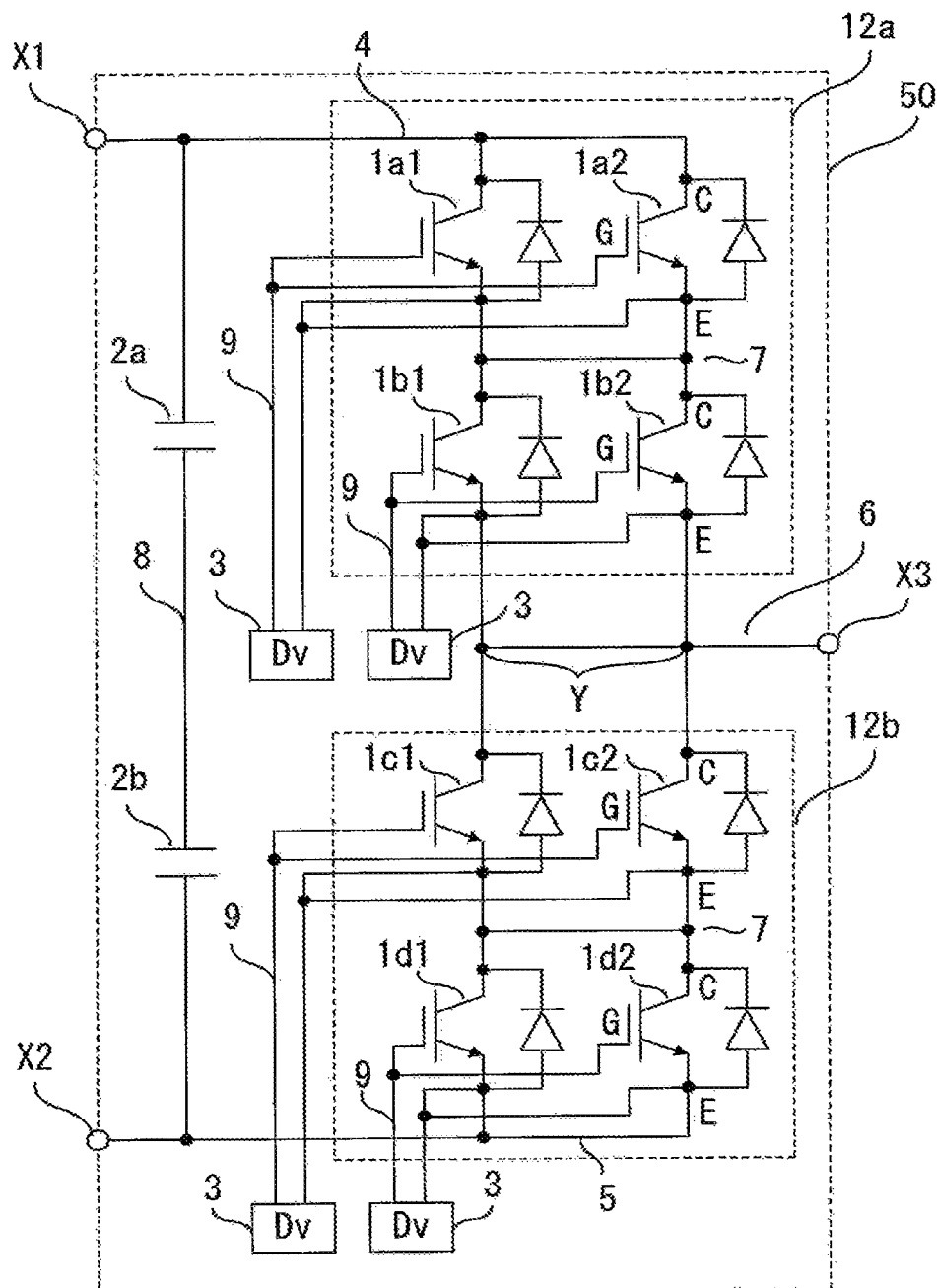
FIG. 21 is a circuit diagram showing a conversion circuit according to embodiment 4 of the present invention.

FIG. 21 is a circuit diagram showing a conversion circuit in a power conversion device according to embodiment 4 of the present invention. As shown in FIG. 21, a conversion circuit 50 has two capacitors 2a, 2b connected in series via a capacitor wiring line 8. The other configurations are the same as those of the conversion circuit 10 shown in FIG. 1. In this case, two capacitors 2a, 2b each having a rated voltage that is half the rated voltage of the capacitor 2 shown in embodiment 1 are used.

In the conversion circuit 50, a P wiring line 4, an N wiring line 5, an AC wiring line 6, intermediate wiring lines 7, a capacitor wiring line 8, and gate wiring lines 9 are provided. The P wiring line 4 connects the positive electrode of the capacitor 2a connected to the DC terminal X1, and the positive terminals C of the switching elements 1a1, 1a2. The N wiring line 5 connects the negative electrode of the capacitor 2b connected to the DC terminal X2, and the negative terminals E of the switching elements 1d1, 1d2. The capacitor wiring line 8 connects the negative electrode of the capacitor 2a and the positive electrode of the capacitor 2b. The AC wiring line 6, the intermediate wiring lines 7, and the gate wiring lines 9 are the same as those in the conversion circuit 10.

Figure 22:
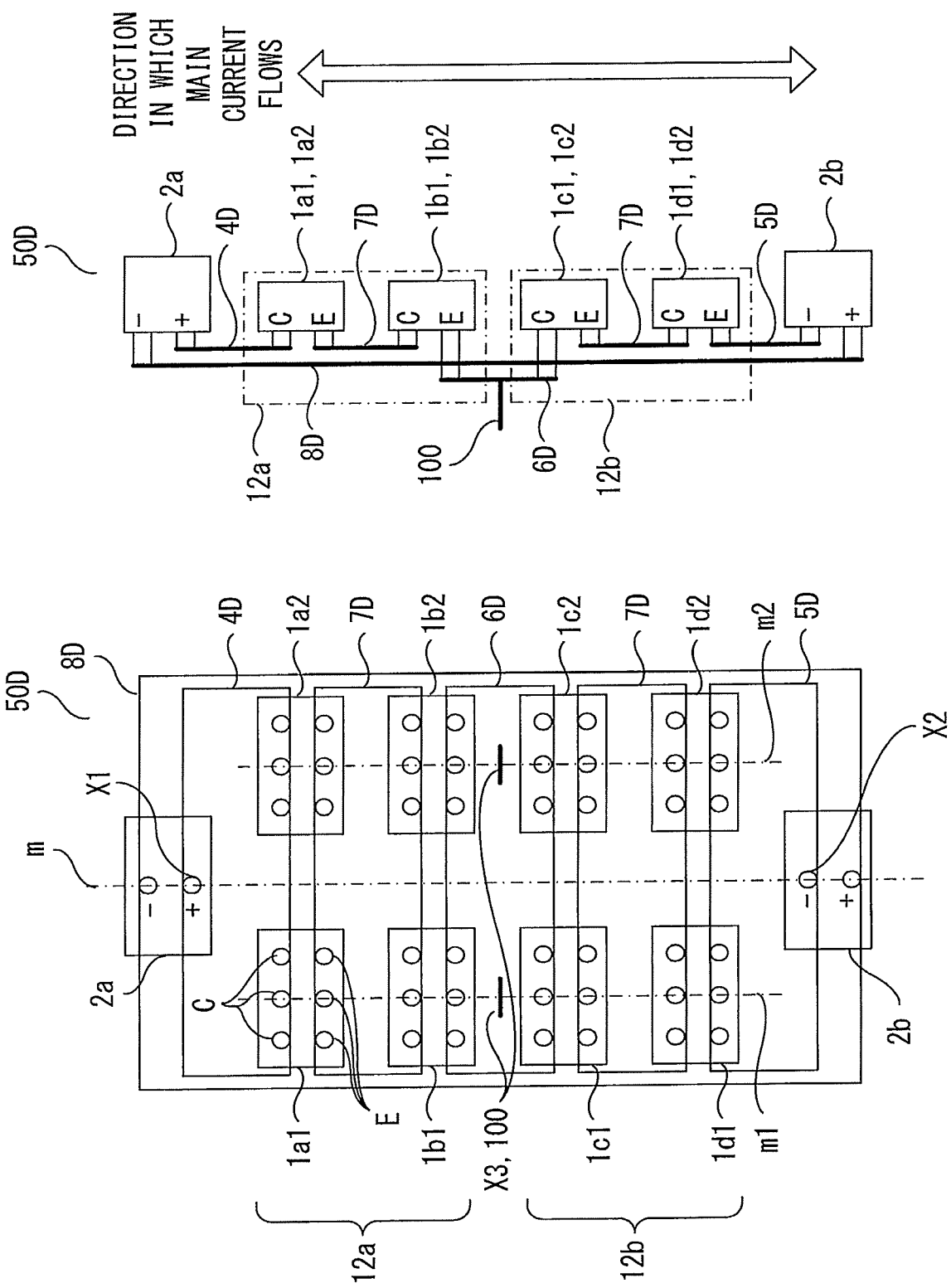
FIG. 22 is a diagram showing component arrangement in the conversion circuit according to embodiment 4 of the present invention.

FIG. 22 is a diagram showing component arrangement in the conversion circuit according to embodiment 4 of the present invention, and shows component arrangement in the conversion circuit 50 shown in FIG. 21. FIG. 22 shows a plan view on the left side and a side view on the right side.

It is noted that a conversion circuit 50D is obtained by realizing the conversion circuit 50 shown in FIG. 21 using the component arrangement shown in FIG. 22. In addition, a P conductor 4D, an N conductor 5D, an AC conductor 6D, two intermediate conductors 7D, and a capacitor conductor 8D are components realized as the P wiring line 4, the N wiring line 5, the AC wiring line 6, the intermediate wiring lines 7, and the capacitor wiring line 8.

As shown in FIG. 22, the upper arm 12a and the lower arm 12b are provided adjacently to each other such that the upper arm 12a is on the upper side in the drawing, the capacitor 2a is provided on the upper side of the upper arm 12a, and the capacitor 2b is provided on the lower side of the lower arm 12b. That is, the capacitors 2a, 2b are provided in a divided manner in the direction of the center line m such that the upper arm 12a and the lower arm 12b are located therebetween.

The switching elements 1 are used in two-parallel form for each pair, and in the switching element array of the switching elements 1a1 to 1d1, the switching elements 1a1, 1b1, 1c1, 1d1 are arranged in this order from the upper side such that the positive terminals C are on the upper side and the negative terminals E are on the lower side. In addition, in the switching element array of the switching elements 1a2 to 1d2, the switching elements 1a2, 1b2, 1c2, 1d2 are arranged in this order from the upper side such that the positive terminals C are on the upper side and the negative terminals E are the lower side. The capacitor 2a is placed on the upper side of the upper arm 12a such that the negative electrode is on the upper side, and the capacitor 2b is placed on the lower side of the lower arm 12b such that the negative electrode is on the upper side.

The external stacked conductor is formed by the P conductor 4D, the N conductor 5D, the AC conductor 6D, the two intermediate conductors 7D, and the capacitor conductor 8D, and is stacked in three layers.

In a first layer closest to the switching elements 1, the P conductor 4D, the N conductor 5D, and the intermediate conductors 7D are placed at the same height. The positive electrode of the capacitor 2a and the positive terminals C of the switching elements 1a1, 1a2 are connected by the P conductor 4D, the negative electrode of the capacitor 2b and the negative terminals of E of the switching elements 1d1, 1d2 are connected by the N conductor 5D, the negative terminals E of the switching elements 1a1, 1a2 and the positive terminals C of the switching elements 1b1, 1b2 are connected by the intermediate conductor 7D, and the negative terminals E of the switching elements 1c1, 1c2 and the positive terminals C of the switching elements 1d1, 1d2 are connected by the intermediate conductor 7D.

The capacitor conductor 8D is placed in a second layer which is provided above the first layer with an insulating material (not shown) therebetween and which is positioned at the minimum height that does not cause a problem in terms of insulation from the first layer. The negative electrode of the capacitor 2a and the positive electrode of the capacitor 2b are connected by the capacitor conductor 8D.

The AC conductor 6D is placed in a third layer which is provided above the second layer with an insulating material (not shown) therebetween and which is positioned at the minimum height that does not cause a problem in terms of insulation from the second layer. The negative terminals E of the switching elements 1b1, 1b2 and the positive terminals C of the switching elements 1c1, 1c2 are connected by the AC conductor 6D.

The external stacked conductor formed in three layers has a structure symmetric with respect to the center line m in the surface direction. With respect to the center line m, the switching elements 1a1, 1b1, 1c1, 1d1 are arranged on the left side in the drawing, and the switching elements 1a2, 1b2, 1c2, 1d2 are arranged on the right side in the drawing, so as to be positioned equally on the left and right sides, and the middle lines m1, m2 of the switching element arrays of 1a1 to 1d1 and 1a2 to 1d2 are parallel to the center line m. That is, the switching element array of 1a1 to 1d1 and the switching element array of 1a2 to 1d2 are each provided in one line parallel to the center line m, and the two switching element arrays of 1a1 to 1d1 and 1a2 to 1d2 are provided symmetrically with respect to the center line m.

At the AC conductor 6D through which main current is inputted and outputted, conductor members of the external connection terminals 100 serving as the AC terminal X3 are respectively provided on the middle lines m1, m2 of the switching element arrays of 1a1 to 1d1 and 1a2 to 1d2. That is, the external connection terminals 100 are also provided symmetrically with respect to the center line m of the external stacked conductor.

In the conversion circuit 50D configured as described above, main current in the forward direction flows from the capacitor 2b through the capacitor 2a, the P conductor 4D, the switching elements 1a1, 1a2, the intermediate conductor 7D, the switching elements 1b1, 1b2, then to the AC conductor 6D. Main current in the reverse direction flows from the AC conductor 6D through the switching elements 1c1, 1c2, the intermediate conductor 7D, the switching elements 1d1, 1d2, the N conductor 5D, the capacitor 2b, then to the capacitor 2a.

Therefore, the direction in which main current flows is the up-down direction, and also is the same as the direction (up-down direction) indicating the mutual positional relationship between the positive terminals C and the negative terminals E of the respective switching elements 1, and also is the same as the direction of the center line m of the external stacked conductor.

In the present embodiment 4, the upper arm element group (upper arm 12a) and the lower arm element group (lower arm 12b) are provided adjacently to each other, and the capacitors 2a, 2b connected in series are provided in a divided manner in the center line direction such that the upper arm 12a and the lower arm 12b are located therebetween. Therefore, currents flowing through the switching elements 1 can be equalized irrespective of the capacitors 2a, 2b.

The external stacked conductor has a three-layer configuration having three different height levels of the first layer in which the P conductor 4D, the N conductor 5D, and the intermediate conductor 7D are placed at the same height level, the second layer in which the capacitor conductor 8D is placed, and the third layer in which the AC conductor 6D is placed. Therefore, it is possible to reliably realize the configuration of the conversion circuit 50D in which the upper arm 12a and the lower arm 12b are provided adjacently to each other and the capacitors 2a, 2b are provided in a divided manner such that the upper arm 12a and the lower arm 12b are located therebetween.

Also in the conversion circuit 50D, the same effect as in the case of the conversion circuit 10A described above is obtained. That is, currents flowing through the switching elements 1 connected in series and parallel can be equalized, whereby the rated output voltage and the rated output current can be increased efficiently, and the conversion circuit 50D capable of high-voltage and large-current output can be obtained.

Since large power is achieved by one conversion circuit 50D, large-power application can be achieved with a small-size and inexpensive device configuration.

Next, a power conversion device in which a plurality of cell converters adopting the component arrangement of the conversion circuit 50D described above are connected in cascade, will be described.

Figure 23:
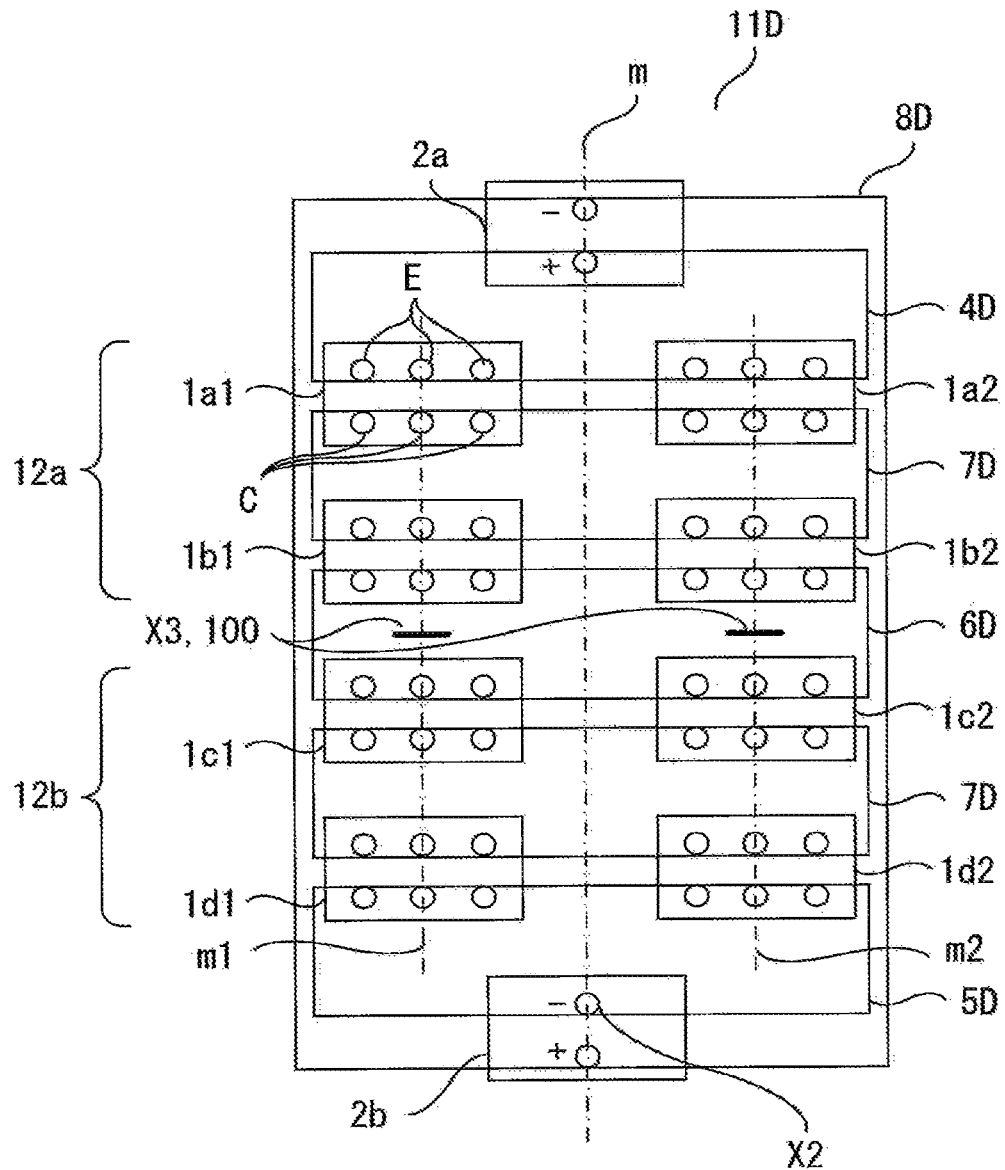
FIG. 23 is a diagram showing component arrangement in a first cell converter according to embodiment 4 of the present invention.

FIG. 23 is a plan view showing component arrangement in another example of the first cell converter 11 shown in FIG. 6. It is noted that first cell converter 11D is obtained by realizing the first cell converter 11 shown in FIG. 6 using the component arrangement shown in FIG. 23. In this case, as compared to the conversion circuit 50D shown in FIG. 22, the first cell converter 11D is different only in that the positive electrode of the capacitor 2a is not used as the external terminal (DC terminal X1), and is the same in arrangement of the switching elements 1 and the capacitors 2a, 2b and arrangement of the external stacked conductor. Therefore, the manner of main current flowing through the first cell converter 11D is also the same as main current in the conversion circuit 50D.

Thus, the first cell converter 11D has all the effects obtained by the conversion circuit 50D described above, that is, currents flowing through the switching elements 1 can be equalized, and output voltage and output current can be effectively increased with one first cell converter 11D. Therefore, by connecting a plurality of first cell converters 11D in cascade to configure a power conversion device of MMC circuit type, the number of connected first cell converters 11D can be decreased, and thus large-power output can be achieved with a small-size and inexpensive device configuration.

Figure 24:
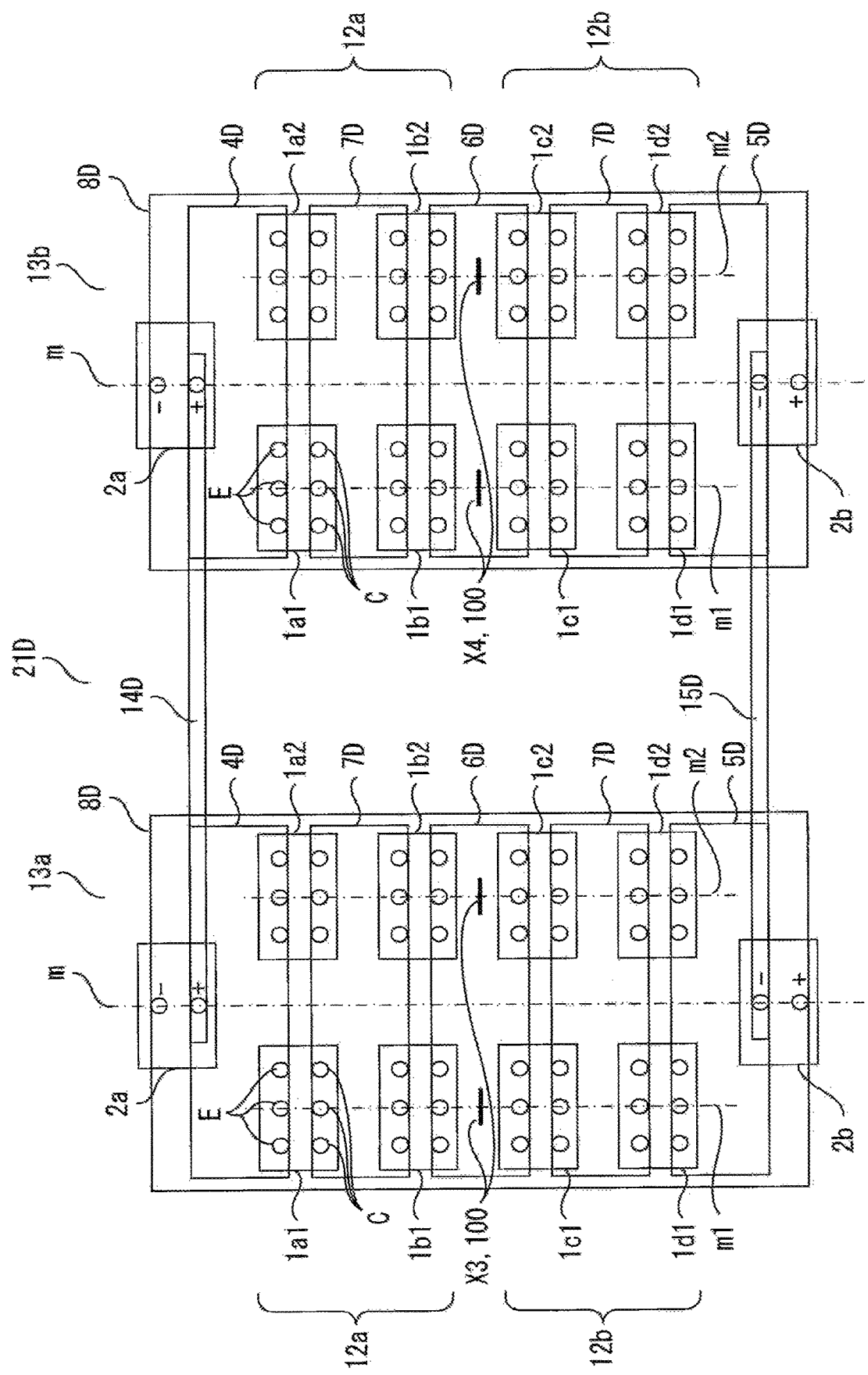
FIG. 24 is a diagram showing component arrangement in a second cell converter according to embodiment 4 of the present invention.

FIG. 24 is a plan view showing component arrangement in another example of the second cell converter 21 shown in FIG. 9. It is noted that a second cell converter 21D is obtained by realizing the second cell converter 21 shown in FIG. 9 using the component arrangement shown in FIG. 24. In this case, in the second cell converters 21D, two conversion circuits 50D shown in FIG. 22 are arranged side by side. The capacitors 2a, 2b are each provided as two divided capacitors, and are individually connected to the two bridge circuits 13a, 13b by external stacked conductors. The positive electrodes of the two capacitors 2a provided in a divided manner are connected to each other via a connection conductor 14D, and the negative electrodes of the two capacitors 2b provided in a divided manner are connected via a connection conductor 15D. On the bridge circuit 13a side, the external connection terminals 100 provided to the AC conductor 6D are used as the AC terminal X3, and on the bridge circuit 13b side, the external connection terminals 100 provided to the AC conductor 6D are used as the AC terminal X4.

The second cell converter 21D is configured such that two conversion circuits 50D described above are arranged in parallel, and the manner of main current flowing in each bridge circuit 13a, 13b of the second cell converter 21D is also the same as main current in the conversion circuit 50D.

Thus, the second cell converter 21D has all the effects obtained by the conversion circuit 50D, that is, currents flowing through the switching elements 1 can be equalized, and output voltage and output current can be effectively increased with one full-bridge second cell converter 21D. Therefore, by connecting a plurality of second cell converters 21D in cascade to configure a power conversion device of MMC circuit type, the number of connected second cell converters 21D can be decreased, and thus large-power output can be achieved with a small-size and inexpensive device configuration.

Figure 25:
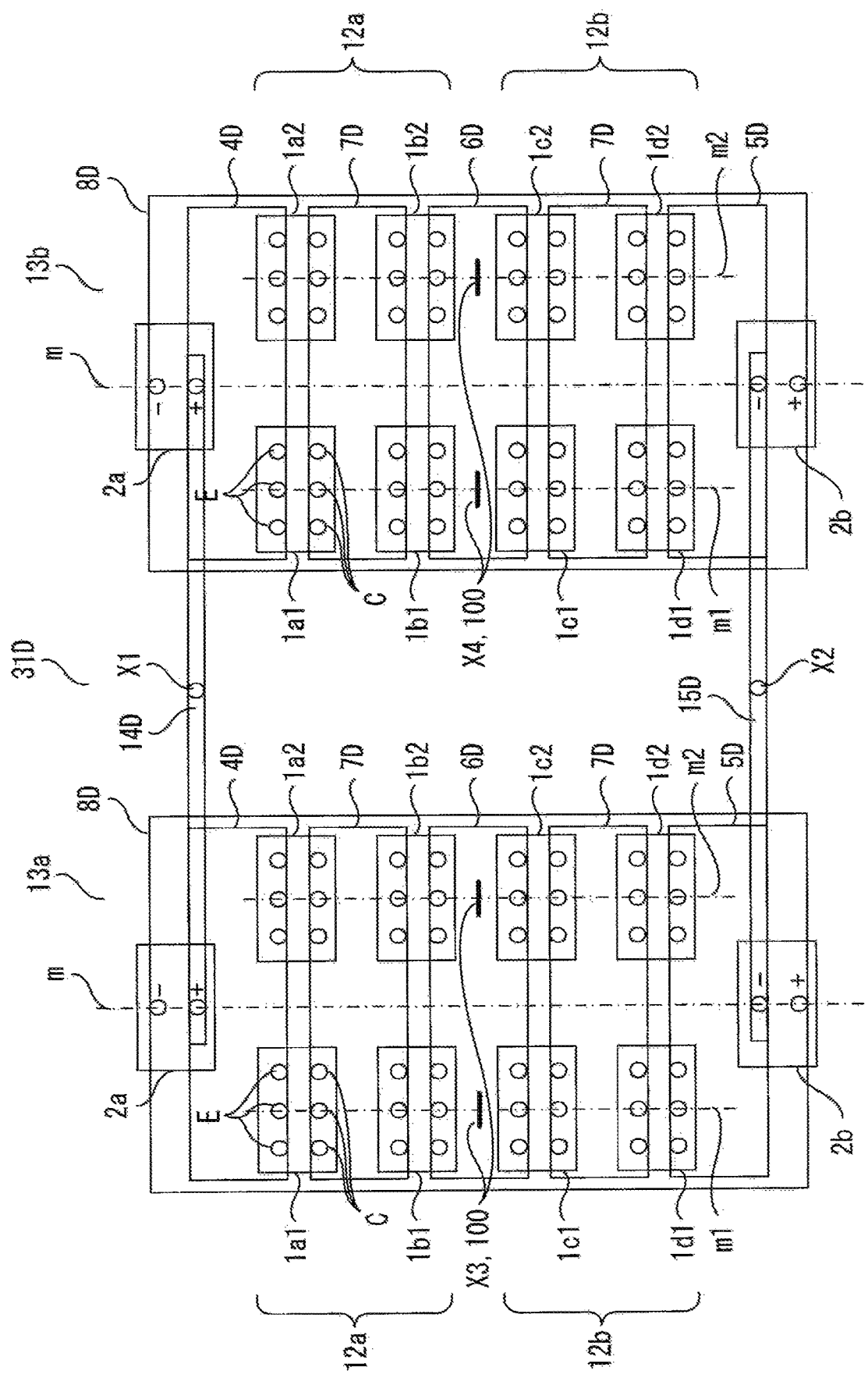
FIG. 25 is a diagram showing component arrangement in a third cell converter according to embodiment 4 of the present invention.

FIG. 25 is a plan view showing component arrangement in another example of the third cell converter 31 shown in FIG. 12. It is noted that a third cell converter 31D is obtained by realizing the third cell converter 31 shown in FIG. 12 using the component arrangement shown in FIG. 25. In this case, the third cell converter 31D is the same as the second cell converter 21D shown in FIG. 24 except that the DC terminals X1, X2 are provided. The DC terminal X1 is provided at the middle of the connection conductor 14D connecting the positive electrodes of the two capacitors 2a, and the DC terminal X2 is provided at the middle of the connection conductor 15D connecting the negative electrodes of the two capacitors 2b.

As in the case of the second cell converter 21D, the third cell converter 31D also has all the effects obtained by the conversion circuit 50D, that is, currents flowing through the switching elements 1 can be equalized. In addition, since the DC terminals X1, X2 are provided at the middle of the connection conductors 14D, 15D, input/output current flowing between each third cell converter 31D and the adjacent third cell converter 31D flows equally through the two bridge circuits 13a, 13b, and thus currents flowing through the switching elements 1 in the third cell converter 31D can be further equalized.

Thus, output voltage and output current can be effectively increased with one full-bridge third cell converter 31D. Therefore, by connecting a plurality of isolated DC-DC converters using the third cell converters 31D to configure a power conversion device of high-voltage DC-DC conversion type, the number of connected isolated DC-DC converters can be decreased, and large-power output can be achieved with a small-size and inexpensive device configuration.

Also in the present embodiment 4, the configuration in which the capacitors 2a, 2b connected in series are provided in a divided manner such that the upper arm 12a and the lower arm 12b are located therebetween, is applicable to the fourth cell converter 41 having a three-phase bridge configuration shown in FIG. 15, whereby output voltage and output current can be further increased.

Embodiment 5

Next, embodiment 5 of the present invention will be described.

Figure 26:
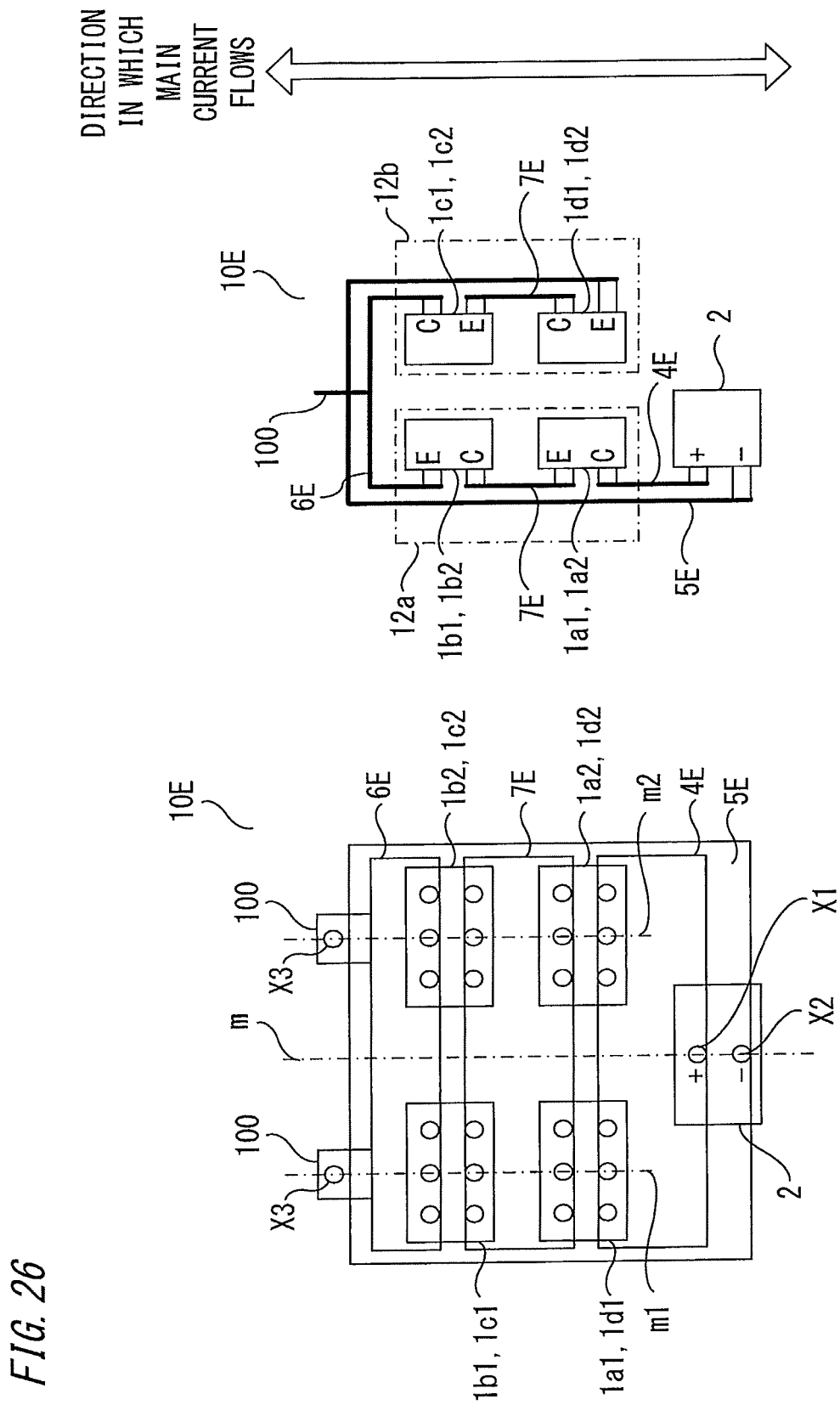
FIG. 26 is a diagram showing component arrangement in a conversion circuit according to embodiment 5 of the present invention.

FIG. 26 is a diagram showing component arrangement of a conversion circuit according to embodiment 5 of the present invention, and shows component arrangement in the conversion circuit 10 shown in FIG. 1. FIG. 26 shows a plan view on the left side and a side view on the right side.

It is noted that a conversion circuit 10E is obtained by realizing the conversion circuit 10 shown in FIG. 1 using the component arrangement shown in FIG. 26. In addition, a P conductor 4E, an N conductor 5E, an AC conductor 6E, and two intermediate conductors 7E are components realized as the P wiring line 4, the N wiring line 5, the AC wiring line 6, and the intermediate wiring lines 7. In addition, as in the above embodiment 1, each switching element 1 has three positive terminals C and three negative terminals E.

As shown in the side view of FIG. 26, the upper arm 12a is placed on the left side in the drawing, and the lower arm 12b is placed on the right side in the drawing, that is, the upper arm 12a and the lower arm 12b are placed in two stages on the upper and lower sides. and the capacitor 2 is placed on the outer side of the upper arm 12a, i.e., the lower side thereof in the drawing.

In FIG. 26, in light of the positional relationship between the upper arm 12a and the lower arm 12b, the side where the upper arm 12a is placed is referred to as upper stage side, and the side where the lower arm 12b is placed is referred to as lower stage side.

The switching elements (1a1, 1a2, 1b1, 1b2) of the upper arm 12a are attached such that the positive terminals C and the negative terminals E thereof all face the upper stage side, and the switching elements (1c1, 1c2, 1d1, 1d2) of the lower arm 12b are attached such that the positive terminals C and the negative terminals E thereof all face the lower stage side. That is, the switching elements (1a1, 1a2, 1b1, 1b2) of the upper arm 12a are provided such that the surfaces thereof face the upper stage side, and the switching elements (1c1, 1c2, 1d1, 1d2) of the lower arm 12b are provided such that the surfaces thereof face the lower stage side. The surface at which the positive electrode and the negative electrode of the capacitor 2 are formed faces in the same direction as the surfaces of the switching elements (1a1, 1a2, 1b1, 1b2) of the upper arm 12a.

Since the switching elements 1 are used in two-parallel form, four switching elements arrays, i.e., the switching element array of 1a1 to 1b1, the switching element array of 1c1 to 1d1, the switching element array of 1a2 to 1b2, and the switching element array of 1c2 to 1d2 are each provided such that the switching elements are arrayed in one line on the respective middle lines m1, m2.

The arrangement directions of the switching elements 1 differ between the upper arm 12a and the lower arm 12b. In the upper arm 12a, the positive terminals C are on the lower side in the drawing, and the negative terminals E are on the upper side in the drawing. In the lower arm 12b, the positive terminals C are on the upper side in the drawing, and the negative terminals E are on the lower side in the drawing. The capacitor 2 is provided such that the positive electrode is on the upper side in the drawing.

Thus, as for the upper arm 12a, in the switching element array of 1a1 to 1b1, the switching elements 1a1, 1b1 are arranged in this order from the lower side such that the positive terminals C are on the lower side in the drawing and the negative terminals E are on the upper side in the drawing. In the switching element array of 1a2 to 1b2, the switching elements 1a2, 1b2 are arranged in this order from the lower side such that the positive terminals C are on the lower side in the drawing and the negative terminals E are on the upper side in the drawing.

As for the lower arm 12b, in the switching element array of 1c1 to 1d1, the switching elements 1c1, 1d1 are arranged in this order from the upper side such that the positive terminals C are on the upper side in the drawing and the negative terminals E are on the lower side in the drawing. In the switching element array of 1c2 to 1d2, the switching elements 1c2, 1d2 are arranged in this order from the lower side such that the positive terminals C are on the upper side in the drawing and the negative terminals E are on the lower side in the drawing.

The external stacked conductor is formed by the P conductor 4E, the N conductor 5E, the AC conductor 6E, and the two intermediate conductors 7E, and is stacked in two layers. In this case, the upper arm 12a and the lower arm 12b are arranged back to back such that the surfaces thereof face outward With respect to each other. Therefore, the external stacked conductor is formed outside so as to surround the upper and lower arms 12a, 12b having the upper-lower two-stage configuration. In addition, the N conductor 5E and the AC conductor 6E each have a U shape.

In a first layer closest to the switching elements 1, in an area parallel to the surfaces of the switching elements 1, the P conductor 4E, the AC conductor 6E, and the intermediate conductors 7E are placed at the same distance from the surfaces of the switching elements 1, i.e., at the same height therefrom.

The positive electrode of the capacitor 2 and the positive terminals C of the switching elements 1a1, 1a2 are connected by the P conductor 4E, and the negative terminals E of the switching elements 1a1, 1a2 and the positive terminals C of the switching elements 1b1, 1b2 are connected by the intermediate conductor 7E. The negative terminals E of the switching elements 1b1, 1b2 and the positive terminals C of the switching elements 1c1, 1c2 are connected by the AC conductor 6E, and the negative terminals E of the switching elements 1c1, 1c2 and the positive terminals C of the switching elements 1d1, 1d2 are connected by the intermediate conductor 7E.

The N conductor 5E is placed in a second layer which provided above the first layer with an insulating material (not shown) therebetween and which is positioned at the minimum height that does not cause a problem in terms of insulation from the first layer. The negative electrode of the capacitor 2 and the negative terminals E of the switching elements 1d1, 1d2 are connected by the N conductor 5E.

The external stacked conductor formed in two layers has a structure symmetric with respect to the center line m in the surface direction. With respect to the center line m, the switching elements 1a1, 1b1, 1c1, 1d1 are arranged on the left side in the drawing, and the switching elements 1a2, 1b2, 1c2, 1d2 are arranged on the right side in the drawing, so as to be positioned equally on the left and right sides, and the middle line m1 of the switching element arrays of 1a1 to 1b1 and 1c1 to 1d1 and the middle line m2 of the switching element arrays of 1a2 to 1b2 and 1c2 to 1d2 are parallel to the center line m. That is, the two switching element arrays of 1a1 to 1b1 and 1a2 to 1b2 are each provided in one line parallel to the center line m, and are provided symmetrically with respect to the center line m. The two switching element arrays of 1c1 to 1d1 and 1c2 to 1d2 are each provided in one line parallel to the center line m, and are provided symmetrically with respect to the center line m. The capacitor 2 is provided on the outer side of the upper arm 12a in the direction of the center line m.

At the AC conductor 6E through which main current is inputted and outputted, conductor members of the external connection terminals 100 serving as the AC terminal X3 are respectively provided on the middle line m1 of the switching element arrays of 1a1 to 1b1 and 1c1 to 1d1 and the middle line m2 of the switching element arrays of 1a2 to 1b2 and 1c2 to 1d2. That is, the external connection terminals 100 are also provided symmetrically with respect to the center line m of the external stacked conductor.

In the conversion circuit 10E configured as described above, main current in the forward direction flows from the capacitor 2 through the P conductor 4E, the switching elements 1a1, 1a2, the intermediate conductor 7E, the switching elements 1b1, 1b2, then to the AC conductor 6E. Main current in the reverse direction flows from the AC conductor 6E through the switching elements 1c1, 1c2, the intermediate conductor 7E, the switching elements 1d1, 1d2, the N conductor 5E, then to the capacitor 2.

Therefore, the direction in which main current flows is the up-down direction in the drawing, and also is the same as the direction (up-down direction) indicating the mutual positional relationship between the positive terminals C and the negative terminals E of the respective switching elements 1, and also is the same as the direction of the center line m of the external stacked conductor.

In the present embodiment 5, the upper arm element group (upper arm 12a) and the lower arm element group (lower arm 12b) are provided in two stages on the upper and lower sides such that the surfaces thereof face in directions opposite (outward) with respect to each other, and the capacitor 2 is provided on the outer side of the upper arm 12a. Therefore, currents flowing through the switching elements 1 can be equalized irrespective of the capacitor 2. In addition, since the upper arm 12a and the lower arm 12b are arranged in two stages, the arrangement area can be reduced.

The external stacked conductor has a two-layer configuration having two different height levels of the first layer in which the P conductor 4E, the AC conductor 6E, and the intermediate conductors 7E are placed at the same height level, and the second layer in which the N conductor 5E is placed. Therefore, the configuration of the external stacked conductor can be downsized, and the configuration of the conversion circuit 10E in which the upper arm 12a and the lower arm 12b are provided in two stages can be reliably realized.

Also in the conversion circuit 10E, the same effect as in the case of the conversion circuit 10A described above is obtained. That is, currents flowing thought the switching elements 1 connected in series and parallel can be equalized, whereby the rated output voltage and the rated output current can be increased efficiently, and the conversion circuit 10E capable of high-voltage and large-current output can be obtained.

In addition, since large power can be achieved by one conversion circuit 10E, large-power application can be achieved with a small-size and inexpensive device configuration. Therefore the same effect as in the case the conversion circuit 10A is obtained also in the power conversion device in which a plurality of cell converters adopting the component arrangement of the conversion circuit 10E are connected in cascade.

In the above embodiment 5, the capacitor 2 is provided on the outer side (in the drawing, on the lower side) of the upper arm 12a. However, the capacitor 2 may be, provided on the outer side (in the drawing, on the lower side) of the lower arm 12b. In this case, the capacitor 2 is provided such that the negative electrode is on the upper side in the drawing, and in the external stacked conductor, the first layer closest to the switching elements 1 is formed by the N conductor 5E, the AC conductor 6E, and the intermediate conductors 7E, and the second layer is formed by the P conductor 4E. Also in this case, the same effect as described above is obtained.

Embodiment 6

Next, embodiment 6 of the present invention will be described.

Figure 27:
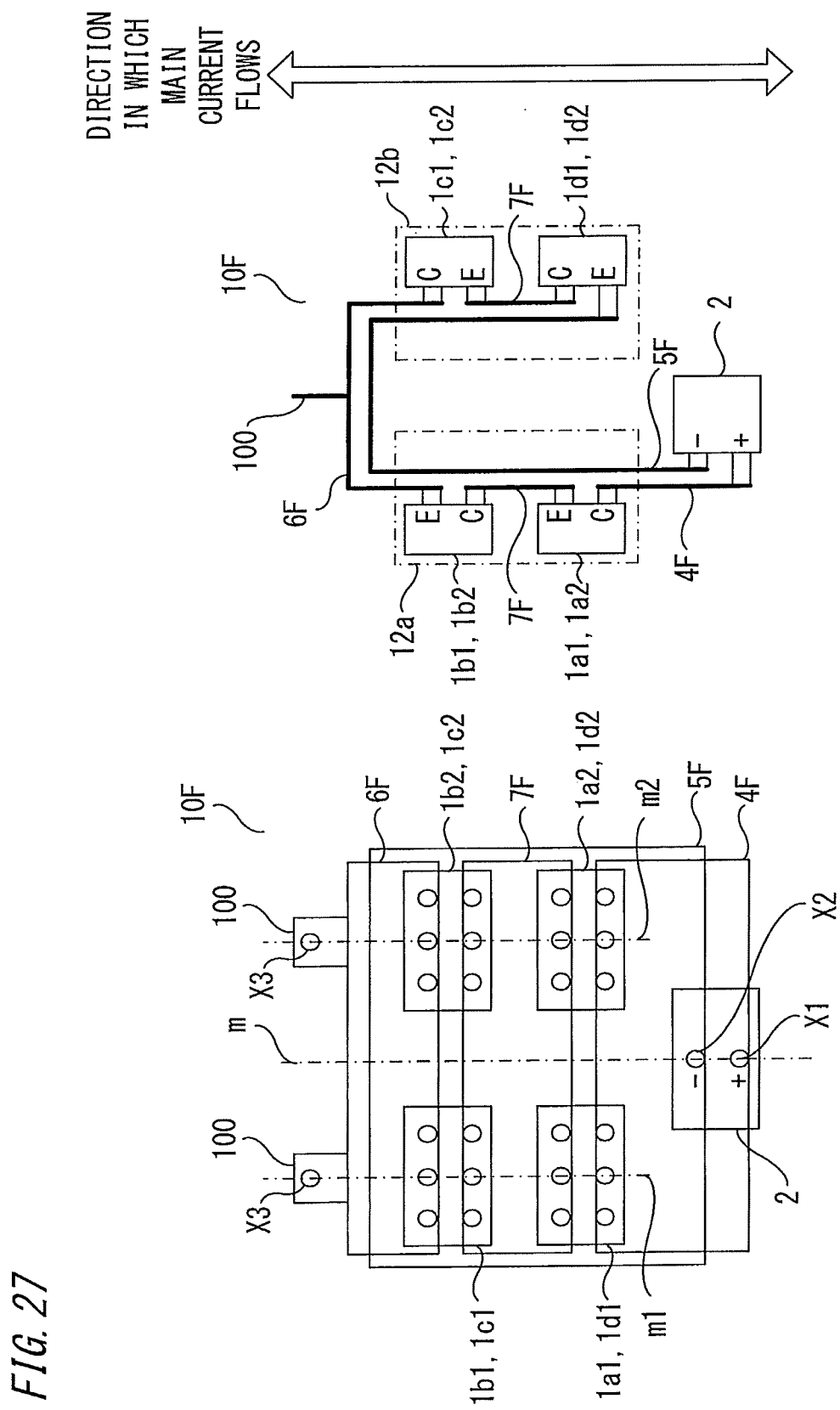
FIG. 27 is a diagram showing component arrangement in a conversion circuit according to embodiment 6 of the present invention.

FIG. 27 is a diagram showing component arrangement of a conversion circuit according to embodiment 6 of the present invention, and shows component arrangement of the conversion circuit 10 shown in FIG. 1. FIG. 27 shows a plan view on the left side and a side view on the right side.

It is noted that a conversion circuit 10F is obtained by realizing the conversion circuit 10 shown in FIG. 1 using the component arrangement shown in FIG. 27. in addition, a P conductor 4F, an N conductor 5F, an AC conductor 6F, and two intermediate conductors 7F are components realized as the P wiring line 4, the N wiring line 5, the AC wiring line 6, and the intermediate wiring lines 7. In this case, each switching element 1 has three positive terminals C and three negative terminals E.

As shown in the side view of FIG. 27, the upper arm 12a is placed on the left side in the drawing, and the lower arm 12b is placed on the right side in the drawing, that is, the upper arm 12a and the lower arm 12b are placed in two stages on the upper and lower sides, and the capacitor 2 is placed on the outer side of the upper arm 12a, i.e., the lower side thereof in the drawing.

In FIG. 27, in light of the positional relationship between the upper arm 12a and the lower arm 12b, the side where the upper arm 12a is placed is referred to as upper stage side, and the side where the lower arm 12b is placed is referred to as lower stage side.

The switching elements (1a1, 1a2, 1b1, 1b2) of the upper arm 12a are attached such that the positive terminals C and the negative terminals E thereof all face the lower stage side, and the switching elements (1c1, 1c2, 1d1, 1d2) of the lower arm 12b are attached such that the positive terminals C and the negative terminals E thereof all face the upper stage side. That is, the switching elements (1a1, 1a2, 1b1, 1b2) of the upper arm 12a are provided such that the surfaces thereof face the lower stage side, and the switching elements (1c1, 1c2, 1d1, 1d2) of the lower arm 12b are provided such that the surfaces thereof face the upper stage side. The surface at which the positive electrode and the negative electrode of the capacitor 2 are formed faces in the direction opposite to the surfaces of the switching elements (1a1, 1a2, 1b1, 1b2) of the upper arm 12a.

Since the switching elements 1 are used in two-parallel form, four switching element arrays, i.e., the switching element array of 1a1 to 1b1, the switching element array of 1c1 to 1d1, the switching element array of 1a2 to 1b2, and the switching element array of 1c2 to 1d2 are each provided such that the switching elements are arrayed in one line on the respective middle lines m1, m2.

The arrangement directions of the switching elements 1 differ between the upper arm 12a and the lower arm 12b. In the upper arm 12a, the positive terminals C are on the lower side in the drawing, and the negative terminals E are on the upper side in the drawing. In the lower arm 12b, the positive terminals C are on the upper side in the drawing, and the negative terminals E are on the lower side in the drawing. The capacitor 2 is provided such that the positive electrode is on the lower side in the drawing.

Thus, as for the upper arm 12a, in the switching element array of 1a1 to 1b1, the switching elements 1a1, 1b1 are arranged in this order from the lower side such that the positive terminals C are on the lower side in the drawing and the negative terminals E are on the upper side in the drawing. In the switching element array of 1a2 to 1b2, the switching elements 1a1, 1b2 are arranged in this order from the lower side such that the positive terminals C are on the lower side in the drawing and the negative terminals E are on the upper side in the drawing.

As for the lower arm 12b, in the switching element array of 1c1 to 1d1, the switching elements 1c1, 1d1 are arranged in this order from the upper side such that the positive terminals C are on the upper side in the drawing and the negative terminals E are on the lower side in the drawing. In the switching element array of 1c2 to 1d2, the switching elements 1c2, 1d2 are arranged in this order from the lower side such that the positive terminals C are on the upper side in the drawing and the negative terminals E are on the lower side in the drawing.

The external stacked conductor is formed by the P conductor 4F, the N conductor 5F, the AC conductor 6F, and the two intermediate conductors 7F, and is stacked in two layers. In this case, the upper arm 12a and the lower arm 12b are arranged back to back such that the surfaces thereof face inward with respect to each other, and the external stacked conductor is provided in the area between the upper arm 12a and the lower arm 12b. In addition, the N conductor 5F and the AC conductor 6F each have a U shape.

In a first layer closest to the switching elements 1, in an area parallel to the surfaces of the switching elements 1, the P conductor 4F, the AC conductor 6F, and the intermediate conductors 7F are placed at the same distance from the surfaces of the switching elements 1, i.e., at the same height therefrom.

The positive electrode of the capacitor 2 and the positive terminals C of the switching elements 1a1, 1a2 are connected by the P conductor 4F, and the negative terminals E of the switching elements 1a1, 1a2 and the positive terminals C of the switching elements 1b1, 1b2 are connected by the intermediate conductor 7F. The negative terminals E of the switching elements 1b1, 1b2 and the positive terminals C of the switching elements 1c1, 1c2 are connected by the AC conductor 6F, and the negative terminals E of the switching elements 1c1, 1c2 and the positive terminals C of the switching elements 1d1, 1d2 are connected by the intermediate conductor 7F.

The N conductor 5F is placed in a second layer which is provided above the first layer with an insulating material (not shown) therebetween and which is positioned at the minimum height that does not cause a problem in terms of insulation from the first layer. The negative electrode of the capacitor 2 and the negative terminals E of the switching elements 1d1, 1d2 are connected by the N conductor 5F.

The external stacked conductor formed in two layers has a structure symmetric with respect to the center line m in the surface direction. With respect to the center line m, the switching elements 1a1, 1b1, 1c1, 1d1 are arranged on the left side in the drawing, and the switching elements 1a2, 1b2, 1c2, 1d2 are arranged on the right side in the drawing, so as to be positioned equally on the left and right sides, and the middle line m1 of the switching element arrays of 1a1 to 1b1 and 1c1 to 1d1 and the middle line m2 of the switching element arrays of 1a2 to 1b2 and 1c2 to 1d2 are parallel to the center line m. That is, the two switching element arrays of 1a1 to 1b1 and 1a2 to 1b2 are each provided in one line parallel to the center line m, and are provided symmetrically with respect to the center line m. The two switching element arrays of 1c1 to 1d1 and 1c2 to 1d2 are each provided in one line parallel to the center line m, and are provided symmetrically with respect to the center line m. The capacitor 2 is provided on the outer side of the upper arm 12a in the center line direction.

At the AC conductor 6F through which main current is inputted and outputted, conductor members of the external connection terminals 100 serving as the AC terminal X3 are respectively provided on the middle line m1 of the switching element arrays of 1a1 to 1b1 and 1c1 to 1d1 and the middle line m2 of the switching element arrays of 1a2 to 1b2 and 1c2 to 1d2. That is, the external connection terminals 100 are also provided symmetrically with respect to the center line m of the external stacked conductor.

In the conversion circuit 10F configured as described above, main current in the forward direction flows from the capacitor 2 through the P conductor 4F, the switching elements 1a1, 1a2, the intermediate conductor 7F, the switching elements 1b1, 1b2, then to the AC conductor 6F. Main current in the reverse direction flows from the AC conductor 6F through the switching elements 1c1, 1c2, the intermediate conductor 7F, the switching elements 1d1, 1d2, the N conductor 5F, then to the capacitor 2.

Therefore the direction in which main current flows is the up-down direction, and also is the same as the direction (up-down direction) indicating the mutual positional relationship between the positive terminals C and the negative terminals E of the respective switching elements 1, and also is the same as the direction of the center line m of the external stacked conductor.

In the present embodiment 6, the upper arm element group (upper arm 12a) and the lower arm element group (lower arm 12b) are provided in two stages on the upper and lower sides such that the surfaces thereof face in directions opposite (inward) with respect to each other, and the capacitor 2 is provided on the outer side of the upper arm 12a. Therefore, currents flowing though the switching elements 1 can be equalized irrespective of the capacitor 2. In addition, since the upper arm 12a and the lower arm 12b are arranged in two stages, the arrangement area can be reduced.

The external stacked conductor has a two-layer configuration having two different height levels of the first layer in which the P conductor 4F, the AC conductor 6F, and the intermediate conductors 7F are placed at the same height level, and the second layer in which the N conductor 5F is placed. Therefore, the configuration of the external stacked conductor can be downsized, and the configuration of the conversion circuit 10F in which the upper arm 12a and the lower arm 12b are provided in two stages can be reliably realized.

Also in the conversion circuit 10F, the same effect as in the case of the conversion circuit 10A described above is obtained. That is, currents flowing through the switching elements 1 connected in series and parallel can be equalized, whereby the rated output voltage and the rated output current can be increased efficiently, and the conversion circuit 10F capable of high-voltage and large-current output can be obtained.

In addition, since large power can be achieved by one conversion circuit 10F, large-power application can be achieved with a small-size and inexpensive device configuration. Therefore, the same effect as in the case of the conversion circuit 10A is obtained also in the power conversion device in which a plurality of cell converters adopting the component arrangement of the conversion circuit 10F are connected in cascade.

Also in the above embodiment 6, the capacitor 2 may be provided on the outer side (in the drawing, on the lower side) of the lower arm 12b. In this case, the capacitor 2 is provided such that the positive electrode is on the upper side in the drawing, and in the external stacked conductor, the first layer closest to the switching elements 1 is formed by the N conductor 5F, the AC conductor 6F, and the intermediate conductors 7F, and the second layer is formed by the P conductor 4F. Also in this case, the same effect as described above is obtained.

Embodiment 7

Next, embodiment 7 of the present invention will be described.

In the present embodiment 7, a power conversion device having a plurality of cell converters connected in cascade, in particular, a joining configuration of the plurality of cell converters will be described.

Figure 28:
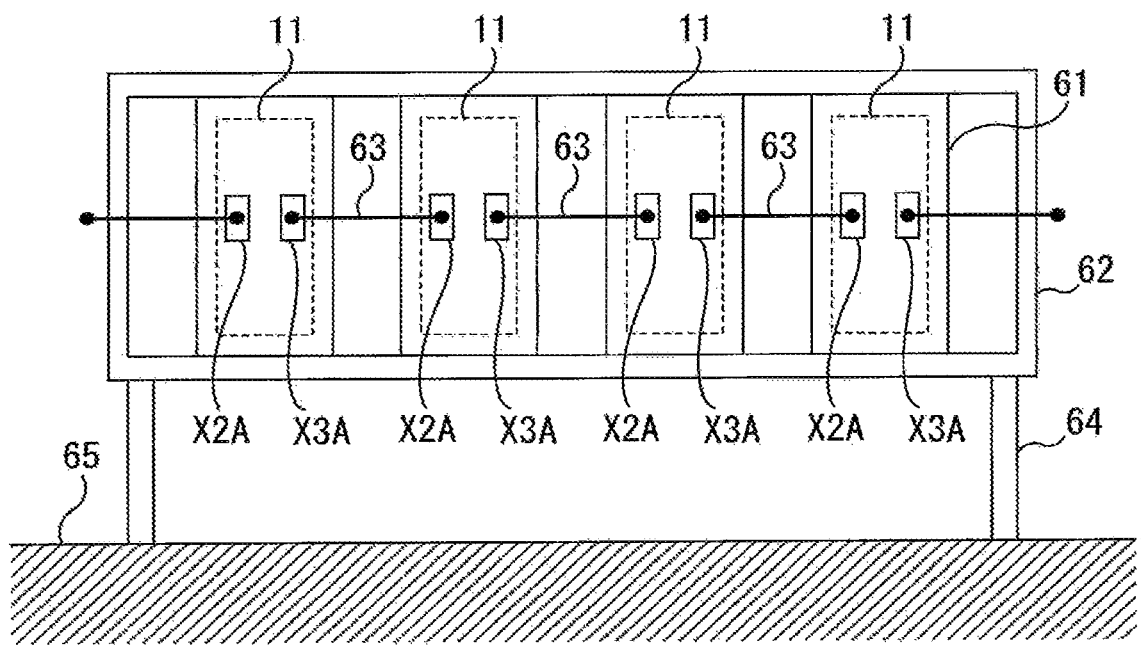
FIG. 28 shows a joining configuration of cell converters according to embodiment 7 of the present invention.

FIG. 28 shows a joining configuration of a plurality of cell converters according to embodiment 7 of the present invention, in which the connection configuration of the first cell converters 11 shown in FIG. 6 is used.

As described above, each first cell converter 11 has a half-bridge configuration having the capacitor 2 and one bridge circuit in which the upper arm 12a and the lower arm 12b are connected, and has two external terminals, i.e., the DC terminal X2 connected to the negative electrode of the capacitor 2, and the AC terminal X3. The plurality of first cell converters 11 are connected in series via the two external terminals X2, X3 (see FIG. 6).

As shown in FIG. 28, each first cell converter 11 is stored in a cell converter housing 61. Each cell converter housing 61 has external connection terminals X2A, X3A for making cascade connection with another cell converter housing 61. Inside each cell converter housing 61, the external connection terminals X2A, X3A are respectively connected to the external terminals X2, X3 of the first cell converter 11.

The plurality of (in this case, four) cell converter housings 61 form a joined body called a valve by their external connection terminals X2A, X3A being connected to each other via external connection conductors 63, and are stored in a housing 62. In this case, the external connection terminal X2A of each cell converter housing 61 is connected to the external connection terminal X3A of another adjacent cell converter housing 61 via the external connection conductor 63.

For the housing 62, an insulating structure 64 is provided to ensure a distance from a reference potential 65 so as to prevent occurrence of electric short-circuit between another reference potential and the highest potential of the first cell converters 11 connected in cascade.

Figure 29:
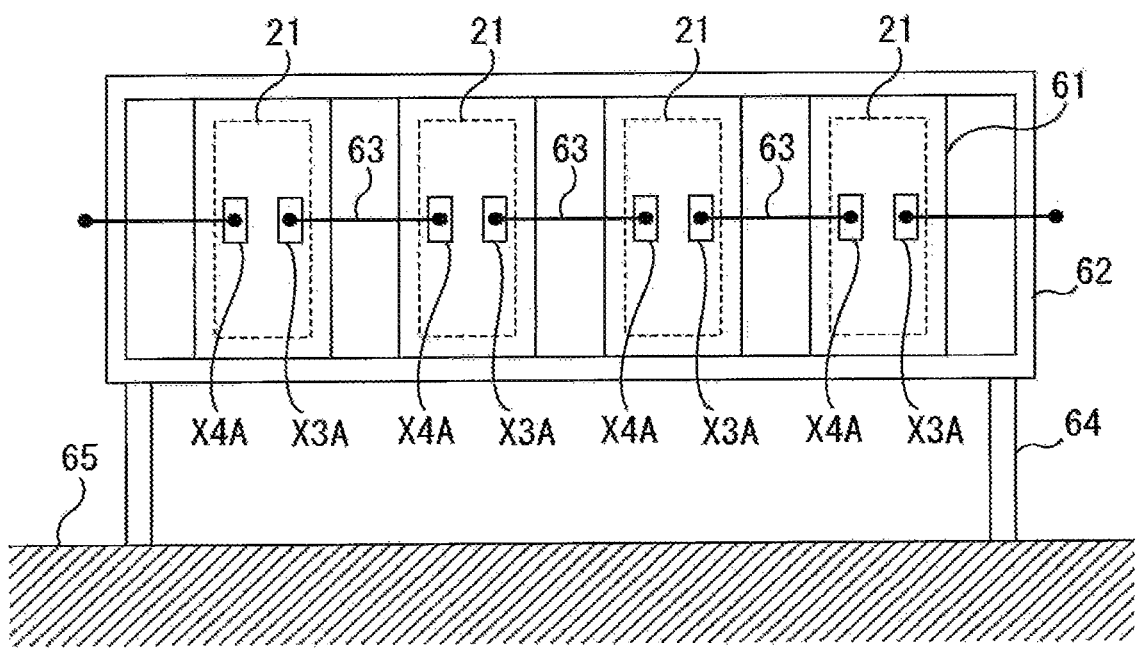
FIG. 29 shows a joining configuration of cell converters in another example of embodiment 7 of the present invention.

FIG. 29 shows another example of a joining configuration of a plurality of cell converters, in which the connection configuration of the second cell converters 21 shown in FIG. 9 is used.

As described above, each second cell converter 21 has a full-bridge configuration having the capacitor 2 and two bridge circuits 13a, 13b in each of which the upper arm 12a and the lower arm 12b are connected, and has two AC terminals X3, X4 as external terminals. Then, the plurality of second cell converters 21 are connected in series via two external terminals X3, X4 (see FIG. 9).

As shown in FIG. 29, each second cell converter 21 is stored in a cell converter housing 61. Each cell converter housing 61 has external connection terminals X3A, X4A for making cascade connection with another cell converter housing 61. Inside each cell converter housing 61, the external connection terminals X3A, X4A are respectively connected to the external terminals X3, X4 of the second cell converter 21.

The plurality of (in this case, four) cell converter housings 61 form a joined body by their external connection terminals X3A, X4A being connected to each other via external connection conductors 63, and are stored in a housing 62. In addition, an insulating structure 64 is provided to ensure a distance between the housing 62 and the reference potential 65.

Figure 30:
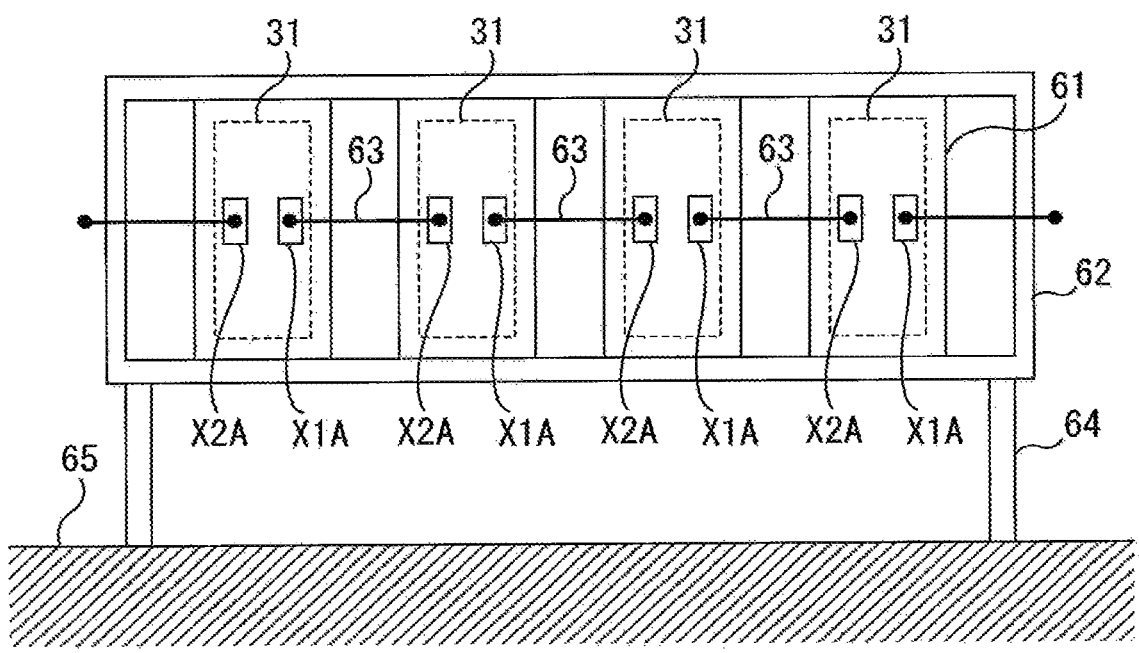
FIG. 30 shows a joining configuration of cell converters in another example of embodiment 7 of the present invention.

FIG. 30 shows still another example of a joining configuration of a plurality of cell converters, in which the connection configuration of the third cell converters 31 shown in FIG. 12 is used.

As described above, each third cell converter 31 has a full-bridge configuration having the capacitor 2 and two bridge circuits 13a, 13b in each of which the upper arm 12a and the lower arm 12b are connected, and has two DC terminals X1, X2 and two AC terminals X3, X4 as external terminals. The plurality of third cell converters 31 are connected in series via two the DC terminals (external terminals) X1, X2. In this case, each third cell converter 31 is connected to another third cell converter 31 via the single-phase transformer 30 on the AC side, to form each isolated DC-DC converter (see FIG. 12).

As shown in FIG. 30, each third cell converter 31 is stored in a cell converter housing 61. Each cell converter housing 61 has external connection terminals X1A, X2A for making cascade connection on the DC side with another cell converter housing 61. Inside each cell converter housing 61, the external connection terminals X1A, X2A are respectively connected to the external terminals X1, X2 of the third cell converter 31.

The plurality of (in this case, four) cell converter housings 61 form a joined body by their external connection terminals X1A, X2A being connected to each other via external connection conductors 63, and are stored in a housing 62. In addition, the insulating structure 64 is provided so as to ensure a distance between the housing 62 and the reference potential 65.

In this case, each cell converter housing 61 has, at its back surface (not shown), two external connection terminals for connecting the two AC terminals X3, X4 of the third cell converter 31 to the single-phase transformer 30, and the two external connection terminals are connected to the single-phase transformer 30 provided outside the housing 62.

Figure 31:
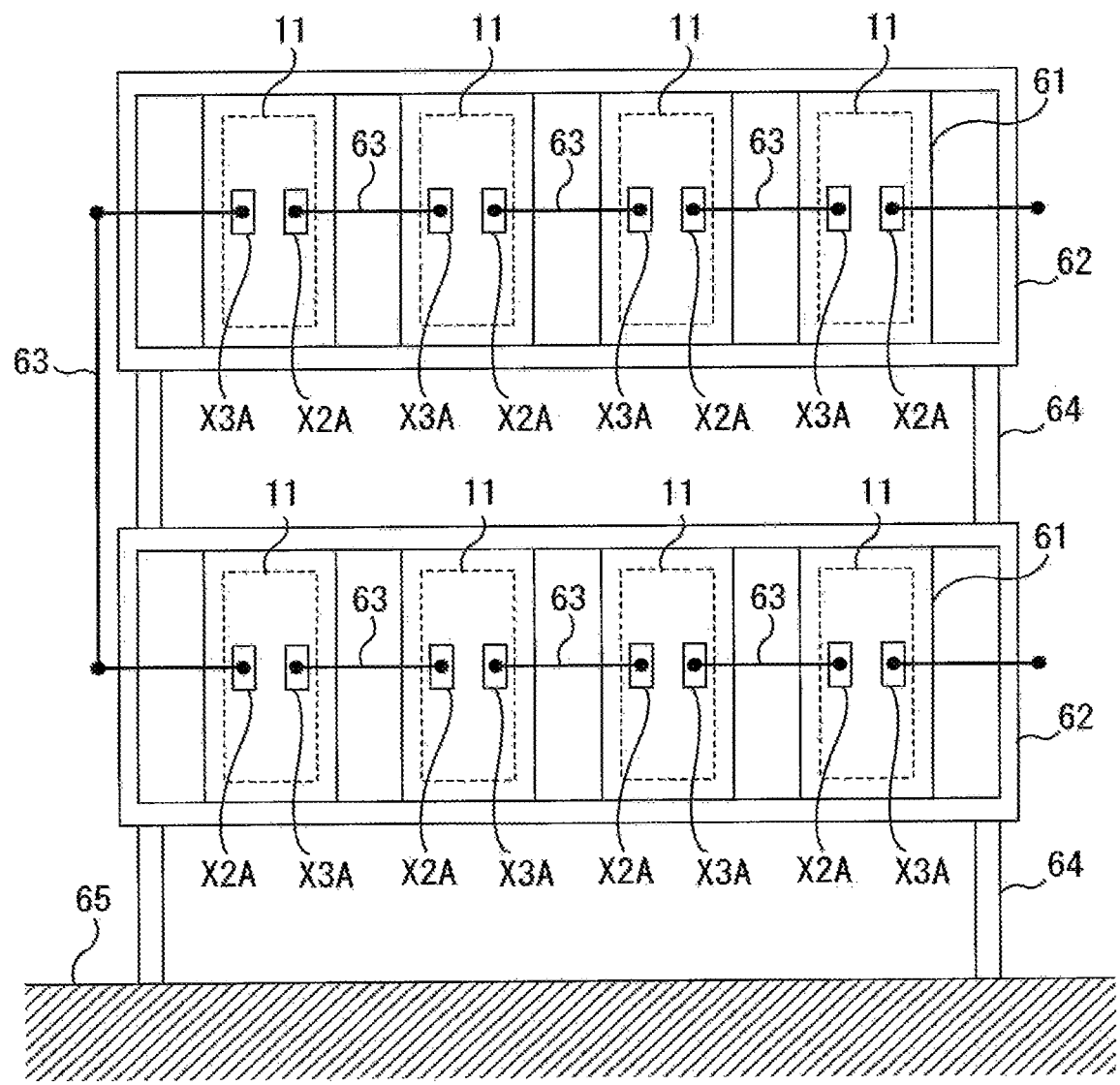
FIG. 31 shows a configuration in which a plurality of joining configurations of cell converters are connected, according to embodiment 7 of the present invention.

FIG. 31 shows a configuration in which a plurality of housings 62 each storing the joining configuration of a plurality of cell converters are connected. In this case, the housing 62 shown. FIG. 28 is used as an example. However, the same applies also for those shown in FIG. 29 and FIG. 30.

As shown in FIG. 31, housings 62 each storing four cell converter housings 61 are stacked in two stages with the insulating structure 64 provided in the vertical direction therebetween. The external connection terminal X3A of the cell converter housing 61 stored at the left end in the drawing inside the housing 62 at the upper stage, and the external connection terminal X2A of the cell converter housing 61 stored at the left end in the drawing inside the housing 62 at the lower stage, are connected by the external connection conductor 63.

In this way, the housings 62 are connected to each other, whereby multiple cell converters 11, 21, 31 can be easily connected in cascade.

Figure 32:
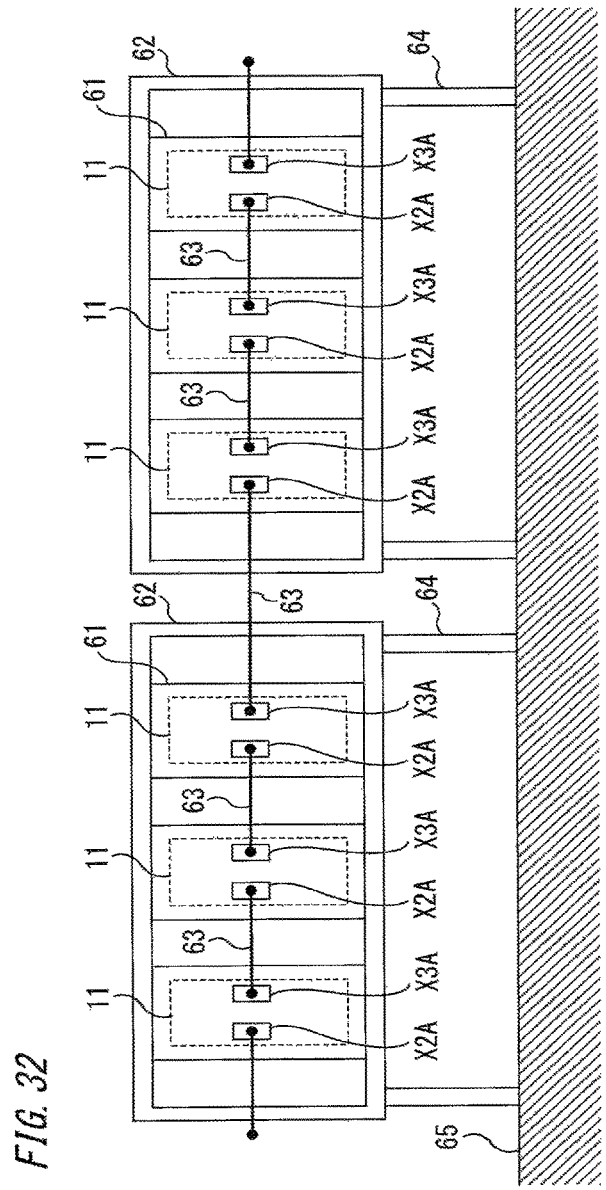
FIG. 32 shows a configuration in which a plurality of joining configurations of cell converters are connected in another example according to embodiment 7 of the present invention.

FIG. 32 shows another example of a configuration in which a plurality of housings 62 each storing the joining configuration of a plurality of cell converters are connected. Also in this case, the housing 62 shown in FIG. 28 is used as an example. However, the same applies also for those shown in FIG. 29 and FIG. 30.

As shown in FIG. 32, two housings 62 each storing three cell converter housings 61 are arranged in the horizontal direction. The external connection terminal X3A of the cell converter housing 61 stored at the right end inside the housing 62 on left side in the drawing, and the external connection terminal X2A of the cell converter housing 61 stored at the left end inside the housing 62 on the right side in the drawing, are connected by the external connection conductor 63.

Also in this case, the housings 62 are connected to each other, whereby multiple cell converters 11, 21,31 can be easily connected in cascade.

As described above, in the present embodiment, each cell converter 11,21,31 is stored in the cell converter housing 61 having the external connection terminals X1A to X4A, and a plurality of the cell converter housings 61 connected via the external connection terminals X1A to X4A are stored in the housing 62 for which insulation from another reference potential is ensured by the insulating structure 64. Thus, in a circuit type in which a plurality of cell converters 11, 21, 31 are connected in cascade, the number of provided cell converters 11, 21 31 can be easily increased, and cascade connection of multiple cell converters 11, 21, 31 can be easily achieved.

In addition, as shown in FIG. 31 and FIG. 32, the housings 62 can be arranged and connected in any of the vertical direction and the horizontal direction, and thus the degree of freedom in designing for cascade connection of multiple cell converters 11, 21, 31 is improved.

It is noted that, within the scope of the present invention, the above embodiments may be freely combined with each other, or each of the above embodiments may be modified or simplified as appropriate.

The invention claimed is:

1. A power conversion device comprising:
a conversion circuit having a capacitor and a bridge circuit in which a plurality of switching elements are connected in series and parallel; and
an external stacked conductor having a P conductor connected to a positive electrode of the capacitor, an N conductor connected to a negative electrode of the capacitor, an AC conductor connected to an intermediate terminal of the bridge circuit, and an even number of intermediate conductors connected between the plurality of switching elements, such that the P conductor, the N conductor, the AC conductor, and the intermediate conductors are arranged in a plurality of layers, the external stacked conductor making connection among positive terminals and negative terminals of the switching elements, the positive electrode and the negative electrode of the capacitor, and the intermediate terminal of the bridge circuit in accordance with a circuit configuration of the conversion circuit, wherein
the respective switching elements are arranged such that a mutual positional relationship between the positive terminals and the negative terminals is the same as a direction of main current flowing through the external stacked conductor,
the plurality of switching elements are arranged symmetrically with respect to a center line of the external stacked conductor which is in the same direction as the main current, and
external connection terminals are provided to the AC conductor, so as to be positioned symmetrically with respect to the center line.

2. The power conversion device according to claim 1, wherein
the bridge circuit has a plurality of switching element arrays according to a parallel number of the switching elements,
a plurality of the switching elements in each switching element array are arranged in one line parallel to the center line of the external stacked conductor, and
the external connection terminals have conductor members provided on middle lines of the respective switching element arrays.

3. The power conversion device according to claim 2, wherein
in a case where the parallel number is an odd number, one of the plurality of switching element arrays is provided such that the middle line thereof overlaps the center line of the external stacked conductor.

4. The power conversion device according to claim 1, wherein
gate wiring lines connected to gate electrodes of the respective switching elements are led, in a direction crossing the center line, from the gate electrodes outward of a planar area of the external stacked conductor.

5. The power conversion device according to claim 1, wherein
the plurality of switching elements in the bridge circuit form an upper arm element group connected between the positive electrode of the capacitor and the intermediate terminal, and a lower arm element group connected between the negative electrode of the capacitor and the intermediate terminal,
the upper arm element group and the lower arm element group are arranged adjacently to each other, and
the capacitor is provided on one of an outer side of the upper arm element group in a direction of the center line and an outer side of the lower arm element group in the direction of the center line.

6. The power conversion device according to claim 5, wherein
the external stacked conductor has a three-layer configuration having three different height levels of a first layer in which one of the P conductor and the N conductor, and the intermediate conductors are provided at the same height level, a second layer in which the other one of the P conductor and the N conductor is provided, and a third layer in which the AC conductor is provided.

7. The power conversion device according to claim 1, wherein
the plurality of switching elements in the bridge circuit form an upper arm element group connected between the positive electrode of the capacitor and the intermediate terminal, and a lower arm element group connected between the negative electrode of the capacitor and the intermediate terminal, and the capacitor is provided between the upper arm element group and the lower arm element group.

8. The power conversion device according to claim 7, wherein the external stacked conductor has a two-layer configuration having two different height levels of a first layer in which the P conductor, the N conductor, and the intermediate conductors are provided at the same height level, and a second layer in which the AC conductor is provided.

9. The power conversion device according to claim 1, wherein the plurality of switching elements in the bridge circuit form an upper arm element group connected between the positive electrode of the capacitor and the intermediate terminal, and a lower arm element group connected between the negative electrode of the capacitor and the intermediate terminal, the upper arm element group and the lower arm element group are arranged adjacently to each other, and the capacitor is provided so as to be divided in a direction of the center line such that the upper arm element group and the lower arm element group are located between the divided capacitors.

10. The power conversion device according to claim 9, wherein the external stacked conductor includes a capacitor conductor connecting the divided capacitors in series, and has a three-layer configuration having three different height levels of a first layer in which the P conductor, the N conductor, and the intermediate conductors are provided at the same height level, a second layer in which the AC conductor is provided, and a third layer in which the capacitor conductor is provided.

11. The power conversion device according to claim 1, wherein the plurality of switching elements in the bridge circuit form an upper arm element group connected between the positive electrode of the capacitor and the intermediate terminal, and a lower arm element group connected between the negative electrode of the capacitor and the intermediate terminal, the upper arm element group and the lower arm element group are arranged in two stages on upper and lower sides such that surfaces thereof face in directions opposite to each other, and the capacitor is provided on one of an outer side of the upper arm element group in a direction of the center line and an outer side of the lower arm element group in the direction of the center line.

12. The power conversion device according to claim 11, wherein the external stacked conductor has a two-layer configuration having two different height levels of a first layer in which one of the P conductor and the N conductor, the intermediate conductors, and the AC conductor are provided at the same height level, and a second layer in which the other one of the P conductor and the N conductor is provided.

13. The power conversion device according to claim 1, comprising a plurality of cell converters to each of which the conversion circuit is applied, the plurality of cell converters being connected in cascade, wherein the external stacked conductor is provided to each bridge circuit in the cell converters.

14. The power conversion device according to claim 13, wherein the cell converter has one of three configurations which are a half-bridge configuration formed by the bridge circuit the number of which is one and the capacitor, a full-bridge configuration formed by the bridge circuits the number of which is two and the capacitor, and a three-phase bridge configuration formed by the bridge circuits the number of which is three and the capacitor.

15. The power conversion device according to claim 13 wherein the cell converters are respectively stored in cell converter housings, each cell converter housing has an external connection terminal, and a plurality of the cell converter housings connected via the external connection terminals are stored in a housing for which insulation from another reference potential is ensured by an insulating structure.

* * * * *